(12) United States Patent
Wariishi et al.

(10) Patent No.: US 7,445,882 B2
(45) Date of Patent: Nov. 4, 2008

(54) IMAGE RECORDING MATERIAL

(75) Inventors: Koji Wariishi, Haibara-gun (JP);
Kazuto Shimada, Haibara-gun (JP)

(73) Assignee: FUJIFILM Corportation, Tokyo (JP)

( * ) Notice: Subject to any disclaimer, the term of this patent is extended or adjusted under 35 U.S.C. 154(b) by 0 days.

(21) Appl. No.: 11/889,228

(22) Filed: Aug. 10, 2007

(65) Prior Publication Data

US 2008/0057439 A1    Mar. 6, 2008

(30) Foreign Application Priority Data

Aug. 29, 2006  (JP) .............................. 2006-232466

(51) Int. Cl.
    *G03F 7/11*    (2006.01)
(52) U.S. Cl. ................. 430/272.1; 430/273.1
(58) Field of Classification Search .............. 430/272.1, 430/273.1
    See application file for complete search history.

(56) References Cited

U.S. PATENT DOCUMENTS

| 5,506,090 | A | 4/1996 | Gardner, Jr. et al. |
| 2006/0068327 | A1 | 3/2006 | Mori et al. |
| 2006/0194150 | A1 | 8/2006 | Mitsumoto et al. |

FOREIGN PATENT DOCUMENTS

| DE | 196 39 897 A1 | 4/1998 |
| EP | 0 703 499 A1 | 3/1996 |
| EP | 1 065 049 A1 | 1/2001 |
| EP | 1 640 805 A1 | 3/2006 |
| EP | 1 696 268 A2 | 8/2006 |
| JP | 58-29803 A | 2/1983 |
| JP | 4-31863 A | 2/1992 |
| JP | 4-106548 A | 4/1992 |
| JP | 2000-131837 A | 5/2000 |
| WO | WO 98/13394 | 4/1998 |

*Primary Examiner*—Richard Schilling
(74) *Attorney, Agent, or Firm*—Sughrue Mion, PLLC

(57) ABSTRACT

Provided is an image recording material capable of being directly recorded by various kinds of lasers, excellent in alkali-developability by alkaline developer and capable of forming an image which is good in curability by exposure. The image recording material is characterized by including on a support: an image recording layer containing a binder polymer (A); a compound (B) having a polymerizable unsaturated group, and a polymerization initiator (C); and a layer containing an organic ionic polymer (a) formed of a non-metallic element and an inorganic layered compound (b) that are layered in this order. It is preferable that the image recording layer further contains a dye (D) having an absorption maximum in a region of 300 to 1,200 nm, and it is preferable that the binder polymer (A) is a polymer having an alkali-soluble group.

23 Claims, No Drawings

IMAGE RECORDING MATERIAL

CROSS-REFERENCE TO RELATED APPLICATION

This application claims priority under 35 USC 119 from Japanese Patent Application No.2006-232466, the disclosure of which is incorporated by reference herein.

BACKGROUND OF THE INVENTION

1. Field of the Invention

The present invention relates to an image recording material having a radiation sensitivity, more specifically, to an image recording material suitably used as a negative planographic printing plate precursor with which it is possible to perform a so-called direct plate making for directly making a plate from a digital signal from a computer or the like by using a laser.

2. Description of the Related Art

As a conventionally known method of forming an image with a photopolymerizable composition by light exposure, there are various kinds of known methods such as a method of forming a hardened relief image by forming a recording layer using a photopolymerizable composition containing an ethylenically unsaturated compound and a photopolymerizable initiator on the surface of a support and then subjecting it to imagewise exposure to polymerize and cure the ethylenically unsaturated compound in a light-exposed portion, followed by removing a light-unexposed portion by dissolution; a method of forming an image by changing the bonding strength of a photopolymerizable composition layer (recording layer) to a support by light exposure and then removing the support; and a method of forming an image by utilizing a change in the adhesion of a toner to a photopolymerizable composition caused by light. The photopolymerization initiator used in each of these methods is an initiator that is responsive to light centered in the ultraviolet region having a wavelength of 400 nm or less, such as benzoin, benzoin alkyl ether, benzyl ketal, benzophenone, anthraquinone, benzyl ketone or Michler's ketone.

Along with recent developments in image formation technologies, there has been a strong demand for a photosensitive material exhibiting a high sensitivity to light in the visible region, and a large number of photopolymerizable compositions have been proposed, for example, a composition having a sensitivity range of about 500 nm for a laser plate making method using a 488 nm-oscillation beam of an argon ion laser. Further, research is being actively conducted into a photopolymerizable composition for light having long wavelength regions exceeding 600 nm for a laser print making method using a He—Ne laser and a semiconductor laser and for full-color image reproduction technology.

As the above photopolymerizable composition, known techniques include utilizing an ethylenic unsaturated compound and a photopolymerization initiator system having a cyanine dye whose heterocycles are connected by a mono-, tri-, penta-, or hepta-methine chain, and having a specific structure, and an s-triadine derivative having a specific structure (see Patent Publications 1 and 2, for example). Also, a photopolymerizable composition has been proposed wherein a polymerization initiator system is formed of a squarylium compound having a specific structure and a specific s-triadine compound (see Patent Publication 3, for example).

However, regarding the active radical generation capability of general photopolymerizable initiators, it is known that sensitivity is rapidly diminished in relation to light having a wavelength of 500 nm or more, and particularly to light having a wavelength of 600 nm or more, due to a reduction in light excitation energy, and the above photopolymerizable compositions proposed so far do not have a satisfactory level of sensitivity to light having such a large wavelength. Further, since the conventional photopolymerizable compositions have a problem that the photopolymerization reaction proceeds when used under white fluorescent lighting, it is difficult to obtain a photopolymerizable composition having good stability at present.

In order to solve the problems relating to low sensitivity and handling difficulties under white light in the above-described photopolymerizable compositions, a photopolymerizable composition and the like containing an ethylenic unsaturated compound, a specific dye, and a photopolymerization initiator (triadine compound or the like) have been proposed (see Patent Publication 4, for example).

However, a planographic printing plate using such a composition for its recording layer has a problem that a reduction in recording sensitivity is caused by the deactivation of radicals generated from the photopolymerization initiator due to influence of oxygen in the air, and it is necessary to form an oxygen shielding layer made from polyvinyl alcohol and the like on an image recording layer in order to ensure sufficient sensitivity. In a planographic printing plate having an oxygen shielding layer on a surface of the image recording layer, a water washing process for eliminating the oxygen shielding layer, which is water-soluble, has been typically conducted before development for the purposes of reducing development time and preventing deterioration of stability during development.

Though it is possible to ensure good developability by performing such a water washing process, there has been a demand for a method for ensuring good developability without performing the water washing process since the water washing process requires a device and a waste water treatment therefor. In order to improve the oxygen shielding layer elimination capability (developability) as well as to eliminate the water washing process, a method of adding a hydrophilic compound which is more hydrophilic than polyvinyl alcohol to the oxygen shielding layer has been considered. However, though developability is improved by such a method, there are concerns that the method causes a reduction in sensitivity, and the method has problems such as plate life is reduced when exposed with the same amount of light as the above method and the like.

[Patent Publication 1] JP-A-58-29803
[Patent Publication 2] JP-A-4-31863
[Patent Publication 3] JP-A-4-106548
[Patent Publication 4] JP-A-2000-131837

SUMMARY OF THE INVENTION

The present invention has been made in view of the above circumstances and provides image recording material. A first aspect of the present invention provides an image recording material comprising in the following order on a support: an image recording layer containing: a binder polymer (A), a compound (B) having a polymerizable unsaturated group, and a polymerization initiator (C); and a layer containing: an organic ionic polymer (a) formed of a non-metallic element, and an inorganic layered compound (b).

DETAILED DESCRIPTION OF THE INVENTION

The present invention solves the conventional problems and attains an object described below. More specifically, the object of the present invention is to provide an image recording material excellent in developability of a non-image region and capable of forming an image having a good curability with light exposure.

<Layer Containing Organic Ionic Polymer (a) Formed of Non-Metallic Element and Inorganic Layered Compound (b)>

The image recording material of the present invention has a layer (hereinafter referred to as a specific protective layer as required) containing an organic ionic polymer (a) formed of a non-metallic element and an inorganic layered compound (b) on a surface of its image recording layer for the purposes of preventing generation of a scratch and the like on the image recording layer, shielding oxygen, and preventing ablation when exposed with high illumination laser.

The specific protective layer may preferably contain a hydrophilic polymer excellent in water solubility and water dispersibility as a main component from the view point of improvement in developability.

In the present invention, in view of the fact that the exposure is typically performed in atmosphere when forming an image on a planographic printing plate precursor, the specific protective layer is provided for the purposes of preventing contamination of the image recording layer with oxygen existing in the atmosphere and a low molecular compound such as a basic substance and preventing inhibition of the image formation reaction by the exposure in the atmosphere. Therefore, characteristics required for the specific protective layer according to the present invention include a low permeability to the low molecular compound such as oxygen, a good transmittance of light used for exposure, an excellent adhesion to the image recording layer, and capability of being readily removed by a development treatment process using an aqueous alkali solution after the exposure.

The hydrophilic polymer typically used for the protective layer has a low oxygen permeability but does not have a sufficient developability. In the present invention, by using an organic ionic polymer having a specific structure and an inorganic layered compound, improvement in developability is realized while maintaining the low oxygen permeability.

As one preferred mode, the specific protective layer according to the present invention contains an organic ionic polymer (a) formed of a non-metallic element and an inorganic layered compound (b) as main components as well as at least one hydrophilic polymer selected from a nonionic hydrophilic polymer (c-1) and a modified polyvinyl alcohol derivative (c-2). Hereinafter, each of the components contained in the specific protective layer will be described.

[Organic Ionic Polymer (a) Formed of Non-Metallic Element]

Examples of the organic ionic polymer (a) formed of a non-metallic element to be used in the specific protective layer according to the present invention (hereinafter simply referred to as organic ionic polymer (a) as required) include (1) an anionic polymer having an anionic group in molecule, (2) a cationic polymer having a cationic group in molecule, (3) an ampholytic polymer having an anionic group and a cationic group in molecule, and the like.

In the present invention, the organic ionic polymer means a polymer in which a main chain and a side chain in a polymer molecule are formed of a non-metallic element, and this polymer has an organic ionic site at either one of the main chain and the side chain in polymer molecule or an organic ionic site existing as a counterion at a counterpart of the ionic site in the polymer.

Also, in the present invention, the ampholytic polymer (3) induces a polymer having at least one of each of an acidic group and an basic group in molecule and existing substantially as a cationic group and anionic group, wherein the acidic group and the basic group form an intramolecular salt.

Each of structures formed by the anionic group, the cationic group, and the organic counterion thereof contained in the polymer is characterized by being an organic ionic group formed of a non-metal.

As used herein, the organic ionic property means a structure having an organic counterion as a counterion of an anionic group of a carboxylate group or the like and a cationic group of an ammonium group or the like. For example, those having the organic counter cation such as tetramethylammonium ion ($Me_4N^+$) as a counter cation of a carboxylate group ($—CO_2^-$) are included as the organic ionic polymer of the present invention, but those having an inorganic cation such as an alkali metal cation of a sodium cation ($Na^+$) as the counter cation of a carboxylate group ($—CO_2^-$) are not included in the organic ionic polymer of the present invention.

Examples of the anionic group of the organic ionic polymer in the present invention include a carboxylate group ($—CO_2^-$), a sulfonate group ($—SO_3^-$), a sulfinate group ($—SO_2^-$), a phosphonate group ($—PO_3^-$), an ester monosulfate group ($—OSO_3^-$), a sulfonamidate group ($—SO_2N^-R_2$), and the like, and, among the above anionic groups, the carboxylate group ($—CO_2^-$), the sulfonate group ($—SO_3^-$), and the sulfonate group ($—SO_2^-$) are preferred.

Examples of the counterion of the anionic group include an ammonium group, a phosphonium group, a sulfonium group, an iodonium group, an oxonium group, and the like, and, among the above counterions, the ammonium group is preferred.

Examples of the counterion of the cationic group include a carboxylate group ($—CO_2^-$), a sulfonate group ($—SO_3^-$), a sulfinate group ($—SO_2^-$), a phosphonate group ($—PO_3^-$), an ester monosulfate group ($—OSO_3^-$), a sulfonamidate group ($—SO_2N^-R_2$), and the like. Among the above, the carboxylate group ($—CO_2^-$), the sulfonate group ($—SO_3^-$), and the sulfinate group ($—SO_2^-$) are preferred.

Examples of the cationic group include an onium group derived from a nitrogen atom, a phosphor atom, a sulfur atom, an iodine atom, and the like. For example, an organic cation such as an ammonium group, a phosphonium group, a sulfonium group, an iodonium group, an oxonium group, and the like is preferred, and the ammonium group may more preferably be used. As the ammonium group, a secondary ammonium group, a tertiary ammonium group, a quaternary ammonium group, a pyridinium group, an imidazolium group, and the like are particularly preferred.

Also, a polymer in which partial structures functioning as an acid group and a base exist as an organic cationic group and an anionic group in the molecule and form an intramolecular salt may preferably be used.

A main skeleton of the organic ionic polymer in the present invention is not particularly limited, and examples thereof include a polyvinyl system (ex. poly(meth)acrylate system, polystyrene system, etc.), a polyamide system, a polyester system, a polyurethane system, a polyureido system, a polycarbonate system, and the like. The polyvinyl system and the polyurethane system may preferably be used, and the polyvinyl system may particularly preferably be used.

The organic ionic polymer may be a copolymer or a homopolymer of monomers containing the cationic group and/or the anionic group or a copolymer of a monomer containing the cationic group and/or the anionic group and a monomer which does not have the cationic group and the anionic group.

The anionic group and the cationic group contained in the organic ionic polymer may be of one type or may contain plural ionic groups that are different from each other.

An amount of the ionic group contained in the organic ionic polymer is selected appropriately depending on a type and a physical property of the ionic group, and, from the view point of a balance between developability and film strength, a structural unit having such ionic group may preferably be contained in the range of 1 to 100 mol %, more preferably 10 to 100 mol %, in one polymer molecule. That is, the organic ionic polymer of the present invention may be formed only of the structural unit having the anionic group or the cationic group described above.

Also, a molecular weight is not particularly defined, and, from the view point of film forming property and developability, the molecular weight may preferably be 2,000 to 5000,000, more preferably 3,000 to 1000,000, particularly preferably 5,000 to 500,000.

Hereinafter, the organic ionic polymer [Compound (1-1) to Compound (16-1)] usable in the present invention will specifically be described by clearly defining a structural unit forming the polymer or a polymerization molar ratio of structural units for copolymers and a weight average molecular weight (Mw), but the present invention is not limited to the following polymers.

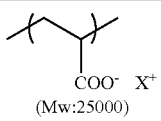
(Mw:25000)

| Compound No. | $X^+$ |
|---|---|
| 1-1 | $Me_4N^+$ |
| 1-2 | $PhCH_2N^+Me_3$ |
| 1-3 | ![morpholinium] |
| 1-4 | $(n)Bu_4N^+$ |
| 1-5 | $HEt_3N^+$ |

(Mw:120000)

| Compound No. | $X^+$ |
|---|---|
| 2-1 | $Me_4N^+$ |
| 2-2 | $PhCH_2N^+Me_3$ |
| 2-3 | ![morpholinium] |
| 2-4 | $(n)Bu_4N^+$ |
| 2-5 | $HEt_3N^+$ |

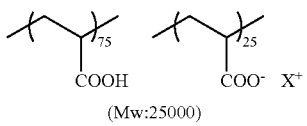
(Mw:25000)

| Compound No. | $X^+$ |
|---|---|
| 3-1 | $Me_4N^+$ |
| 3-2 | $PhCH_2N^+Me_3$ |
| 3-3 | ![morpholinium] |
| 3-4 | $(n)Bu_4N^+$ |
| 3-5 | $HEt_3N^+$ |

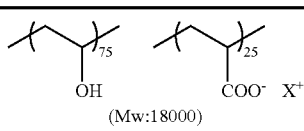
(Mw:18000)

| Compound No. | $X^+$ |
|---|---|
| 4-1 | $Me_4N^+$ |
| 4-2 | $PhCH_2N^+Me_3$ |
| 4-3 | ![morpholinium] |
| 4-4 | $(n)Bu_4N^+$ |
| 4-5 | $HEt_3N^+$ |

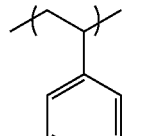
(Mw:86000)

| Compound No. | $X^+$ |
|---|---|
| 5-1 | $Me_4N^+$ |
| 5-2 | $PhCH_2N^+Me_3$ |
| 5-3 | ![morpholinium] |
| 5-4 | $(n)Bu_4N^+$ |
| 5-5 | $HEt_3N^+$ |

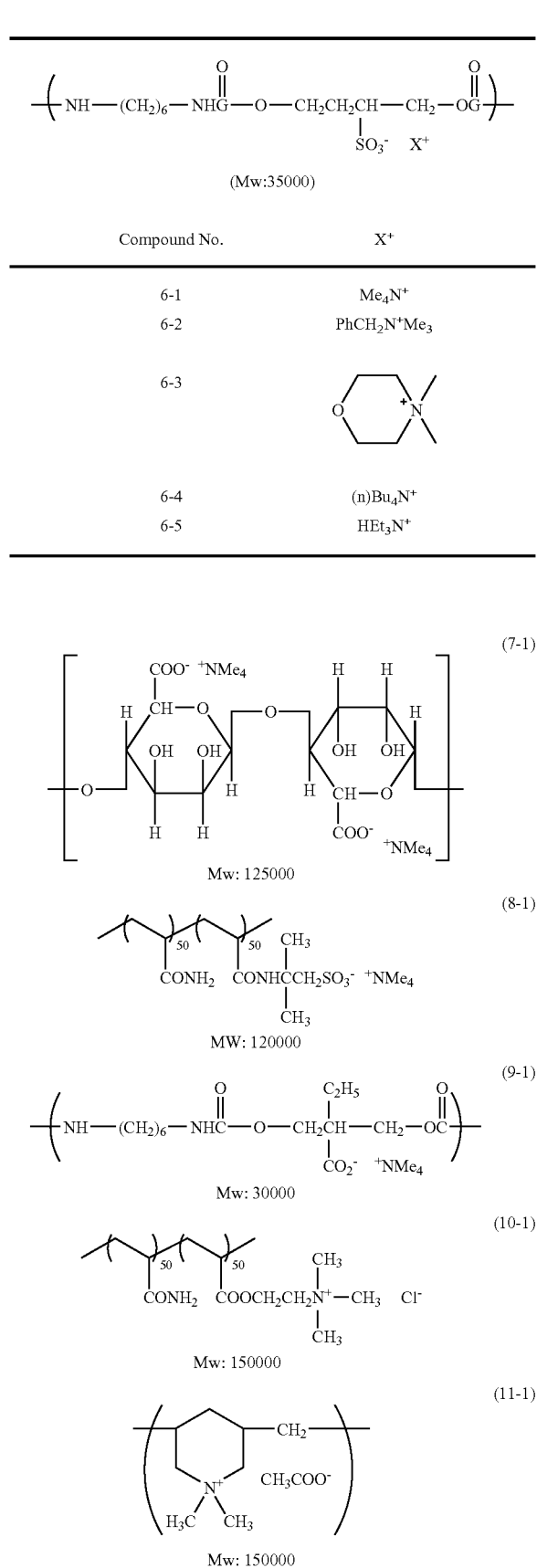

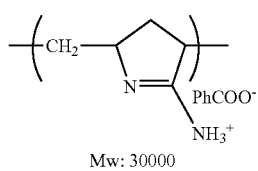

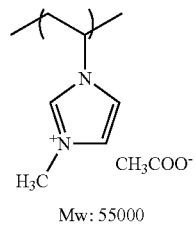

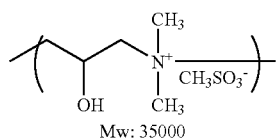

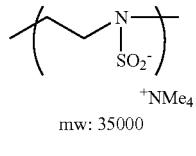

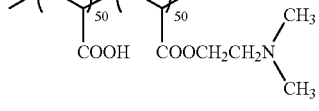

A solid content in the specific protective layer of the organic ionic polymer (a) formed of the non-metallic element may preferably be 1 to 90 mass %, more preferably 3 to 70 mass %, most preferably 5 to 50 mass %, from the view point of strength, developability, and oxygen permeability.

For the specific protective layer in the present invention, in addition to the organic ionic polymer, it is possible to use a water-soluble polymer other than the organic ionic polymer insofar as the water-soluble polymer does not impair the effects of the present invention.

As the water-soluble polymer to be used in combination, a nonionic hydrophilic polymer (c-1), a modified polyvinyl alcohol derivative (c-2), and the like may preferably be used.

[Nonionic Water-Soluble Polymer (c-1)]

In the specific protective layer, it is preferable to use a water-soluble high molecular compound relatively excellent in crystallinity as the nonionic water-soluble polymer, and specific examples thereof include a nonionic water-soluble polymer such as polyvinyl alcohol, and polyvinyl pyrrolidone. Among the nonionic water-soluble polymers, it is particularly preferable to use the polyvinyl alcohol as the main component from the view point of the basic characteristics such as the oxygen shielding property and the development removing property. Also, a polymer containing a dissociative group such as a carboxy group may preferably be contained in a non-dissociated state.

Commercially available water-soluble polymers may also be useful, and specific examples of the polyvinyl alcohol include PVA-105, PVA-110, PVA-117, PVA-117H, PVA- 120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 manufactured by Kuraray Co., Ltd.

A part of the polyvinyl alcohol which is the nonionic water-soluble polymer (c-1) to be used in combination with the organic ionic polymer (a) in the specific protective layer according to the present invention may be substituted by ester, ether, and acetal insofar as the polyvinyl alcohol contains a sufficient amount of non-substituted vinyl alcohol units in order to develop the oxygen shielding property and water solubility to be required. Also, a copolymer partially containing a repetition unit other than the vinyl alcohol unit may be used.

Example of the copolymer with the unsubstituted vinyl-alcohol repeating unit and the other repeating unit include polyvinyl acetate, chloroacetate or propionate, polyvinyl formal or polyvinyl acetal hydrolyzed to 88 to 100%, and copolymers thereof. Other useful water-soluble polymer compounds include polyvinyl pyrrolidone, gelatin and gum arabic. Only one water-soluble polymer compound may be used, or a combination of two or more water-soluble polymer compounds may be used.

Polyvinyl alcohols used preferably in the specific protective layer include polyvinyl alcohols having a saponification degree of 71 to 100% and a molecular weight in the range of 200 to 2400. From the viewpoint of having excellent oxygen impermeability, excellent layer-forming property, and a surface of low adhesiveness, the use of polyvinyl alcohols having a saponification degree of 91 mol % or higher is more preferable.

Specifically, the polyvinyl alcohols having a saponification degree of 91 mol % or more include PVA-102, PVA-103, PVA-104, PVA-105, PVA-110, PVA-117, PVA-120, PVA-124, PVA-117H, PVA-135H, PVA-HC, PVA-617, PVA-624, PVA-706, PVA-613, PVA-CS and PVA-CST manufactured by Kuraray Co., Ltd., GOSENOL NL-05, NM-11, NM-14, AL-06, P-610, C-500, A-300 and AH-17 manufactured by Nippon Synthetic Chemical Industry Co., Ltd., and JF-04, JF-05, JF-10, JF-17, JF-17L, JM-05, JM-10, JM-17, JM-17L, JT-05, JT-13 and JT-15 manufactured by JAPAN VAM&POVAL CO., LTD.

From the view points of adhesion to the image recording layer, sensitivity and suppression of generation of unnecessary fogging, preferred examples of the nonionic water-soluble polymer to be used in combination with the organic ionic polymer in the specific protective layer include a mixture of polyvinyl alcohol and polyvinyl pyrrolidone. A polyvinyl alcohol having the saponification degree of 91 mol % or more/polyvinyl pyrrolidone additive amount ratio (mass ratio) in the mixture may preferably be ⅓ or less, and the mixture may preferably be contained in an amount of 99 mass % or less with respect to the organic ionic polymer. Also, polyacrylic acid relatively excellent in crystallinity and a copolymer of such polyacrylic acids may be used in combination with polyvinyl alcohol. Since polyacrylic acid and the like are used in a dissociated state, it is included in the nonionic polymer.

[Modified Polyvinyl Alcohol Derivative (c-2)]

Preferred examples of the water-soluble polymer that can be used in combination with the organic ionic polymer include the modified polyvinyl alcohol derivative (c-2). Examples of such modified polyvinyl alcohol derivative include the compounds disclosed on page 280 of "Poval" (written by Koichi Nagano, et al.; published by Kobunshi Kankokai on 1989) and the like, and it is particularly preferable to use the modified polyvinyl alcohol derivative that is obtained by modifying polyvinyl alcohol with acid and usable in the dissociated state and does not have any organic counterion.

Acid-modified polyvinyl alcohols can also be preferably used. Preferable examples include a carboxy-modified polyvinyl alcohol modified with itaconic acid or maleic acid and a polyvinyl alcohol modified with sulfonic acid. Use of an acid-modified polyvinyl alcohol having a saponification degree of 91 mol % or higher is more preferable.

Specific examples of the acid-modified polyvinyl alcohol include KL-118, KM-618, KM-118, SK-5102, MP-102 and R-2105 manufactured by Kuraray Co., Ltd., GOSENAL CKS-50, T-HS-1, T-215, T-350, T-330 and T-330H manufactured by Nippon Synthetic Chemical Industry Co., Ltd., and AF-17, AT-17 etc. manufactured by JAPAN VAM&POVAL CO., LTD.

In the case of using at least one of the water-soluble polymers that is selected from the above-described nonionic water-soluble polymers (c-1) and modified polyvinyl alcohol derivatives (c-2) to be used in combination with the organic ionic polymer, from the view points of suppression of reduction in sensitivity of a planographic printing plate precursor and suppression in adhesion between planographic printing plate precursors when laminating the precursors, the water-soluble polymer may preferably be contained in the range of 10 to 99 mass %, more preferably in the range of 30 to 97 mass %, with respect to a total solid content of the specific protective layer.

The water-soluble polymer that is selected from the above-described nonionic water-soluble polymers (c-1) and modified polyvinyl alcohol derivatives (c-2) may be used alone or in combination when used in combination with the organic ionic polymer, and, in the case of the combined use, a total amount of the water-soluble polymers is in the above-specified mass range and may preferably be 99 mass % or less, more preferably 30 to 97 mass %, with respect to a content of the organic ionic polymer (a).

<Inorganic Layered Compound (b)>

Hereinafter, the inorganic layered compound (b) which is a second essential component in the specific protective layer will be described.

It is preferable that the specific protective layer according to the present invention contain the inorganic layered compound, i.e. an inorganic compound having a layered structure as well as a flat plate-like shape, from the view points of oxygen permeability and improvement in scratch resistance. By using such inorganic layered compound in combination, the oxygen shielding property is further improved, and a film strength of the protective layer is further improved to improve the scratch resistance as well as to impart a matte property to the specific protective layer. As used herein, the inorganic compound means a metal oxide, an oxide having plural metal atoms, and the like, and it is possible to use the one that is selected from such inorganic compounds and excellent in oxygen shielding property and has good optical transparency. Preferably, those that can be dissolved or dispersed into water may be used.

As a result, the specific protective layer is capable of suppressing deterioration due to deformation and generation of scratches in addition to the achievement of the shielding property to oxygen and the like. Also, by imparting the matte property to the specific protective layer, it is possible to suppress adhesion between a surface of the specific protective layer of a planographic printing plate precursor and a back face of a support of a planographic printing plate precursor adjacent to the specific protective layer surface when stacked.

In the case of using the inorganic layered compound (b) (preferably a mica compound) and the organic ionic polymer (a) described above in the specific protective layer, a protective layer coating liquid is prepared by mixing them in a solvent.

Examples of the inorganic layered compound include the mica compound represented by a general formula: $A(B, C)_2$-$5D_4O_{10}(OH, F, O)_2$ [wherein A is K, Na, or Ca; B and C is Fe(II), FE(III), Mn, Al, MG, or V; and D is Si or Al], such as a natural mica and a synthetic mica.

Examples of natural mica compounds include white mica, paragonite, bronze mica, black mica and flaky mica. Examples of synthetic mica compounds include non-swelling mica such as fluorine bronze mica $KMg_3$ $(AlSi_3O_{10})F_2$ and potassium tetrasilicate mica $KMg_{2.5}$ $(Si_4O_{10})F_2$ and swelling mica such as Na tetrasilyric mica $NaMg_{2.5}$ $(Si_4O_{10})F_2$, Na or Li teniolite (Na, Li) $Mg_2Li$ $(Si_4O_{10})F_2$, montmorillonite type Na or Li hectorite $(Na, Li)_{1/8}Ng_{2/5}Li_{1/8}$ $(Si_4O_{10})F_2$. Synthetic smectite is also useful.

Among the mica compounds described above, fluorine-based swelling mica is particularly useful. That is, this swelling synthetic mica has a layered structure consisting of unit crystal lattice layers having a thickness of about 10 to 15 Å wherein intra-lattice metal atom substitution is far significant than in other clay minerals. As a result, the lattice layers are deficient in positive charge which is compensated for by adsorbing cations such as $Na^+$, $Ca^{2+}$ or $Mg^{2+}$ between the layers. Cations that are present between the layers are called exchangeable cations, and are exchanged with various cations. In particular, when cations between the layers are $Li^+$ or $Na^+$, the ion radius thereof is small and the bonding between the layered crystal lattices is weak, thus showing great swelling in the presence of water. When shearing force is applied in this state, the layered structure is easily cleaved to form stable sol in water. This occurs easily in the swelling synthetic mica, which is useful in this embodiment; therefore, the swelling synthetic mica is particularly preferably used in the view point of ease acquisition and uniformity in it's quality.

A shape of the mica compound is flat. From the viewpoint of regulation of diffusion, the mica compound is preferably thinner, and the plane size is preferably larger insofar as the flatness of the coating surface and the permeation of active ray are not inhibited. Accordingly, the aspect ratio may be 20 or more, preferably 100 or more, more preferably 200 or more. The aspect ratio is the ratio of the major axis to the thickness of the particle and can be measured for example from a projection view obtained from a photomicrograph of the particle. As the aspect ratio is increased, the obtained effects are greater.

The particle diameter of the mica compound may be 0.3 to 20 μm, preferably 0.5 to 10 μm, more preferably 1 to 5 μm, in terms of the average length of the major axis. The average thickness of the particles may be 0.1 μm or less, preferably 0.05 μm or less, more preferably 0.01 μm or less. Specifically, the size of the swelling synthetic mica as a typical compound has a thickness of 1 to 50 nm and a major axis length (plane size) of about 1 to 20 μm.

The amount of the inorganic layered compound contained in the specific protective layer is preferably in the range of 5 to 50 mass %, more preferably in the range of 10 to 40 mass %, based on the total solid content of the protective layer, from the viewpoint of suppression of the adhesion between the planographic printing plate precursors when stacked, suppression of flaw generation, deterioration in sensitivity due to shielding at the time of exposure to laser light, and low oxygen permeability. When plural inorganic layered compounds are simultaneously used, the total amount of the inorganic layered compounds is preferably in the range (mass %) described above.

Types and contents of the components of the specific protective layer such as compounds including the organic ionic polymer formed of non-metallic element (a), the inorganic layered compound (b), and the nonionic water-soluble polymer represented by polyvinyl alcohol (c-1) or the modified polyvinyl alcohol derivative represented by the acid-modified polyvinyl alcohol (c-2), additives, and the like or the specific protective layer coating amount may appropriately be decided in view of the required oxygen shielding property and the development removing property as well as a fogging property, adhesion, and scratch resistance.

The specific protective layer in the present invention may preferably have an oxygen permeation degree of 0.5 ml/m²·day or more and 100 ml/m²·day or less at 25° C. at a barometric pressure of −1, and it is preferable to adjust the coating amount in order to attain such oxygen permeation.

In the preparation of the specific protective layer coating liquid, a known additive such as a surfactant for improving a coating property and a water-soluble plasticizer for improving a physical property of a coating to be obtained may be added.

Examples of the water-soluble plasticizer, or an agent for imparting flexibility of the coating film, include propionamide, cyclohexanediol, glycerin, sorbitol dipropyleneglycol, and the like, and an additive amount thereof may be equivalent to a several mass % of the organic ionic polymer (a). Also, a water-soluble (meth)acryl-based polymer may be added. Also, examples of the surfactant include an anionic surfactant such as sodium alkylsulfate, sodium alkylsulfonate; an ampholytic surfactant such as an alkylaminocarboxylic acid salt and an alkylaminodicarboxylic acid salt; and a nonionic surfactant such as polyoxyethylenealkylphenylether, and the surfactant is added in an amount of a several mass % of the organic ionic polymer (a).

Also, a colorant (water-soluble dye) that is excellent in optical transparency used for exposure of the image recording layer and capable of efficiently absorbing light of wavelengths irrelevant for the exposure may be added to the specific protective layer. With the use of the colorant, it is possible to improve a safe light adequacy without reducing the sensitivity.

[Formation of Specific Protective Layer]

A method of applying the protective layer is not particularly limited and can be carried out by coating an image recording layer described below with an aqueous coating liquid for the protective layer containing the components described above. For example, methods described in U.S. Pat. No. 3,458,311 or JP-A No. 55-49729 can also be used.

Hereinafter, the method of applying the protective layer containing the organic ionic polymer (a) and the inorganic layered compound (b) such as the mica compound and, preferably, further containing the nonionic water-soluble polymer (c-1) such as polyvinyl alcohol, the modified polyvinyl alcohol (c-2) and the like will be described in detail.

A dispersion in which the inorganic layered compound (b) such as the mica compound is dispersed is prepared, and a protective layer coating liquid obtained by mixing the dispersion and the organic ionic polymer (a) (or an aqueous solution in which the organic ionic polymer is dissolved), the nonionic water-soluble polymer (c-1) such as polyvinyl alcohol, and the modified polyvinyl alcohol derivative (c-2) (or an aqueous solution in which the water-soluble polymers are dissolved) is applied on an image recording layer to form the protective layer.

Examples of the method of dispersing the inorganic layered compound used in the protective layer such as a mica compound will be described. First, 5 to 10 parts by mass of the swelling mica compound mentioned above as a preferable mica compound is added to 100 parts by mass of water, and left sufficiently to reach a stable state, so that the mica compound swelled. Then, the mixture is treated with a dispersing machine, so that the mica compound is dispersed in water. Examples of the dispersing machine to be used include various mills that mechanically apply direct force for dispersing, high-speed stirring dispersing machines having high shear force, and dispersing machines giving high-intensity ultrasonic energy. Specific examples include a ball mill, a sand grinder mill, a viscomill, a colloid mill, a homogenizer, a dissolver, a Polytron, a homomixer, a homoblender, a Keddy mill, a jet agitator, a capillary emulsifier, a liquid siren, an electromagnetic strain ultrasonic generator, and an emulsifier having a Poleman whistle. In general, 2 to 15 mass % dispersion of the mica compound dispersed by the method described above is highly viscous or gelled and extremely excellent in storage stability. When this dispersion is used to prepare a coating liquid for protective layer, the coating liquid is prepared preferably by diluting the dispersion with water and sufficiently stirring it, followed by compounding it with the water-soluble polymer compound such as polyvinyl alcohol (or an aqueous solution containing the water-soluble polymer compound such as polyvinyl alcohol dissolved therein).

The coating amount of the specific protective layer is preferably 0.1 g/m$^2$ to 4.0 g/m$^2$, more preferably 0.3 g/m$^2$ to 3.0 g/m$^2$ from the viewpoints of the strength and scratch resistance of the resultant protective layer, maintenance of image quality, and maintenance of suitable oxygen permeability for imparting safelight compatibility. The thickness of the protective layer is suitably 0.1 to 5 µm, particularly preferably 0.2 to 2 µm.

In addition, adhesiveness to an image region and anti-scratch property are also very important for handling of the planographic printing plate precursor. That is, when the protective layer rendered hydrophilic by incorporating a water-soluble polymer is laminated on the image recording layer that is a lipophilic polymer layer, the protective layer is easily released due to insufficient adhesion so that the planographic printing plate precursor may undergo deficiency such as insufficient curing in the released portion because of the inhibition of polymerization by oxygen.

In the specific protective layer, it can be said that adhesion to an image region of an image recording layer and a uniformity of a coating film are remarkably important characteristics. That is, when a hydrophilic layer containing the water-soluble polymer such as the organic ionic polymer (a) is laminated on a lipophilic image recording layer, film detachment due to insufficient adhesion tends to occur to cause film curing deficiency due to inhibition of polymerization by oxygen at the detachment portion. As countermeasures for such trouble, various proposals have been made for the purpose of improving the adhesion between the two layers. For example, United State Patent Application Nos. 292501 and 44563 disclose that it is possible to achieve a sufficient adhesion by mixing an acryl-based emulsion or a water-insoluble vinylpyrrolidone-vinyl acetate copolymer and the like in an amount of 20 to 60 mass % to a hydrophilic polymer mainly comprising polyvinyl alcohol and laminating the mixture on an image recording layer. It is possible to adapt the known technologies for improving the adhesion between the image recording layer and a hydrophilic layer such as the specific protective layer to the production process of the planographic printing or when producing the planographic printing plate precursor of the present invention to be used for the process.

<Image Recording Layer>

The image recording material of this invention is provided with an image recording layer formed on a support and containing a binder polymer (A), a compound (B) having an polymerizable unsaturated group, and a polymerization initiator (C), and the specific protective layer is formed on a surface of the image recording layer directly or after forming an appropriate adhesion improving layer.

From the view point of sensitivity, a dye (D) having an absorption maximum in 300 to 1,200 nm may preferably be contained in the image recording layer.

In the image recording layer, the polymerization initiator (C) present in the binder polymer (A) generates an initiator species such as a radical by light, heat, or both of the energies, and the initiator species causes the compound (B) having a polymerizable unsaturated group to start a polymerization reaction so that only the exposed part is cured. After that, the image recording layer in the non-cured region is rapidly developed and removed by an alkali development treatment, whereby an image is formed.

Hereinafter, the components of the image recording layer will be described.

[Polymerization Initiator (C)]

As the polymerization initiator to be used in the present invention, it is possible to use a compound generating a radical by light, heat, or both of the energies and initiating and promoting polymerization of a compound having a polymerizable unsaturated group, and specific examples thereof include known radical generating agents and the like. As the radical initiating agents usable in the present invention are known heat polymerization initiators, a compound having a bonding of small bond dissociation energy, a photopolymerization initiator, and the like, and the radical-generating compounds preferably used in the present invention means those capable of generating a radical by heat energy and of starting and promoting polymerization of a compound having a polymerizable unsaturated group.

The polymerization initiator generating radical by energy application may be used alone or in combination of two or more thereof in the image recording layer.

Examples of the radical-generating agent include an organic halogenated compound (a), a carbonyl compound (b), an organic peroxide compound (c), an azo-based polymerization initiator (d), an azide compound (e), a metallocene compound (f), a hexaarylbiimidazole compound (g), an organic boric acid compound (h), a disulfonic acid compound (i), an oxime ester compound (j), an onium salt compound (k), and the like.

Hereinafter, each of the compounds will be described.

Specific examples of the organic halogenated compounds (a) include the compounds described in Wakabayashi et al., "Bull Chem. Soc Japan" 42, 2924 (1969), U.S. Pat. No. 3,905,815, JP-B No. 46-4605, JP-A Nos. 48-36281, 55-32070, 60-239736, 61-169835, 61-169837, 62-58241, 62-212401, 63-70243, and 63-298339, and M. P. Hutt, "Journal of Heterocyclic Chemistry", 1 (No. 3), (1970)"; and particularly preferable are oxazole compounds substituted by a trihalomethyl group, and S-triazine compounds.

More preferable are s-triazine derivatives having at least one mono-, di-, or tri-halogen-substituted methyl group bound to the s-triazine ring, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl-)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the carbonyl compounds (b) include benzophenone derivatives such as benzophenone, Michler's ketone, 2-methylbenzophenone, 3-methylbenzophenone, 4-methylbenzophenone, 2-chlorobenzophenone, 4-bromobenzophenone, and 2-carboxybenzophenone;

acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, and 1,1,1-trichloromethyl-(p-butylphenyl)ketone;

thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, and 2,4-diisopropylthioxanthone; and benzoate ester derivatives such as ethyl p-dimethylaminobenzoate and ethyl p-diethylaminobenzoate.

Examples of the organic peroxide compounds (c) include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, persuccinic acid, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tercil carbonate, 3,3',4,4'-tetra-(t-butyl peroxycarbonyl)benzophenone, 3,3',4,4'-tetra-(t-hexylperoxycarbonyl)benzophenone, 3,3',4,4'-tetra-(p-isopropylcumylperoxycarbonyl)-benzophenone, carbonyl-di(t-butylperoxydihydrogen diphthalate), and carbonyl-di(t-hexylperoxydihydrogen diphthalate).

Examples of the azo compounds (d) include the azo compounds described in JP-A No. 8-108621. Examples of the azide compounds (e) include the azide compounds such as 2,6-bis(4-azidobenzyliden)-4-metylcyclohexanone Examples of the metallocene compounds (f) include various titanocene compounds described in JP-A Nos. 59-152396, 61-151197, 63-41484, 2-249, 2-4705, and 5-83588 such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, and di-methylcyclopentadienyl-Ti-bis-2,3,4,5,6-pentafluorophen-1-yl; and the iron-arene complexes described in JP-A Nos. 1-304453 and 1-152109.

Examples of the hexaarylbiimidazole compounds (g) include various compounds described, for example, in JP-B No. 6-29285, U.S. Pat. Nos. 3,479,185, 4,311,783, and 4,622,286, such as 2,2'-bis(o-chlorophenyl)-4,4',5,5'-tetraphenylbiimidazole, 2,2'-bis(o-bromophenyl)4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Specific examples of the organic borate salt compounds (h) include the organic borate salts described, for example, in JP-A Nos. 62-143044, 62-150242, 9-188685, 9-188686, 9-188710, 2000-131837, and 2002-107916, Japanese Patent 2764769, JP-A No. 2002-116539, and Kunz, Martin, "Rad Tech '98. Proceeding Apr. 19-22, 1998, Chicago"; the organic boron sulfonium complexes or organic boron oxosulfonium complexes described in JP-A Nos. 6-157623, 6-175564, and 6-175561; the organic boron iodonium complexes described in JP-A Nos. 6-175554 and 6-175553; the organic boron phosphonium complexes described in JP-A No. 9-188710; the organic boron transition metal coordination complexes described in JP-A Nos. 6-348011, 7-128785, 7-140589, 7-306527, and 7-292014.

Examples of the disulfonated compounds (i) include the compounds described in JP-A Nos. 61-166544 and 2003-328465.

Examples of the oxime ester compounds (j) include the compounds described in J.C.S. Perkin II (1979) 1653-1660, J.C.S. Perkin II (1979) 156-162, Journal of Photopolymer Science and Technology (1995) 202-232, JP-A Nos. 2000-66385 and 2000-80068, and specific examples thereof include the compounds represented by the following structural formulae.

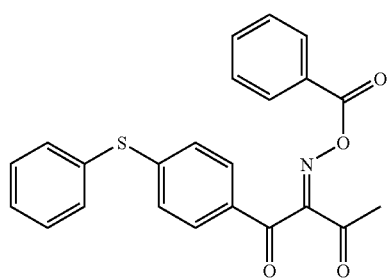

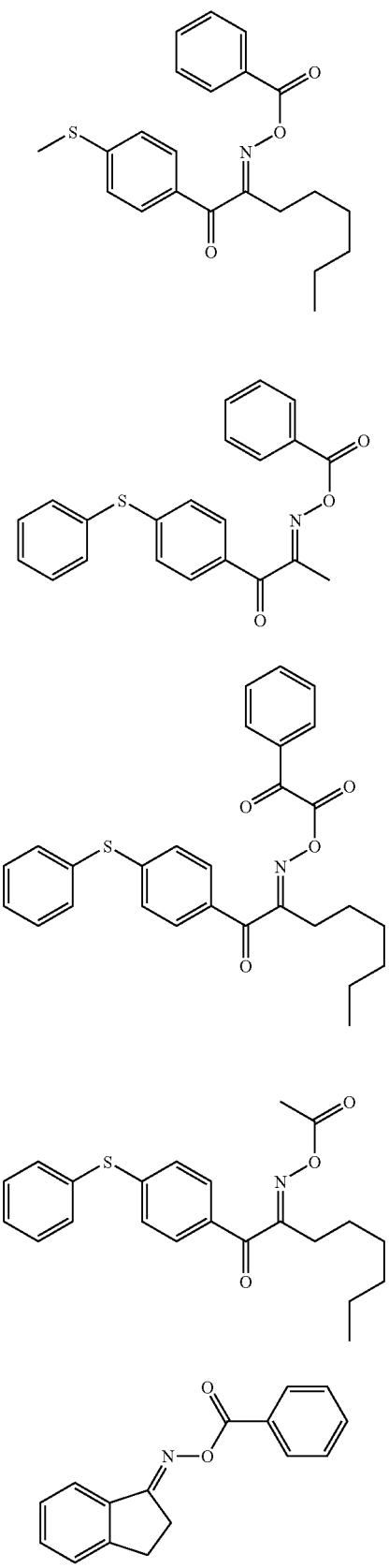

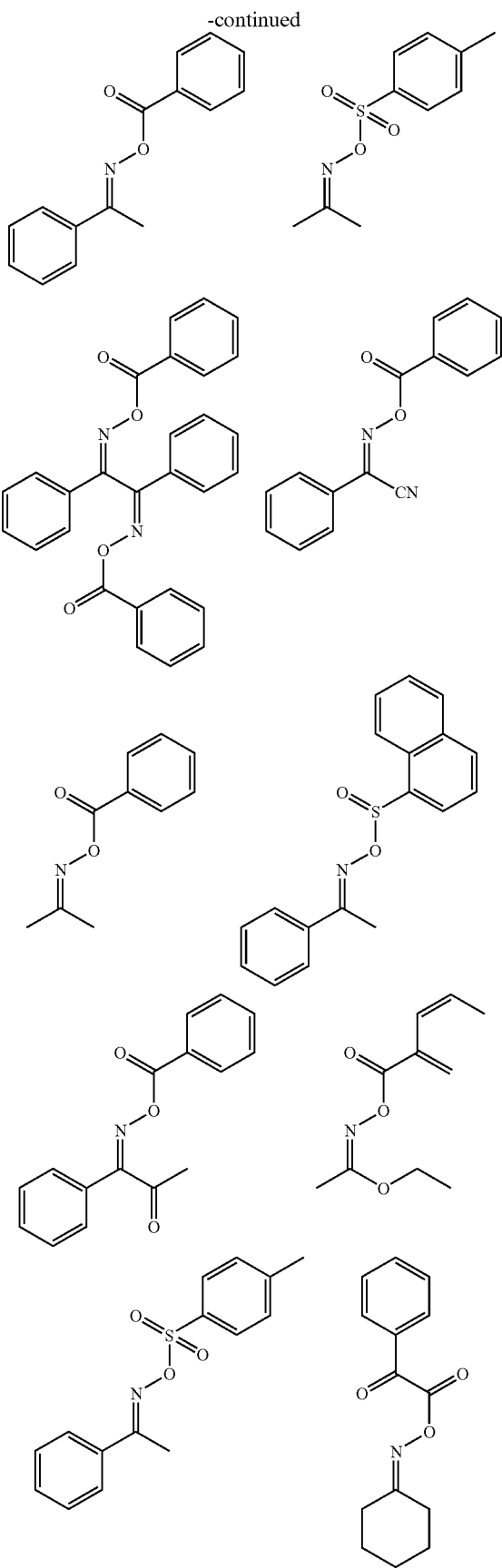

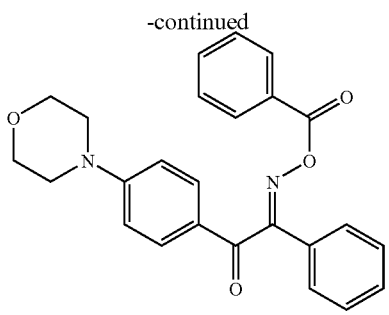

Examples of the onium salt compounds (k) include the diazonium salts described in S. I. Schlesinger, Photogr. Sci. Eng., 18, 387 (1974), T. S. Bal et al., Polymer, 21, 423 (1980); the ammonium salts described in U.S. Pat. No. 4,069,055, JP-A No. 4-365049, and others; the phosphonium salts described in U.S. Pat. Nos. 4,069,055 and 4,069,056; the iodonium salts described in EP Patent No. 104,143, U.S. Pat. Nos. 339,049 and 410,201, JP-A Nos. 2-150848 and 2-296514; the sulfonium salts described EP Patent Nos. 370, 693, 390,214, 233,567, 297,443, and 297,442, U.S. Pat. Nos. 4,933,377, 161,811, 410,201, 339,049, 4,760,013, 4,734,444, and 2,833,827, and Germany Patent No. 2,904,626, 3,604, 580, and 3,604,581; the selenonium salts described in J. V. Crivello et al., Macromolecules, 10 (6), 1307 (1977), J. V. Crivello et al., J. Polymer Sci., Polymer Chem. Ed., 17, 1047 (1979); the arsonium salts described in C. S. Wen et al., Teh, Proc. Conf. Rad. Curing ASIA, p. 478 Tokyo, October (1988); and the like.

Particularly, from the view points of reactivity and stability, preferred polymerization initiator are the oxime ester compound or a diazonium salt, an iodonium salt, a sulfonium salt described in detail below. In the present invention, the onium salt functions as an ionic radical polymerization initiator, not as an acid-generating agent.

The onium salt suitably used in the present invention are those represented by the following general formulas (RI-I) to (RI-III).

$$Ar^{11}-N^+ \equiv N \qquad \text{Formula (RI-I)}$$
$$Z_{11}^-$$

$$Ar^{21}-I^+-Ar^{22} \qquad \text{Formula (RI-II)}$$
$$Z_{21}^-$$

$$\underset{R^{33}}{\overset{R^{31}}{\underset{|}{S^+}}}R^{32} \quad Z_{31}^- \qquad \text{Formula (RI-III)}$$

In the formula (RI-I), $Ar^{11}$ represent an aryl group containing 20 or less carbon atoms, which may have 1 to 6 substituents, and the substituents are preferably selected from alkyl groups each containing 1 to 12 carbon atoms, alkenyl groups each containing 2 to 12 carbon atoms, alkynyl groups each containing 2 to 12 carbon atoms, aryl groups each containing 6 to 12 carbon atoms, alkoxy groups each containing 1 to 12 carbon atoms, aryloxy groups each containing 6 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 6 to 12 carbon atoms, carbonyl groups, carboxyl groups, cyano groups, sulfonyl groups, thioalkyl groups each containing 1 to 12 carbon atoms, and thioaryl groups each containing 6 to 12 carbon atoms. $Z_{11}^-$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z^{11-}$ preferably represents a perchlorate ion, a hexafluorophosphate ion, a tetrafluoroborate ion, a sulfonate ion, or a sulfinate ion from the viewpoint of stability.

In the formula (RI-II), $Ar^{21}$ and $Ar^{22}$ each independently represent an aryl group containing 20 or less carbon atoms, which may have 1 to 6 substituents, and the substituents are preferably selected from alkyl groups each containing 1 to 12 carbon atoms, alkenyl groups each containing 2 to 12 carbon atoms, alkynyl groups each containing 2 to 12 carbon atoms, aryl groups each containing 6 to 12 carbon atoms, alkoxy groups each containing 1 to 12 carbon atoms, aryloxy groups each containing 6 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 6 to 12 carbon atoms, carbonyl groups, carboxyl groups, cyano groups, sulfonyl groups, thioalkyl groups each containing 1 to 12 carbon atoms, and thioaryl groups each containing 6 to 12 carbon atoms. $Z_{21}^-$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{21}^-$ preferably represents a perchlorate ion, a hexafluorophosphate ion, a tetrafluoroborate ion, a sulfonate ion, a sulfinate ion, or a carboxylate ion from the viewpoint of stability and reactivity.

In the formula (RI-III), $R^{31}$, $R^{32}$ and $R^{33}$ each independently represent an aryl group, alkyl group, alkenyl group or alkynyl group containing 20 or less carbon atoms which may have 1 to 6 substituents, and is preferably an aryl group in respect of reactivity and safety. The substituents are preferably selected from alkyl groups each containing 1 to 12 carbon atoms, alkenyl groups each containing 2 to 12 carbon atoms, alkynyl groups each containing 2 to 12 carbon atoms, aryl groups each containing 6 to 12 carbon atoms, alkoxy groups each containing 1 to 12 carbon atoms, aryloxy groups each containing 6 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 6 to 12 carbon atoms, carbonyl groups, carboxyl groups, cyano groups, sulfonyl groups, thioalkyl groups each containing 1 to 12 carbon atoms, and thioaryl groups each containing 6 to 12 carbon atoms. $Z_{31}^-$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{31}^-$ preferably represents a perchlorate ion, a hexafluorophosphate ion, a tetrafluoroborate ion, a sulfonate ion, a sulfinate ion, or a carboxylate ion from the viewpoint of stability and reactivity. In an embodiment, $Z_{31}^-$ represents a carboxylate ion disclosed in JP-A 2001-343742, the disclosure of which is incorporated by reference herein. In another embodiment, $Z_{31}^-$ represents a carboxylate ion disclosed in JP-A 2002-148790, the disclosure of which is incorporated by reference herein.

Hereinafter, specific examples of the onium salt compound suitably used as the polymerization initiator in the present invention will be described, but the present invention is not limited by those onium salt compounds.

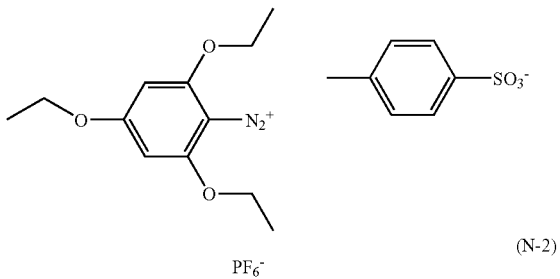

(N-1)

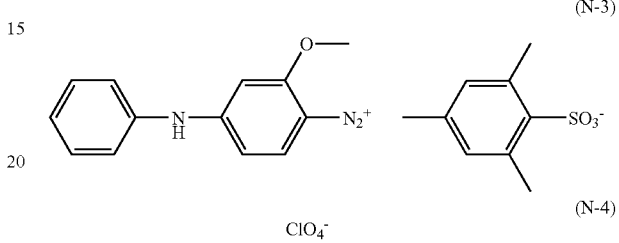

(N-2)
(N-3)

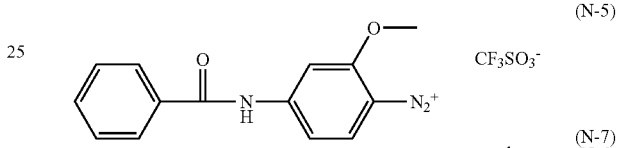

(N-4)
(N-5)

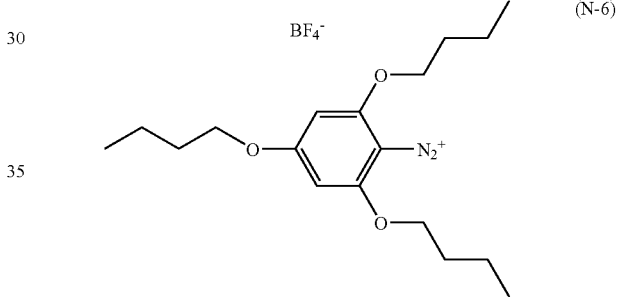

(N-7)
(N-6)

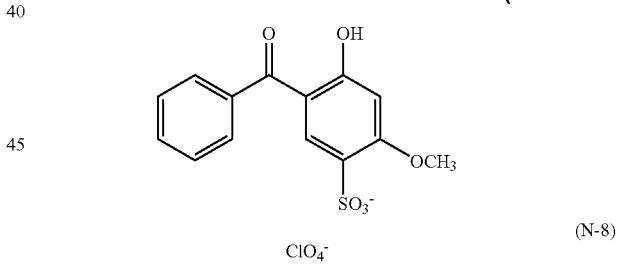

(N-8)
(N-9)

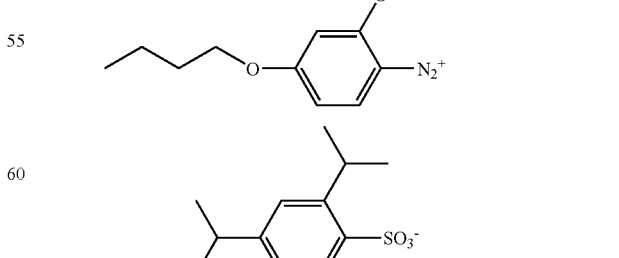

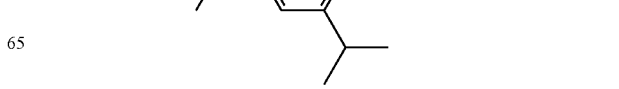

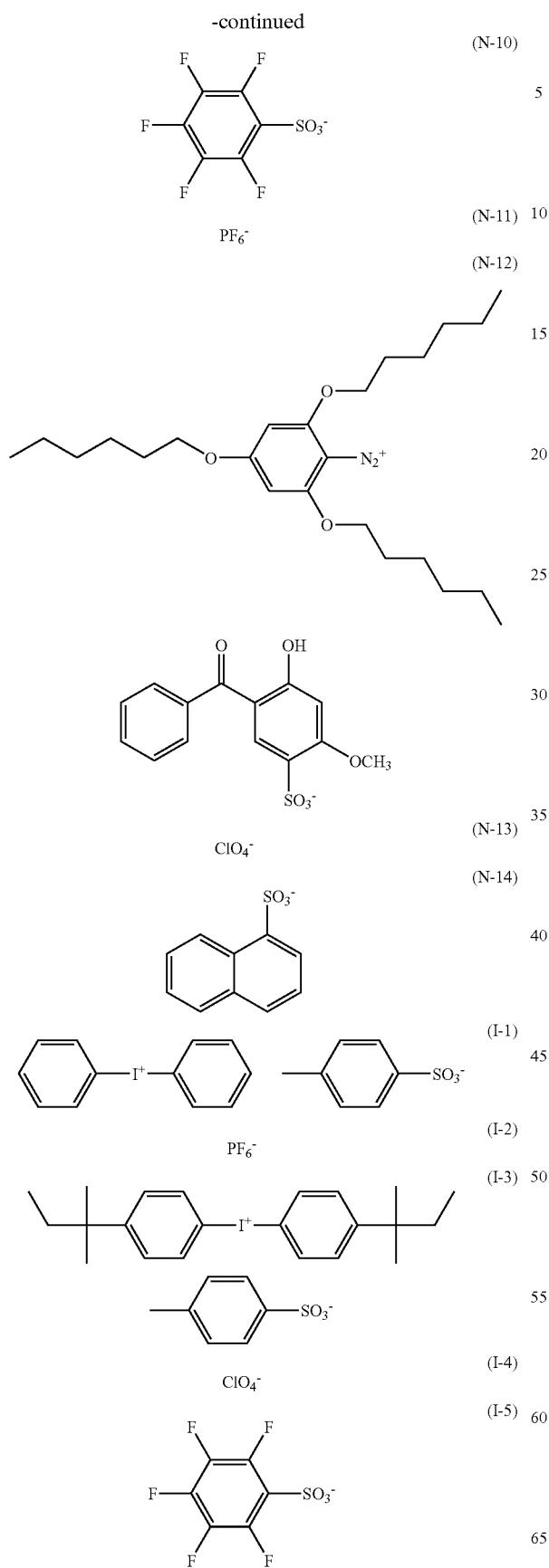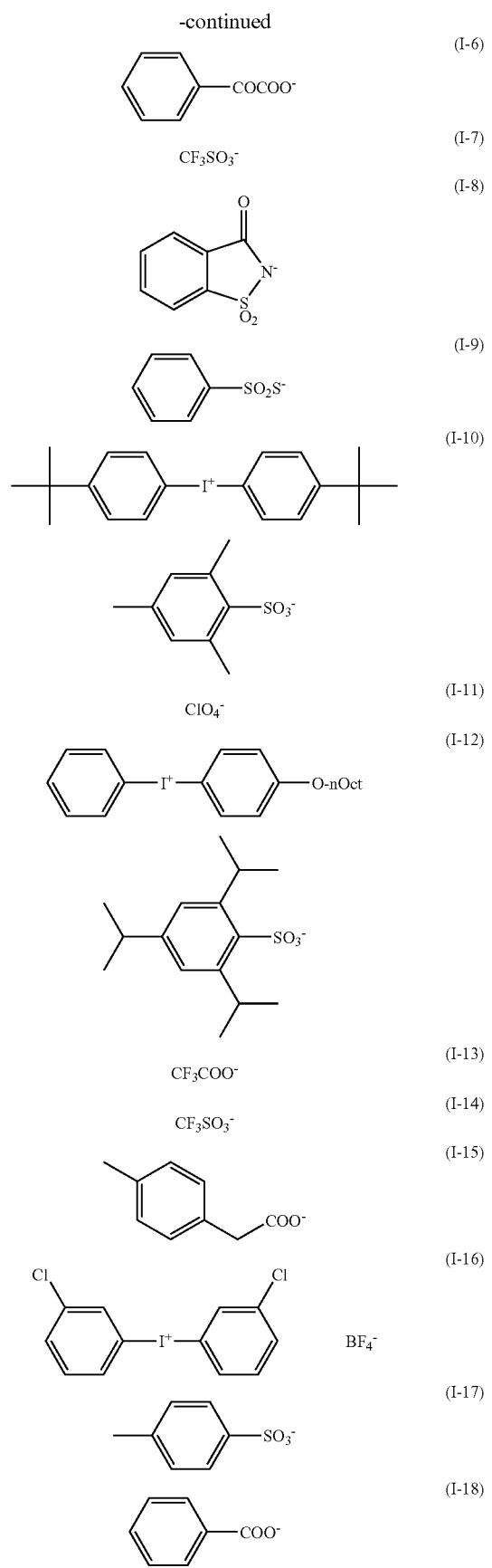

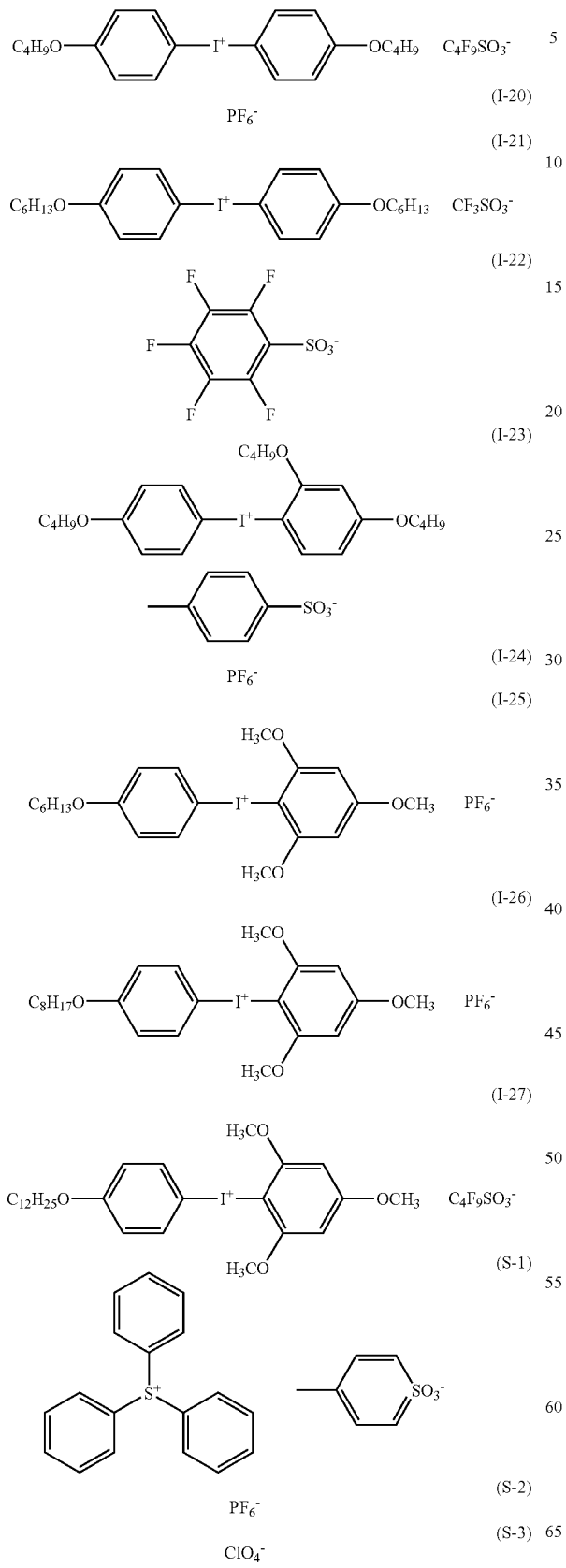
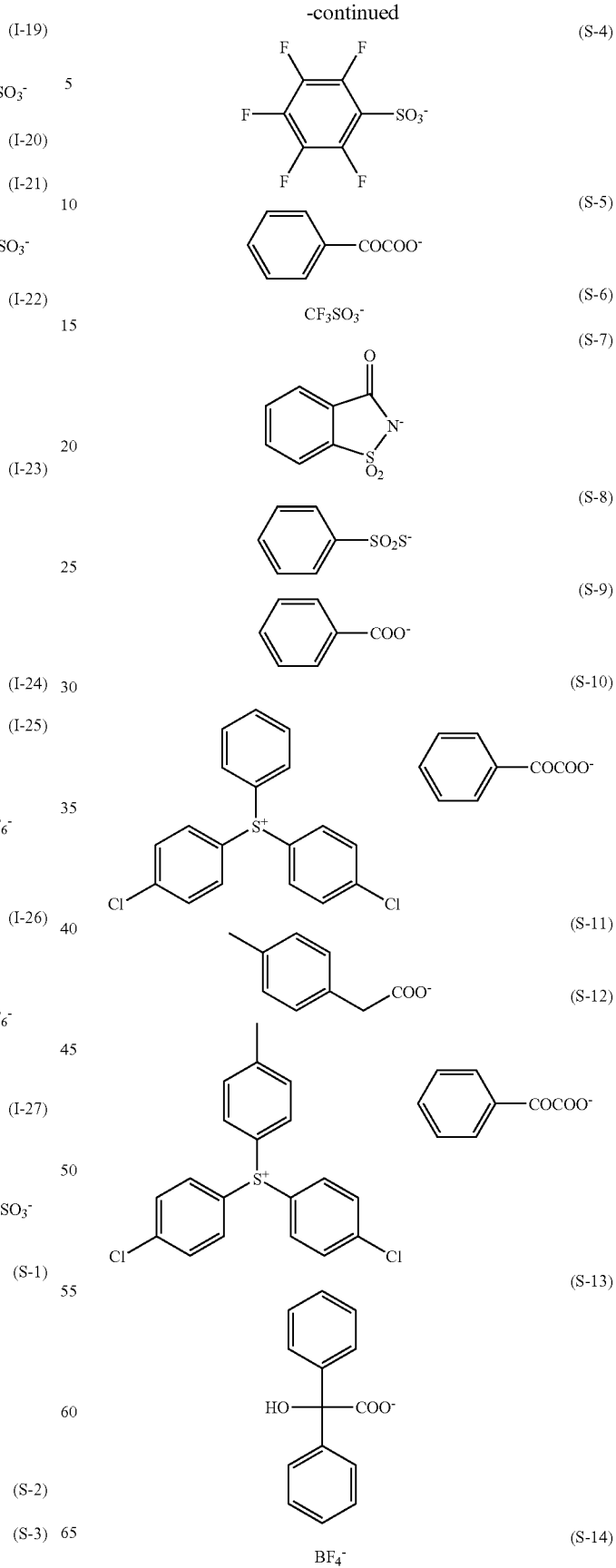

-continued

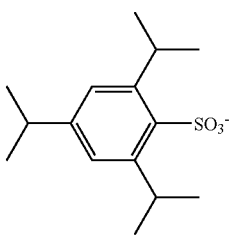
(S-15)

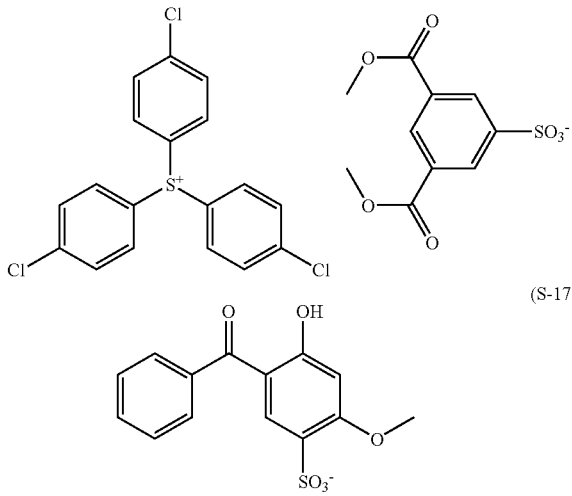
(S-16)

(S-17)

Among the above-listed compounds, preferred examples of the polymerization initiator in the present invention are, particularly from the view points of reactivity and stability, the oxime ester compound (j) and the diazonium salt, the iodonium salt, the sulfonium salt included in the onium salt compound (k). In the present invention, the onium salt functions as an ionic radical polymerization initiator, not as an acid generating agent.

In view of a balance between the reactivity and the stability, particularly preferred polymerization initiators of this invention are an iodonium salt having an electron donating group or a sulfonium salt having an electron attracting group, and, among the above, the iodonium salt may preferably have 2 or more alkoxy groups and the like, most preferably 3 or more alkoxy groups and the like, in a skeleton having a cation part.

The content of the polymerization initiator (c) in the total solid constituting the image recording layer may be 0.1 to 50% by weight, preferably 0.5 to 30% by weight, more preferably 1 to 20% by weight. When the content is within the above range, high sensitivity and excellent stain resistance of a non-image region during printing can be achieved. Only a single polymerization initiator may be used or two or more polymerization initiators may be used in combination. The polymerization initiator may be incorporated into the layer containing other components or may be incorporated into a separate layer different from the layer containing other components.

[Binder Polymer (A)]

In the image recording material of the present invention, for the purposes of improvement in coating characteristics of the recording layer to be formed and the like, a binder polymer may be used when so required. It is preferable to use a linear organic polymer as the binder. As the linear organic polymer, known linear organic polymers may arbitrarily be used. It is preferable to select the linear organic polymer capable of being dissolved into or swollen in water or a weak alkaline water in order to enable water development or a weak alkaline water development. The linear organic polymer is selected and used not only as the coating film formation agent for the image recording material, but also depending on a usage as water, a weak alkaline water, or an organic solvent developing agent.

In the present invention, since the alkali developing property is preferred, it is preferable to use a polymer containing an alkali-soluble group in molecule.

For example, water development is possible if a water-soluble organic polymer is used. Examples of such a linear organic polymer include radical polymers having a carboxylic acid group in a side chain, such as those described in JP-A No. 59-44615, Japanese Patent Application Publication (JP-B) No. 54-34327, JP-B No. 58-12577, JP-B No. 54-25957, JP-A No. 54-92723, JP-A No 59-53836, and JP-A No. 59-71048; that is, resins consisting of a homopolymer or copolymer containing a monomer having a carboxyl group, resins obtained by forming a homopolymer or copolymer containing a monomer having an acid anhydride and converting acid anhydride units in the homopolymer or copolymer to a hydrolysate, half ester or half amide of an acid anhydride, and epoxy acrylates consisting of an epoxy resin modified with unsaturated monocarboxylic acid and acid anhydride. Examples of the monomer having a carboxyl group include acrylic acid, methacrylic acid, itaconic acid, crotonic acid, maleic acid, fumaric acid, and 4-carboxylstyrene. Examples of the monomer having an acid anhydride include maleic anhydride.

Also usable is an acidic cellulose derivative having a carboxylic acid group in a side chain, and a product obtained by adding a cyclic acid anhydride to a polymer having a hydroxyl group.

When a copolymer containing an alkali-soluble resin is used, the copolymer may include a monomer other than the above-mentioned monomer. Examples of such an additional monomer include the following compounds (1) to (13):

(1) Acrylic esters and methacrylic esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyoxyethyl acrylate and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyoxyethyl methacrylate and propargyl methacrylate.

(4) Acrylamides and methacylamides, such as acrylamide, methacrylamide, N-methylol acrylamide, N-ethyl acrylamide, N-hexyl methacylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide and allyl methacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters such as vinyl acetate, vinyl chloroacetate, vinyl butyrate and vinyl benzoate.

(7) Styrenes, such as styrene, α-methyl styrene, methyl styrene, chloromethyl styrene and p-acetoxy styrene.

(8) Vinyl ketones such as methyl vinyl ketone, ethyl vinyl ketone, propyl vinyl ketone and phenyl vinyl ketone.

(9) Olefins such as ethylene, propylene, isobutylene, butadiene and isoprene.

(10) N-vinyl pyrrolidone, acrylonitrile, methacrylonitrile etc.

(11) Unsaturated imides such as maleimide, N-acryloyl acrylamide, N-acetyl methacrylamide, N-propionyl methacrylamide and N-(p-chlorobenzoyl) methacrylamide.

(12) Methacrylic acid-based monomers having a heteroatom at the α-position. Examples thereof include compounds described in JP-A Nos. 2002-309057 and 2002-311569.

Among these, (meth)acrylic resins having a carboxyl group and at least one of an allyl group or a vinyl ester group in a side chain, alkali-soluble resins having a double bond in a side chain as described in JP-A No. 2000-187322 and JP-A No. 2002-62698, and alkali-soluble resins having an amide group in a side chain as described in JP-A No. 2001-242612 are preferable because they are excellent in the balance among film strength, sensitivity and developability.

Urethane-containing binder polymers containing an acid group as described in JP-B No. 7-12004, JP-B No. 7-120041, JP-B No. 7-120042, JP-B No. 8-12424, JP-A No. 63-287944, JP-A No. 63-287947, and JP-A No. 1-271741 and urethane-containing binder polymers containing an acid group and a double bond as described in JP-A No. 2002-107918 are very excellent in strength and thus advantageous in respect of printing durability and low-exposure suitability. Acetal-modified polyvinyl alcohol-containing binder polymers having an acid group as described in EP993966, EP1204000, and JP-A No. 2001-318463 are preferable because they are excellent in the balance between film strength and developability.

As other water-soluble linear organic compounds, polyvinyl pyrrolidone and polyethylene oxide are useful. To increase the strength of the cured film, alcohol-soluble nylon, polyethers of 2,2-bis-(4-hydroxyphenyl)-propane and epichlorohydrin, etc. are also useful.

The weight-average molecular weight of the polymer used in the invention is preferably 5000 or more, more preferably in the range of 10,000 to 300,000, and the number-average molecular weight thereof is preferably 1,000 or more, more preferably in the range of 2,000 to 250,000. Polydispersity (weight-average molecular weight/number-average molecular weight) is preferably 1 or more, more preferably in the range of 1.1 to 10.

The polymer may be a random polymer, a block polymer or a graft polymer.

The polymer used in the invention can be synthesized in a method known in the art. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. Only one solvent may be used, or a mixture of two or more solvents may be used.

As the radical polymerization initiator used for synthesizing the polymer used in the invention, known compounds such as an azo initiator or a peroxide initiator can be used.

Among the binders described above, binder polymers having a repeating unit represented by the following formula (I) shown in Japanese Patent Application No. 2004-318053, such as 2-methacryloyloxyethylsuccinic acid polymer and 2-methacryloyloxyethylhexahydrophthalic acid copolymer, are preferable from the viewpoint of preventing damage caused by a developer.

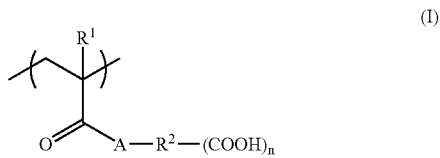

(I)

In formula (I), $R^1$ represents a hydrogen atom or a methyl group; $R^2$ is a linking group composed of two or more atoms selected from the group consisting of carbon atoms, hydrogen atoms, oxygen atoms, nitrogen atoms and sulfur atoms wherein the number of atoms in the linking group is 2 to 82; A represents an oxygen atom or —$NR^3$— wherein $R^3$ represents a hydrogen atom or a $C_{1-10}$ monovalent hydrocarbon group; and n is an integer of 1 to 5.

In the formula (I) above, the number of atoms in the main skeleton of the linking group represented by $R^2$ is preferably 1 to 30. $R^2$ preferably has an alkylene structure or a structure including alkylene structures linked via ester linkages.

Hereinafter, the repeating units represented by the formula (I) will be described in detail. $R^1$ in the formula (I) represents a hydrogen atom or a methyl group, preferably a methyl group.

The linking group represented by $R^2$ in the formula (I) is a linking group composed of two or more atoms selected from the group consisting of carbon atoms, hydrogen atoms, oxygen atoms, nitrogen atoms and sulfur atoms wherein the number of atoms in the linking group is 2 to 82, preferably 2 to 50, more preferably 2 to 30. When the linking group has substituent(s), the number of atoms refers to the number of atoms including the atoms in the substituent(s) on the linking group.

Specifically, the number of atoms in the main skeleton of the linking group represented by $R^2$ is preferably 1 to 30, more preferably 3 to 25, still more preferably 4 to 20, most preferably 5 to 10. The "main skeleton of the linking group" in the invention refers to an atom or an atomic group serving to link A to the terminal COOH in the formula (I). When plural linking routes are present, the main skeleton refers to the atom or atomic group constituting the linking route having the smallest number of atoms. Accordingly, when the linking group has a cyclic structure, the number of atoms to be used for calculation varies depending on the linking site (for example, o-, m-, p- etc.).

A structure of the specific binder polymer of the present invention, the number of atoms constituting a main skeleton of a linking group represented by $R^2$ in the structure, and a method of calculating the number will be described below.

| | Number of atoms constituting a main skeleton of a linking group |
|---|---|
| (1) 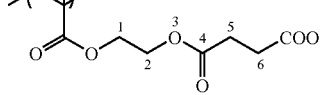 | :6 |
| (2) 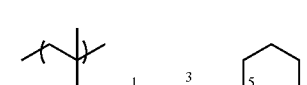 | :6 |
| (3) 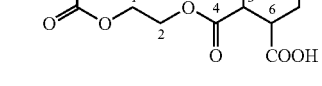 | :6 |
| (4) 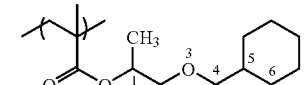 | :8 |
| (5) 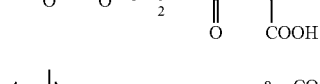 | :6 |
| (6) 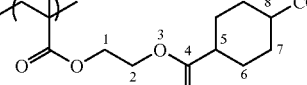 | :6 |
| (7) 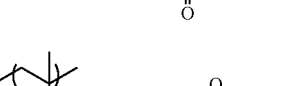 | :7 |
| (8) 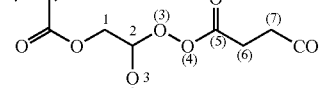 | :6 |

The linking group represented by $R^2$ in the formula (I) is more specifically an alkylene, a substituted alkylene, an arylene, a substituted arylene, or a group in which plural divalent groups, such as those described above, are linked via amide or ester linkages.

A linking group in the chain structure may be ethylene, propylene etc. A structure including such alkylene groups linked via ester linkages is also preferable.

The linking group represented by $R^2$ in the formula (I) is preferably a (n+1)-valent hydrocarbon group having a $C_{3-30}$ alicyclic structure. Examples thereof include (n+1)-valent hydrocarbon groups obtained by removing (n+1) hydrogen atoms on one or more arbitrary carbon atoms constituting a compound having an alicyclic structure such as cyclopropane, cyclopentane, cyclohexane, cycloheptane, cyclooctane, cyclodecane, dicyclohexyl, tertiary cyclohexyl or norbornane which may be substituted by one or more arbitrary substituents. $R^2$ preferably has 3 to 30 carbon atoms including the carbon atoms in the substituent(s) if any.

One or more arbitrary carbon atoms in the compound having an alicyclic structure may be substituted by one or more heteroatoms selected from the group consisting of nitrogen atoms, oxygen atoms and sulfur atoms. In respect of printing durability, $R^2$ is preferably a (n+1)-valent hydrocarbon group having an alicyclic structure which may have a substituent and which includes two or more rings and has 5 to 30 carbon atoms, such as a condensed polycyclic aliphatic hydrocarbon, a crosslinked alicyclic hydrocarbon, a spiroaliphatic hydrocarbon, and a combination of aliphatic hydrocarbon rings (a structure in which rings are combined by bonds or via linking groups). The number of carbon atoms refers to the number of carbon atoms including the carbon atoms in the substituent(s) if any.

The linking group represented by $R^2$ preferably has five to ten atoms. The structure of the linking group is preferably a chain structure. The chain structure preferably include an ester linkage or such a cyclic structure as described above.

A substituent which can be introduced into the linking group represented by $R^2$ may be a monovalent non-metal atomic group excluding hydrogen, and examples thereof include a halogen atom (—F, —Br, —Cl, —I), a hydroxyl group, an alkoxy group, an aryloxy group, a mercapto group, an alkyl thio group, an aryl thio group, an alkyl dithio group, an aryl dithio group, an amino group, a N-alkyl amino group, a N,N-dialkyl amino group, a N-aryl amino group, a N,N-diaryl amino group, a N-alkyl-N-aryl amino group, an acyloxy group, a carbamoyloxy group, a N-alkylcarbamoyloxy group, a N-aryl carbamoyloxy group, a N,N-dialkyl carbamoyloxy group, a N,N-diaryl carbamoyloxy group, a N-alkyl-N-aryl carbamoyloxy group, an alkyl sulfoxy group, an aryl sulfoxy group, an acyl thio group, an acyl amino group, a N-alkyl acyl amino group, a N-aryl acyl amino group, a ureido group, a N'-alkyl ureido group, a N',N'-dialkyl ureido group, a N'-aryl ureido group, a N',N'-diaryl ureido group, a N'-alkyl-N'-aryl ureido group, a N-alkyl ureido group, a N-aryl ureido group, a N'-alkyl-N-alkyl ureido group, a N'-alkyl-N-aryl ureido group, a N',N'-dialkyl-N-alkyl ureido group, a N',N'-dialkyl-N-aryl ureido group, a N'-aryl-N-alkyl ureido group, a N'-aryl-N-aryl ureido group, a N',N'-diaryl-N-alkyl ureido group, a N',N'-diaryl-N-aryl ureido group, a N'-alkyl-N'-aryl-N-alkyl ureido group, a N'-alkyl-N'-aryl-N-aryl ureido group, an alkoxy carbonyl amino group, an aryloxy carbonyl amino group, a N-alkyl-N-alkoxycarbonyl amino group, a N-alkyl-N-aryloxy carbonyl amino group, a N-aryl-N-alkoxycarbonyl amino group, a N-aryl-N-aryloxycarbonyl amino group, a formyl group, an acyl group, a carboxyl group and its conjugate base group, an alkoxy carbonyl group, an aryloxy carbonyl group, a carbamoyl group, a N-alkyl carbamoyl group, a N,N-dialkyl carbamoyl group, a N-aryl carbamoyl group, a N,N-diaryl carbamoyl group, a N-alkyl-N-aryl carbamoyl group, an alkyl sulfinyl group, an aryl sulfinyl group, an alkyl sulfonyl group, an aryl sulfonyl group, a sulfo group (—SO$_3$H) and its conjugate base group, an alkoxy sulfonyl group, an aryloxy sulfonyl group, a sulfinamoyl group, a N-alkyl sulfinamoyl group, a N,N-dialkyl sulfinamoyl group, a N-aryl sulfinamoyl group, a N,N-diaryl sulfinamoyl group, a N-alkyl-N-aryl sulfinamoyl group, a sulfamoyl group, a N-alkyl sulfamoyl group, a N,N-dialkyl sulfamoyl group, a N-aryl sulfamoyl group, a N,N-diaryl sulfamoyl group, a N-alkyl-N-aryl sulfamoyl group, a N-acyl sulfamoyl group and its conjugate base group, a N-alkyl sulfonyl sulfamoyl group (—SO$_2$NHSO$_2$ (alkyl)) and its conjugate base group, a N-aryl sulfonyl sulfamoyl group (—SO$_2$NHSO$_2$ (allyl)) and its conjugate base group, a N-alkyl sulfonyl carbamoyl group (—CONHSO$_2$ (alkyl)) and its conjugate base group, a N-aryl sulfonyl carbamoyl group (—CONHSO$_2$ (aryl)) and its conjugate base group, an alkoxy silyl group (—Si(O-alkyl)$_3$), an aryloxy silyl group (—Si(O-aryl)$_3$), a hydroxysilyl group (—Si(OH)$_3$) and its conjugate base group, a phosphono group (—PO$_3$H$_2$) and is conjugate base group, a dialkyl phosphono group (—PO$_3$ (alkyl)$_2$), a diaryl phosphono group (—PO$_3$(aryl)$_2$), an alkyl aryl phosphono group (—PO$_3$(alkyl)(aryl)), a monoalkyl phosphono group (—PO$_3$H(alkyl)) and its conjugate base group, a monoaryl phosphono group (—PO$_3$H(aryl)) and its conjugate base group, a phosphonoxy group (—OPO$_3$H$_2$) and its conjugate base group, a dialkyl phosphonoxy group (—OPO$_3$(alkyl)$_2$), a diaryl phosphonoxy group (—OPO$_3$(aryl)$_2$), an alkyl aryl phosphonoxy group (—OPO$_3$(alkyl)(aryl)), a monoalkyl phosphonoxy group (—OPO$_3$H(alkyl)) and its conjugate base group, a monoaryl phosphonoxy group (—OPO$_3$H(aryl)) and its conjugate base group, a cyano group, a nitro group, a dialkyl boryl group (—B(alkyl)$_2$), a diaryl boryl group (—B(aryl)$_2$), an alkyl aryl boryl group (—B(alkyl)(aryl)), a dihydroxy boryl group (—B(OH)$_2$) and its conjugate base group, an alkyl hydroxy boryl group (—B(alkyl)(OH)) and its conjugate base group, an aryl hydroxy boryl group (—B(aryl)(OH)) and its conjugate base group, an aryl group, an alkenyl group and an alkynyl group.

In the image recording layer in the invention, a substituent having a hydrogen atom capable of hydrogen bonding, particularly a substituent having acidity whose acid dissociation constant (pKa) is lower than that of carboxylic acid, may not be preferable because it tends to lower printing durability being dependent to a designing of the image recording layer. On the other hand, a hydrophobic substituent such as a halogen atom, a hydrocarbon group (alkyl group, aryl group, alkenyl group, or alkynyl group), an alkoxy group and an aryloxy group is preferable because it tends to improve printing durability. In particular, when the cyclic structure is a six-membered or lower-membered monocyclic aliphatic hydrocarbon such as cyclopentane or cyclohexane, the hydrocarbon preferably has such hydrophobic substituents. If possible, these substituents may be bound to one another or to a substituted hydrocarbon group to form a ring. The substituents may themselves be substituted.

When A in the formula (I) is NR$^3$—, R$^3$ represents a hydrogen atom or a C$_{1-10}$ monovalent hydrocarbon group. Examples of the C$_{1-10}$ monovalent hydrocarbon group represented by R$^3$ include an alkyl group, an aryl group, an alkenyl group and an alkynyl group.

Examples of the alkyl group include a C$_{1-10}$ linear, branched or cyclic alkyl group such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamanthyl group and a 2-norbornyl group.

Examples of the aryl group include a C$_{6-10}$ aryl group such as a phenyl group, a naphthyl group and indenyl group, a C$_{1-10}$ heteroaryl group containing one heteroatom selected from the group consisting of a nitrogen atom, an oxygen atom and a sulfur atom, for example a furyl group, a thienyl group, a pyrrolyl group, a pyridyl group and a quinolyl group.

Examples of the alkenyl group include a C$_{2-10}$ linear, branched or cyclic alkenyl group such as a vinyl group, a 1-propenyl group, a 1-butenyl group, a 1-methyl-1-propenyl group, a 1-cyclopentenyl group and a 1-cyclohexenyl group.

Examples of the alkynyl group include a C$_{2-10}$ alkynyl group such as an ethynyl group, a 1-propynyl group, a 1-butynyl group and a 1-octynyl group. Substituents that R$^3$ may have include the same substituents as those mentioned above as the substituents that R$^2$ may have. The number of carbon atoms in R$^3$, including the number of carbon atoms in its substituent, is 1 to 10.

A in the formula (I) is preferably an oxygen atom or —NH— in respect of easy synthesis.

n in the formula (I) is an integer of 1 to 5, preferably 1 in respect of printing durability.

Preferable examples of the repeating unit represented by the formula (I) in a favourable binder polymer are shown below, but the examples should not be construed as limiting the invention.

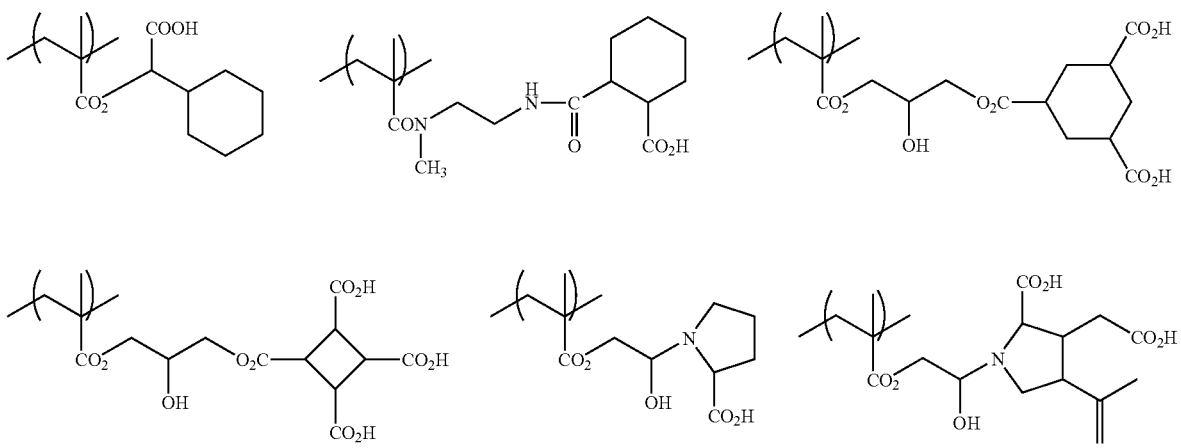

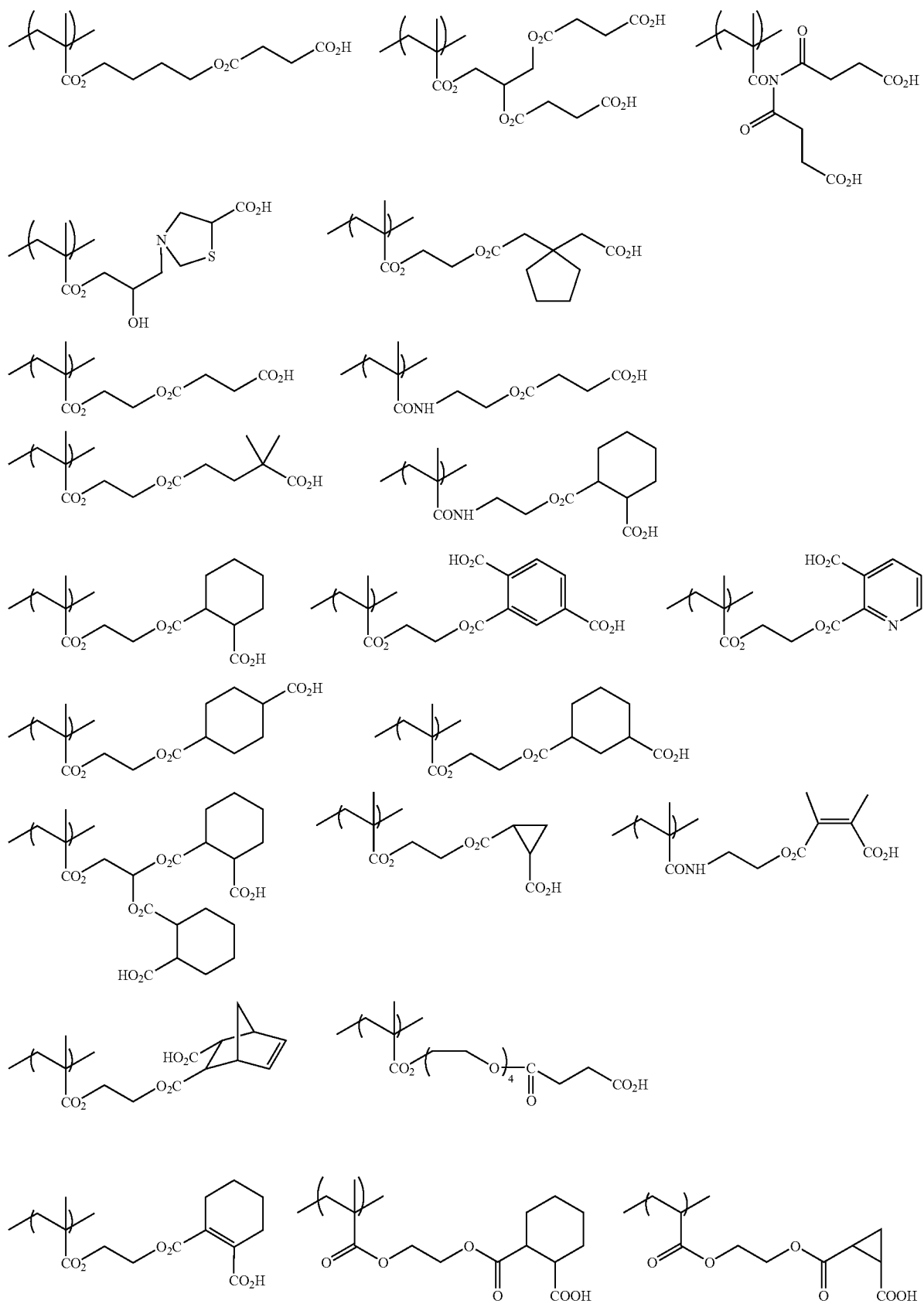

-continued
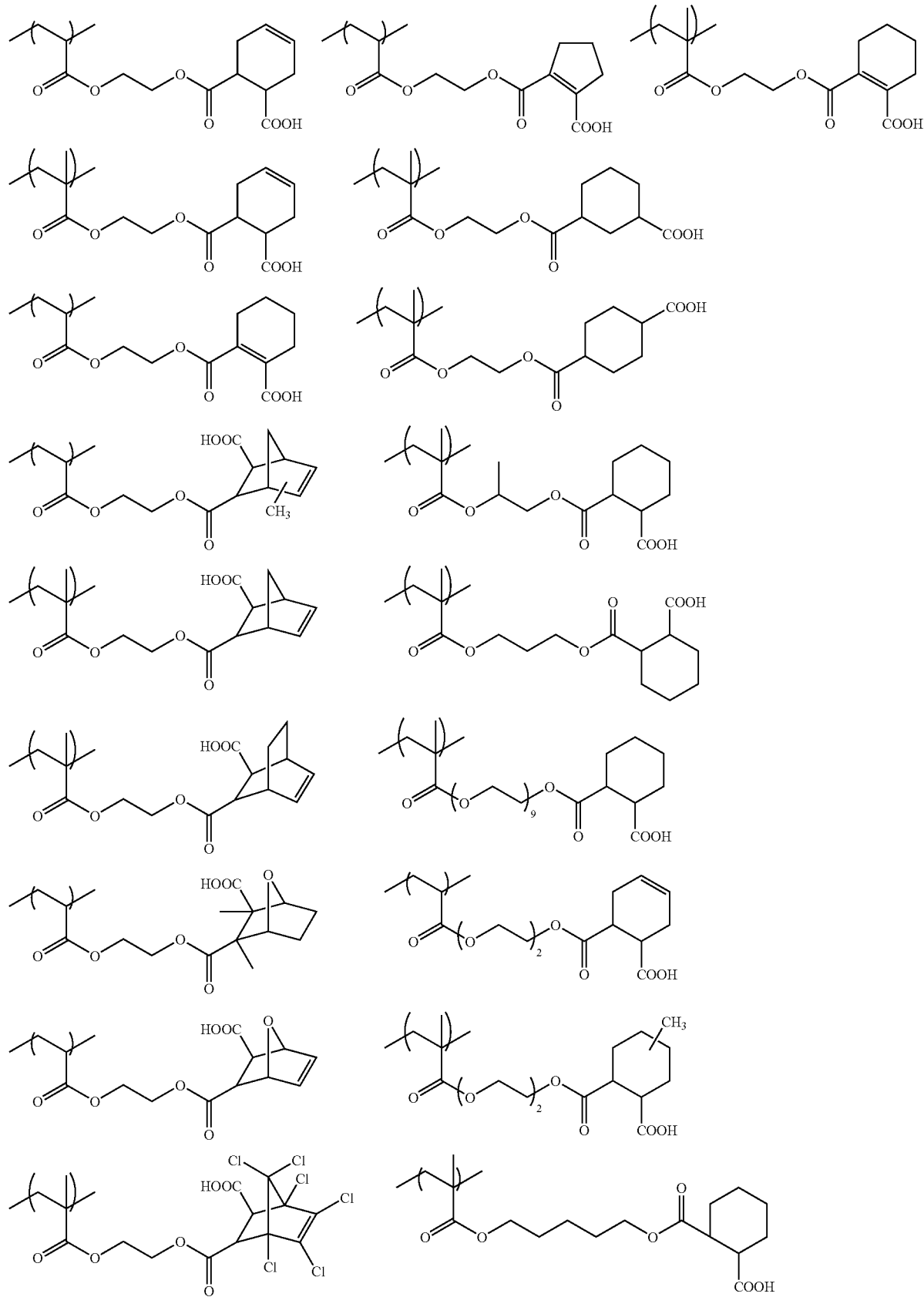

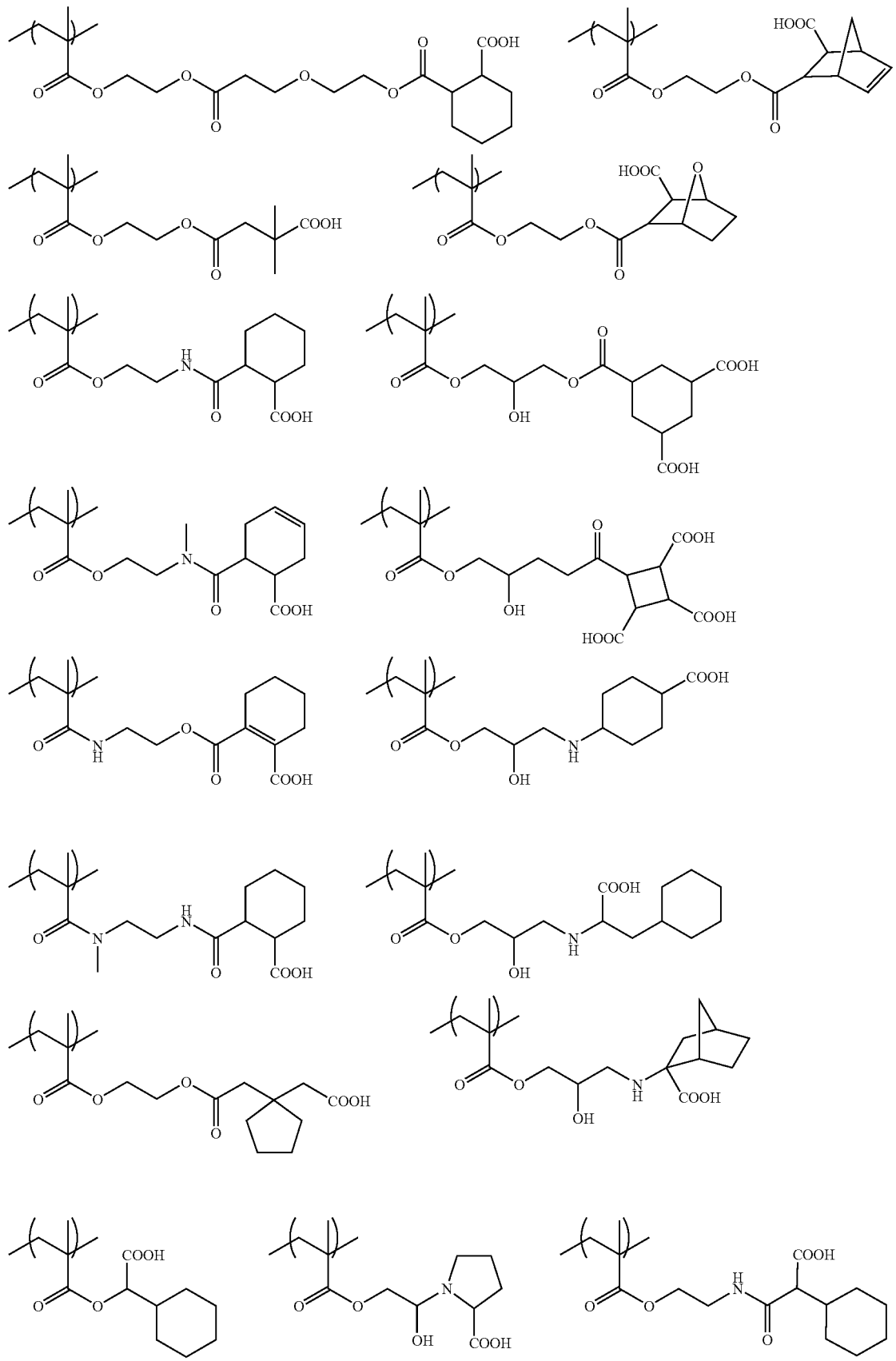

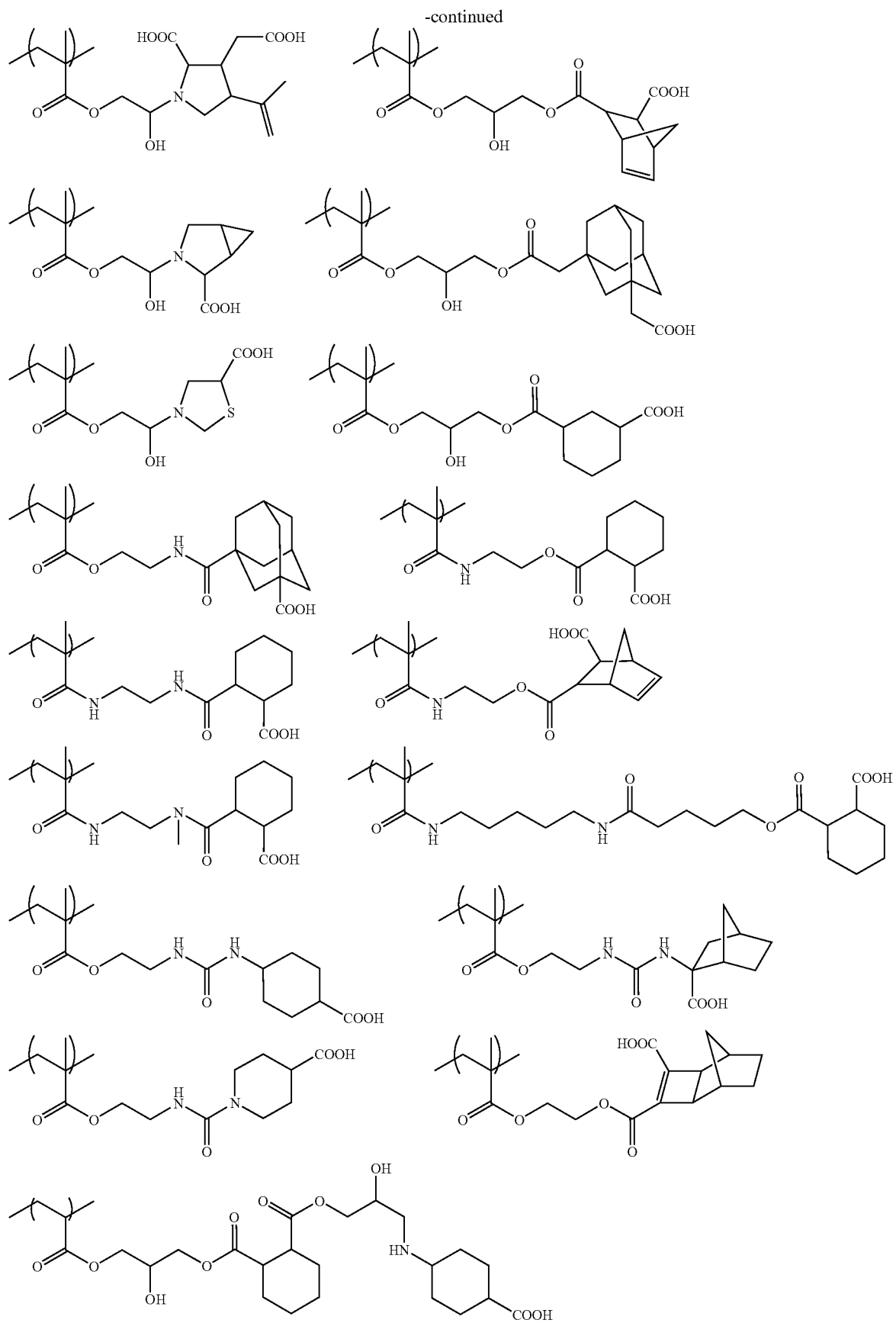

-continued

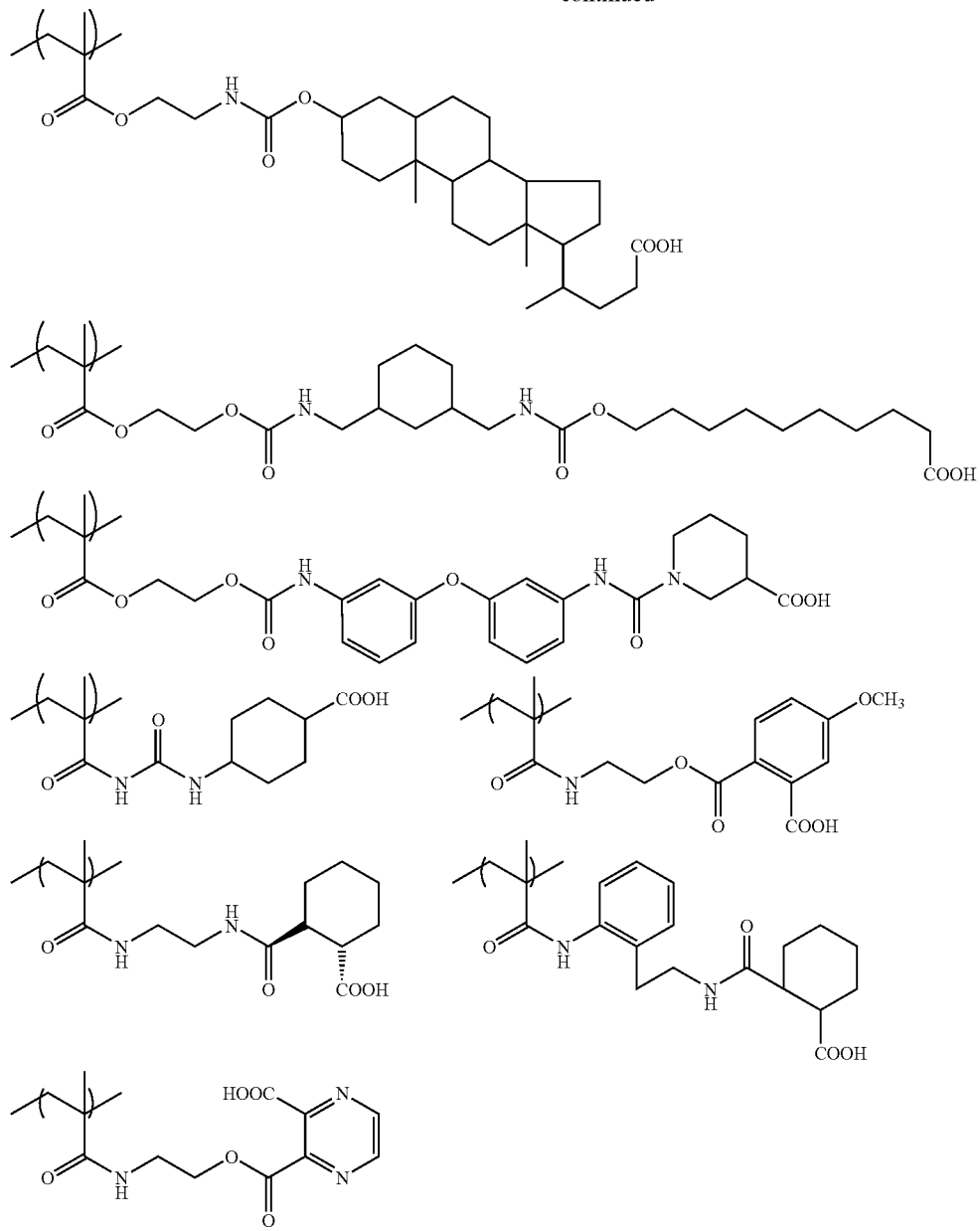

In an embodiment, one kind of repeating unit represented by formula (I) is included in the binder polymer. In another embodiment, two or more kinds of repeating unit represented by the formula (I) are contained in the binder polymer. The binder polymer preferred in the invention may be a polymer composed exclusively of the repeating unit represented by the formula (I), but is generally used as a copolymer containing one or more other copolymerizable components. The total content of the repeating unit represented by the formula (I) in the copolymer is determined suitably depending on the structure of the copolymer, the design of the polymerizable composition, etc., but is preferably 1 to 99 mol-%, more preferably 5 to 40 mol-%, still more preferably 5 to 20 mol-%, based on the total molar amount of the polymer components.

When a copolymer containing the repeating unit represented by formula (I) is used, other copolymer components than the repeating unit represented by formula (I) may be selected from radical polymerizable monomers known in the art without particular limitation. Specific examples include monomers described in Polymer Data Handbook—Fundamental Version—(in Japanese) compiled by the Society of Polymer Science, Japan and published by Baifukan, 1986. Such additional copolymerizable components may include only one copolymerization component, or a combination of two or more compolymerization components.

Among the binder polymers shown above, particularly [allyl (meth)acrylate/(meth)acrylic acid/optional other addition-polymerizable vinyl monomer] copolymer, polymers containing an acryl group, methacryl group and allyl group as described in JP-A No. 2000-131837, JP-A No. 2002-62648, JP-A No. 2000-187322, or the above Japanese Patent Application No. 2004-318053 are preferable because they are excellent in the balance among film strength, sensitivity and developability.

Most preferable among those described above are polymers having a repeating unit represented by the formula (I) above and a radical polymerizable group (carbon-carbon double bond) having a structure represented by any of the following formula (II) to (IV):

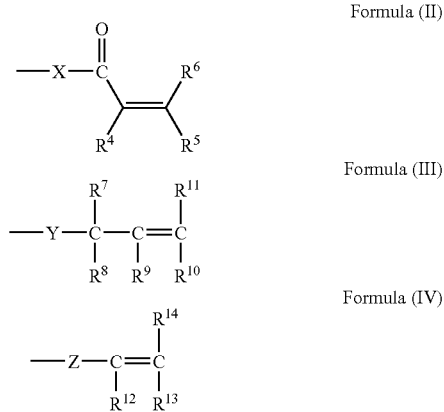

In the formulae (II) to (IV), $R^4$ to $R^{14}$ each independently represent a hydrogen atom or a monovalent substituent; X and Y each independently represent an oxygen atom, a sulfur atom or $N—R^{15}$; Z represents an oxygen atom, a sulfur atom, $—N—R^{15}$ or a phenylene group wherein $R^{15}$ represents a hydrogen atom or a monovalent organic group.

In the formula (II) above, $R^4$ to $R^6$ each independently represent a hydrogen atom or a monovalent substituent. $R^4$ may be a hydrogen atom or an optionally substituted organic group such as an alkyl group. In particular, specifically, a hydrogen atom, a methyl group, a methylalkoxy group or a methyl ester group is preferable. $R^5$ and $R^6$ each independently represent a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable. Substituents which can be introduced into these groups include a methoxycarbonyl group, an ethoxycarbonyl group, an isopropioxycarbonyl group, a methyl group, an ethyl group, and a phenyl group.

X represents an oxygen atom, a sulfur atom or $—N—R^{15}$ wherein $R^{15}$ includes an optionally substituted alkyl group etc.

In the formula (III) above, $R^7$ to $R^{11}$ each independently represent a hydrogen atom or a monovalent substituent, and examples of $R^7$ to $R^{11}$ include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable.

Substituents which can be introduced into these groups include the substituents mentioned above as examples of the substituents that can be introduced in the explanation of the formula (II).

Y represents an oxygen atom, a sulfur atom or $—N—R^{15}$. Examples of $R^{15}$ include the same groups as mentioned in the formula (II).

In the formula (IV) above, $R^{12}$ to $R^{14}$ each independently represent a hydrogen atom or a monovalent substituent, and specific examples include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable.

Substituents which can be introduced into these groups include the substituents mentioned above as examples of the substituents that can be introduced in the formula (II).

Z represents an oxygen atom, a sulfur atom, $—N—R^{15}$ or a phenylene group. Examples of $R^{15}$ include the same groups as mentioned in the formula (II).

Among these radical-polymerizable groups, radical-polymerizable groups having a structure represented by the formulas (II) or (III) are preferable.

In an embodiment, only one of such binder polymers is used. In another embodiment, a mixture of two or more of such binder polymers is used.

The molecular weight of the binder polymer (A) in the invention can be suitably determined from the viewpoint of image-forming property and printing durability. Usually the molecular weight is preferably in the range of 2,000 to 1,000,000, more preferably 5,000 to 500,000, still more preferably 10,000 to 200,000.

The binder polymer (A) preferably used in the invention is a polymer substantially insoluble in water but soluble in an aqueous alkali solution. By using this polymer, it follows that as the developer, an environmentally undesirable organic solvent is not used, or the amount of such an organic solvent can be limited to a very small amount. The acid value (i.e. acid content per g of the polymer, expressed in terms of chemical equivalence) and molecular weight of the binder polymer (A) are suitably selected from the viewpoint of image strength and developability. The acid value is preferably in the range of 0.4 to 3.0 meq/g, and the molecular weight is preferably 2,000 to 500,000, and more preferably, the acid value is in the range of 0.6 to 2.0, and the molecular weight is in the range of 10,000 to 300,000.

[(B) Polymerizable Compound Having an Unsaturated Group]

A polymerizable compound having an unsaturated group (B) (hereinafter referred to sometimes as polymerizable compound) is contained in the image recording layer of the image recording materials according to the invention.

The polymerizable compound used in the invention is preferably an addition-polymerizable compound having at least one ethylenically unsaturated double bond and is selected preferably from compounds each having at least one, preferably two or more, terminal ethylenically unsaturated bonds. A group of such compounds is well-known in this industrial field, and in the invention, these compounds can be used without any particular limitation. The scope of these compounds include those in chemical forms such as monomers, prepolymers (i.e., dimers, trimers and oligomers), as well as mixtures and copolymers thereof.

Examples of such monomers and copolymers include unsaturated carboxylic acids (e.g., acrylic acid, methacrylic acid, itaconic acid, crotonic acid, isocrotonic acid, maleic acid etc.) and esters and amides thereof, and preferably used among these compounds are esters between unsaturated carboxylic acids and aliphatic polyvalent alcohols and amides between unsaturated carboxylic acids and aliphatic polyvalent amines. Also preferably used among these compounds are unsaturated carboxylic esters having a nucleophilic substituent such as a hydroxyl group, an amino group or a mercapto group, addition-reaction products of amides with monofunctional or multifunctional isocyanates or epoxy compounds, and dehydration condensation reaction products of amides with monofunctional or multifunctional carboxylic acids.

Also preferably used among these compounds are unsaturated carboxylic esters having an electrophilic substituent such as an isocyanate group or an epoxy group, addition-reaction products of amides with monofunctional or multifunctional alcohols, amines or thiols, unsaturated carboxylic esters having an eliminating substituent such as a halogen group and a tosyloxy group, and substitution-reaction products of amides with monofunctional or multifunctional alcohols, amines or thiols. Compounds obtained by replacing the above-described carboxylic acids with unsaturated phosphonic acids, styrene, vinyl ethers etc.

Examples of the ester monomers between aliphatic polyvalent alcohols and unsaturated carboxylic acids include:

acrylic esters such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl)isocyanurate, and polyester acrylate oligomers;

methacrylic esters such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis[p-(methacryloxyethoxy)-phenyl]dimethyl methane;

itaconic esters such as ethylene glycol diitaconate, propylene glycol diitaconate, 1,3-butane diol diitaconate, 1,4-butane diol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, sorbitol tetradicrotonate;

isocrotonic esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sorbitol tetramaleate.

Other examples of preferable esters include aliphatic alcohol-based esters described in JP-B No. 46-27926, JP-B No. 51-47334 and JP-A No. 57-196231, those having an aromatic skeleton described in JP-A No. 59-5240, JP-A No. 59-5241 and JP-A No. 2-226149, and those having an amino group described in JP-A No. 1-165613.

In an embodiment, a mixture of such ester monomers is used.

Examples of monomers of the amides between aliphatic polyvalent amine compounds and unsaturated carboxylic acids include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bis-methacrylamide.

Preferable examples of other amide-containing monomers include those having a cyclohexylene structure described in JP-B No. 54-21726.

Urethane-containing addition-polymerizable compounds produced by addition reaction between isocyanates and hydroxyl groups are also preferable, and examples thereof include a vinyl urethane compound containing two or more polymerizable vinyl groups in one molecule which is prepared by adding a vinyl monomer containing a hydroxyl group shown in the formula below to a polyisocyanate compound having two or more isocyanate groups in one molecule as described in JP-B No. 48-41708.

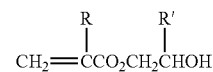

In the above formula, R and R' each independently represent H or $CH_3$.

Urethane acrylates described in JP-A No. 51-37193, JP-B No. 2-32293 and JP-B No. 2-16765 and urethane compounds having an ethylene oxide-based skeleton described in JP-B No. 58-49860, JP-B No. 56-17654, JP-B No. 62-39417 and JP-B No. 62-39418 are also preferable.

Addition-polymerizable compounds having an amino structure or sulfide structure in the molecule as described in JP-A No. 63-277653, JP-A No. 63-260909 and JP-A No. 1-105238 can be used to prepare heat-sensitive compositions excellent in curing speed.

As other examples, multifunctional acrylates and methacrylates such as polyester acrylates and epoxy acrylates obtained by reacting epoxy resin with (meth)acrylic acid, as described in JP-A No. 48-64183, JP-B No. 49-43191 and JP-B 52-30490, can be mentioned. Specific unsaturated compounds described in JP-B No. 46-43946, JP-B No. 1-40337 and JP-B No. 1-40336 and vinyl phosphonic acid-based compounds described in JP-A No. 2-25493 can also be mentioned. In some cases, a structure containing a perfluoroalkyl group described in JP-A No. 61-22048 is preferably used. Photosetting monomers and oligomers described in the Journal of Japanese Adhesive Society, vol. 20, No. 7, pp. 300-308 (1984) can also be used.

Details of the use of the polymerizable compounds—what structure is used, whether they are used singly or in combination, and the addition amount—can be arbitrarily determined in accordance with the performance and design of the final photosensitive material. For example, they are selected from the following viewpoints. In respect of photoresponse speed, their structure preferably has a high unsaturated group content per one molecule, and in many cases, they are preferably bifunctional or higher-functional. To increase the strength of an image portion i.e. the cured layer, they are preferably trifunctional or higher-functional. It is also effective to use a method of regulating both photosensitivity and strength by combined use of compounds (e.g. acrylic esters, methacrylic esters, styrene-containing compounds, and vinyl ether-containing compounds) having different functionalities and different polymerizable groups. Compounds having a higher molecular weight or compounds with higher hydrophobicity, though being excellent in photoresponse speed and layer strength, may be undesirable in some cases in respect of developing speed and precipitation in the developer.

A higher content of the polymerizable compound (B) is advantageous in respect of sensitivity. However, when the content is excessively high, there may be problems in undesirable phase separation, troubles in production process caused by the adhesiveness of the composition (e.g., defects in production process caused by transfer and adhesion of components in the photosensitive component), and separation from the developer when used in a planographic printing plate precursor. From these viewpoints, the content of the polymerizable compound (B) in the polymerizable composition according to the invention or in the recording layer of the planographic printing plate precursor is preferably in the range of 20 to 70% by weight, more preferably 25 to 50% by weight, based on the total solid content.

In an embodiment, only one polymerizable compound (B) is used. In another embodiment, two or more polymerizable compounds (B) are used.

The method of selecting and using the polymerizable compound is an important factor for compatibility and dispersibility with other components (e.g. a binder polymer, an initiator, a colorant etc.) in the recording layer used in the planographic printing plate precursor, and the compatibility may be improved by using e.g. a low-purity compound or a combination of two or more compounds.

[Dye (D) having Absorption Maximum in 300 to 1,200 nm]

It is possible to use the dye having its absorption maximum in 300 to 1,200 nm for the image recording layer of this invention. As such dye, it is preferable to use those functioning as a sensitizing dye and having an absorption maximum in 750 to 900 nm from the view point of improvement in image quality and the like.

Examples of the sensitizing dye include a spectroscopic sensitizing dye and the following dyes or pigments capable of interacting with the photopolymerization initiator by absorbing light form a light source.

Preferable examples of the spectroscopic dyes and dyes include polycyclic aromatic compounds (such as pyrene, perylene, and triphenylene), xanthenes (such as fluorescein, eosin, erythrosine, rhodamine B, and rose bengal), cyanines (such as thiacarbocyanine and oxacarbocyanine), merocyanines (such as merocyanine and carbomerocyanine), thiazines (such as thioene, methylene blue, and toluidine blue), acridines (such as acridine orange, chloroflavine, and acriflavine), phthalocyanines (such as phthalocyanine and metal phthalocyanines), porphyrins (such as tetraphenyl porphyrin, and central metal-substituted porphyrins), chlorophylls (such as chlorophyll, chlorophyllin, and central metal-substituted chlorophylls), metal complexes, anthraquinones (such as anthraquinone), squariums (such as squarium), and the like.

Examples of more preferable spectroscopic dyes and dyes include the styryl-based dyes described in JP-B No. 37-13034; the cation dyes described in JP-A No. 62-143044; the quinoxalinium salts described in JP-B No. 59-24147; the new methylene blue compound described in JP-A No. 64-33104; the anthraquinones described in JP-A No. 64-56767; the benzoxanthene dyes described in JP-A No. 2-1714; the acridines described in JP-A Nos. 2-226148 and 2-226149; the pyrylium salts described in JP-B No. 40-28499; the cyanines described in JP-B No. 46-42363; the benzofuran dyes described in JP-A No. 2-63053; the conjugate ketone dyes described in JP-A Nos. 2-85858 and 2-216154; the dyes described in JP-A No. 57-10605; the azo cinnamylidene derivatives described in JP-B No. 2-30321; the cyanine-based dyes described in JP-A No. 1-287105; the xanthene-based dyes described in JP-A Nos. 62-31844, 62-31848, and 62-143043; the aminostyrylketone described in JP-B No. 59-28325; the merocyaninedyes described in JP-B No. 61-9621; the dyes described in JP-A No. 2-179643; the merocyanine dyes described in JP-A No. 2-244050; the merocyanine dyes described in JP-B No. 59-28326; the merocyanine colorants described in JP-A No. 59-89803; the merocyanine dyes described in JP-A No. 8-129257; the benzopyran-based dyes described in JP-A No. 8-334897; and the like.

The sensitizer for use in the invention is more preferably a compound represented by the following Formula (12).

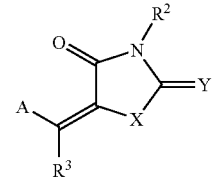

Formula (12)

In Formula (12), A represents an aromatic or hetero ring that may be substituted; X represents an oxygen or sulfur atom or —N($R^1$)—; and Y represents an oxygen or sulfur atom or —N($R^1$)—. $R^1$, $R^2$, $R^3$ each independently represent a hydrogen atom or a non-metal atom group; and A and $R^1$, $R^2$, or $R^3$ may bind to each other, forming an aliphatic or aromatic ring.

When $R^1$, $R^2$, or $R^3$ in Formula (12) is a monovalent non-metal atom group, it preferably represents a substituted or unsubstituted alkyl or aryl group. Hereinafter, preferable examples of the groups $R^1$, $R^2$, and $R^3$ will be described specifically. Preferable examples of the alkyl groups include straight-chain, branched, and cyclic alkyl groups having 1 to 20 carbon atoms; and specific examples thereon include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl groups. Among them, straight-chain alkyl groups having 1 to 12 carbon atoms, branched alkyl groups having 3 to 12 carbon atoms, and cyclic alkyl groups having 5 to 10 carbon atoms are more preferable.

The substituent group of the substituted alkyl group is a monovalent non-metal atom group other than hydrogen, and preferable examples thereof include halogen atoms (—F, —Br, —Cl, and —I), a hydroxyl group, alkoxy groups, aryloxy groups, a mercapto group, alkylthio groups, arylthio groups, alkyldithio groups, aryldithio groups, an amino group, N-alkylamino groups, N,N-dialkylamino groups, N-arylamino groups, N,N-diarylamino groups, N-alkyl-N-arylamino groups, acyloxy groups, carbamoyloxy groups, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acyloxy groups, acylthio groups, acylamino groups, N-alkylacylamino groups, N-arylacylamino groups, a ureido group, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N"-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, a formyl group, acyl groups, a carboxyl group, alkoxycarbonyl groups, aryloxycarbonyl groups, carbamoyl groups, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, a sulfo group (—SO$_3$H) and the conjugate base groups (hereinafter, referred to as sulfonato groups), alkoxysulfonyl groups, aryloxysulfonyl groups, sulfinamoyl groups, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, a sulfamoyl group, N-alkylsulfamoyl groups, N,N-dialkylsulfamoyl groups, N-arylsulfamoyl groups, N,N-diarylsulfamoyl groups, N-alkyl-N-arylsulfamoyl groups, a phosphono group (—PO$_3$H$_2$) and the conjugate base groups thereof (hereinafter, referred to as phosphonato groups), dialkyl phosphono groups (—PO$_3$(alkyl)$_2$), diarylphosphono groups (—PO$_3$(aryl)$_2$), alkylarylphosphono groups (—PO$_3$(alkyl)(aryl)), monoalkylphosphono groups (—PO$_3$H(alkyl)) and the conjugate base groups thereof (hereinafter, referred to as alkylphosphonato groups), monoaryl phosphono groups (—PO$_3$H(aryl)) and the conjugate base groups thereof (hereinafter, referred to as arylphosphonato groups), a phosphonoxy group (—OPO$_3$H$_2$) and the conjugate base groups thereof (hereinafter, referred to as phosphonatoxy groups), dialkylphosphonoxy groups (—OPO$_3$(alkyl)$_2$), diarylphosphonoxy groups (—OPO$_3$(aryl)$_2$), alkylarylphosphonoxy groups (—OPO$_3$(alkyl)(aryl)), monoalkylphosphonoxy groups (—OPO$_3$H(alkyl)) and the conjugate base groups thereof (hereinafter, referred to as alkylphosphonatoxy groups), monoarylphosphonoxy groups (—OPO$_3$H(aryl)) and the conjugate base groups thereof (hereinafter, referred to as arylphosphonatoxy groups), a cyano group, a nitro group, aryl groups, heteroaryl groups, alkenyl groups, alkynyl groups, and silyl groups. Specific examples of the alkyl groups in these substituent groups include the alkyl groups described above, and these groups may be substituted additionally.

Specific examples of the aryl groups include phenyl, biphenyl, naphthyl, toluyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, benzyoloxyphenyl, methylthiophenyl, phenylthiophenyl, methylaminophenyl, dimethylaminophenyl, acetylaminophenyl, carboxyphenyl, methoxycarbonylphenyl, ethoxyphenylcarbonyl, phenoxycarbonylphenyl, N-phenylcarbamoylphenyl, cyanophenyl, sulfophenyl, sulfonatophenyl, phosphonophenyl, and phosphonatophenyl groups, and the like.

The heteroaryl group is a group derived from a monocyclic or polycyclic aromatic ring containing at least one nitrogen, oxygen, sulfur atom, and examples of the heteroaryl rings in the particularly preferable heteroaryl group include thiophene, thiathrene, furan, pyran, isobenzofuran, chromane, xanthene, phenoxazine, pyrrole, pyrazole isothiazole, isoxazole, pyrazine, pyrimidine, pyridazine, indolizine, isoindolizine, indoyl, indazole, purine, quinolizine, isoquinoline, phthalazine, naphthyridine, quinazoline, cinnoline, pteridine, carbazole, carboline, phenanthrene, acridine, perimidine, phenanthroline, phthalazine, phenarsazine, phenoxazine, furazan, and the like, and these compounds may be fused with a benzene ring and also substituted.

Examples of the alkenyl groups include vinyl, 1-propenyl, 1-butenyl, cinnamyl, 2-chloro-1-ethenyl and other groups, and examples of the alkynyl groups include ethynyl, 1-propynyl, 1-butynyl, trimethylsilylethynyl and other groups. Examples of G$^1$ in the acyl group (G$^1$CO—) include hydrogen and the alkyl and aryl groups described above. More preferably among the substituent groups are halogen atoms (—F, —Br, —Cl, and —I), alkoxy groups, aryloxy groups, alkylthio groups, arylthio groups, N-alkylamino groups, N,N-dialkylamino groups, acyloxy groups, N-alkylcarbamoyloxy groups, N-arylcarbamoyloxy groups, acylamino groups, a formyl group, acyl groups, a carboxyl group, alkoxycarbonyl groups, aryloxycarbonyl groups, carbamoyl groups, N-alkylcarbamoyl groups, N,N-dialkylcarbamoyl groups, N-arylcarbamoyl groups, N-alkyl-N-arylcarbamoyl groups, a sulfo group, sulfonato groups, sulfamoyl groups, N-alkylsulfamoyl groups, N,N-dialkylsulfamoyl groups, N-arylsulfamoyl groups, N-alkyl-N-arylsulfamoyl groups, a phosphono group, a phosphonato group, dialkylphosphono groups, diarylphosphono groups, monoalkylphosphono groups, alkyl phosphonato groups, monoarylphosphono groups, aryl phosphonato groups, phosphonooxy groups, phosphonatoxy groups, aryl groups, alkenyl groups, and alkylidene groups (methylene group, etc.).

On the other hand, examples of the alkylene group in the substituted alkyl group include divalent organic residue from the alkyl groups having 1 to 20 carbon atoms described above from which any of the hydrogen atoms is eliminated, and preferable are straight-chain alkyl groups having 1 to 12 carbon atoms, branched alkyl groups having 3 to 12 carbon atoms, and cyclic alkylene group having 5 to 10 carbon atoms.

Specific examples of the substituted alkyl group preferable as R$^1$, R$^2$, or R$^3$ obtained in combination of the substituent group and an alkylene group include chloromethyl, bromomethyl, 2-chloroethyl, trifluoromethyl, methoxymethyl, methoxyethoxyethyl, allyloxymethyl, phenoxymethyl, methylthiomethyl, toluylthiomethyl, ethylaminoethyl, diethylaminopropyl, morpholinopropyl, acetyloxymethyl, benzoyloxymethyl, N-cyclohexylcarbamoyloxyethyl, N-pheylcarbamoyloxyethyl, acetylaminoethyl, N-methylbenzoylaminopropyl, 2-oxoethyl, 2-oxopropyl, carboxypropyl, methoxycarbonylethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfobutyl, sulfonatopropyl, sulfonatobutyl, sulfamoylbutyl, N-ethylsulfamoylmethyl, N,N-dipropylsulfamoylpropyl, N-toluylsulfamoylpropyl, N-methyl-N-(phosphonophenyl)sulfamoyloctyl, phosphonobutyl, phosphonatohexyl, diethylphosphonobutyl, diphenylphosphonopropyl, methylphosphonobutyl, methylphosphonatobutyl, toluylphosphonohexyl group, toluylphosphonatohexyl, phosphonooxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methyl allyl, 2-methylpropenylmethyl, 2-propynyl, 2-butynyl, 3-butynyl and other groups.

Specific examples of the aryl groups preferable as $R^1$, $R^2$, or $R^3$ include fused rings of one to three benzene rings and fused rings of a benzene ring and a five-membered unsaturated ring; specific examples thereof include phenyl, naphthyl, anthryl, phenanthryl, indenyl, acenaphthenyl, and fluorenyl groups, and more preferable among them are phenyl and naphthyl groups.

Specific examples of the substituted aryl groups preferable as $R^1$, $R^2$, or $R^3$ include aryl groups described above having a substituent group, a monovalent non-metal atom group, on the ring-forming carbon atom (other than hydrogen atom). Examples of the preferable substituent groups include alkyl and substituted alkyl groups and the groups described above favorable above as the substituent groups for the substituted alkyl group. Typical preferable examples of the substituted aryl groups include biphenyl, toluyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, toluylthiophenyl, ethylaminophenyl, diethylaminophenyl, morpholino phenyl, acetyloxyphenyl, benzoyloxyphenyl, N-cyclohexylcarbamoyloxyphenyl, N-pheylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-toluylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methyl phosphonatophenyl, toluylphosphonophenyl, toluylphosphonatophenyl, allylphenyl, 1-propenylmethylphenyl, 2-butenylphenyl, 2-methyl allylphenyl, 2-methylpropenylphenyl, 2-propynylphenyl, 2-butynylphenyl, 3-butynylphenyl, and other groups.

More preferable examples of $R^2$ and $R^3$ include substituted or unsubstituted alkyl groups. More preferable examples of $R^1$ include substituted or unsubstituted aryl groups. Although the mechanism is not yet understood, it seems that presence of such a substituent leads to increase in interaction between the electronically excited state generated by photoabsorption and the initiator compound and also to improvement in efficiency of generating the radical, acid or base of the initiator compound.

Hereinafter, A in Formula (12) will be described. A represents an aromatic or hetero ring that may be substituted; and specific examples thereof include those exemplified above for $R^1$, $R^2$, or $R^3$ in Formula (12).

Among these, preferable examples of A include alkoxy, thioalkyl, and amino group-containing aryl groups, and particularly preferable examples of A are amino group-containing aryl groups.

Hereinafter, Y in Formula (12) will be described. Y represents a non-metal atom group needed for forming a heterocyclic ring, together with A above and the neighboring carbon atoms. Such heterocyclic rings include five-, six- and seven-membered nitrogen- or sulfur-containing heterocyclic rings that may have one or more fused ring, preferably five- and six-membered heterocyclic rings.

Preferable examples of the nitrogen-containing heterocyclic rings include those known as the basic skeleton for merocyanine colorants described in L. G. Brooker et al., Journal of American Chemical Society (J. Am. Chem. Soc.) 73 (1951), pp. 5326-5358, and the reference literatures therein.

Specific examples thereof include thiazoles (such as thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and 4,5-di(2-furyl)thiazole), benzothiazoles (such as benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylene benzothiazole, 5-hydroxybenzothiazole, 6-hydroxybenzothiazole, 6-dimethylaminobenzothiazole, and 5-ethoxycarbonylbenzothiazole), naphthothiazoles (such as naphtho[1,2]thiazole, naphtho[2,1]thiazole, 5-methoxynaphtho[2, 1 ]thiazole, 5-ethoxynaphtho[2,1]thiazole, 8-methoxynaphtho[1,2]thiazole, and 7-ethoxynaphtho[1,2]thiazole), thianaphtheno-7',6',4,5-thiazoles (such as 4'-methoxythianaphtheno-7',6',4,5-thiazole), oxazoles (such as 4-methyloxazole, 5-methyloxazole, 4-phenyloxazole, 4,5-diphenyloxazole, 4-ethyloxazole, 4,5-dimethyloxazole, and 5-phenyloxazole), benzoxazoles (benzoxazole, 5-chlorobenzoxazole, 5-methylbenzoxazole, 5-phenylbenzoxazole, 6-methyl benzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphthoxazoles (such as naphtho[1,2]oxazole and naphtho[2,1]oxazole), selenazoles (such as 4-methylselenazole and 4-phenylselenazole), benzoselenazoles (such as benzoselenazole, 5-chlorobenzoselenazole, 5-methoxybenzoselenazole, 5-hydroxybenzoselenazole, and tetrahydrobenzoselenazole), naphthoselenazoles (such as naphtho[1,2]selenazole and naphtho[2,1]selenazole), thiazolines (such as thiazoline, 4-methylthiazoline, 4,5-dimethylthiazoline, 4-phenylthiazoline, 4,5-di(2-furyl)thiazoline, 4,5-diphenylthiazoline, and 4,5-di(p-methoxyphenyl)thiazoline), 2-quinolines (such as quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline), 4-quinolines (such as quinoline, 6-methoxyquinoline, 7-methylquinoline, and 8-methylquinoline), 1-isoquinolines (such as isoquinoline and 3,4-dihydroisoquinoline), 3-isoquinolines (such as isoquinoline), benzimidazoles (such as 1,3-dimethylbenzimidazole, 1,3-diethylbenzimidazole, and 1-ethyl-3-phenylbenzimidazole), 3,3-dialkylindolenines (such as 3,3-dimethylindolenine, 3,3,5-trimethylindolenine, and 3,3,7-trimethylindolenine), 2-pyridines (such as pyridine and 5-methylpyridine), and 4-pyridines (such as pyridine). In addition, the substituent groups on these rings may bind to each other, forming a ring.

Examples of the sulfur-containing heterocyclic rings include the dithiol partial structures in the colorants described in JP-A No. 3-296759.

Specific examples thereof include benzodithiols (such as benzodithiol, 5-t-butylbenzodithiol, and 5-methylbenzodithiol), naphthodithiols (such as naphtho[1,2]dithiol and naphtho[2,1]dithiol), and dithiols (such as 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiol, 4,5-dicyanodithiol, 4-methoxycarbonylmethyldithiol, and 4-carboxymethyldithiol).

Among the nitrogen- or sulfur-containing heterocyclic rings formed by Y, A and the neighboring carbon atoms in Formula (12) described above, the colorants having a structure represented by the partial structural Formula of the following Formula (13) are particularly preferable, because they give a photosensitive composition higher in sensitization potential and considerably superior in storage stability.

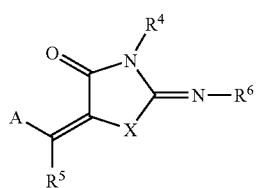

Formula (13)

In Formula (13), A represents an aromatic or hetero ring that may be substituted; and X represents an oxygen or sulfur atom or —N($R^1$). $R^1$, $R^4$, $R^5$, $R^6$ each independently represent a hydrogen atom or a monovalent non-metal atom group; and A and $R^1$, $R^4$, $R^5$, or $R^6$ may bind to each other, forming an aliphatic or aromatic ring.

In Formula (13), A and $R^1$ are the same as those in Formula (12); $R^4$, $R^2$ in Formula (C); $R^5$, $R^3$ in Formula (12); and $R^6$, $R^1$ in Formula (12).

The compound represented by Formula (12) is more preferably a compound represented by the following Formula (14).

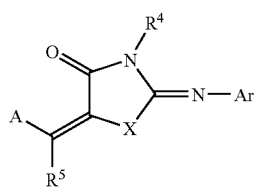

Formula (14)

In Formula (14), A represents an aromatic or hetero ring that may be substituted; and X represents an oxygen or sulfur atom or —N($R^1$)—. $R^1$, $R^4$, and $R^5$ each independently represent a hydrogen atom or a monovalent non-metal atom group; and A and $R^1$, $R^4$, or $R^5$ may bind to each other, forming an aliphatic or aromatic ring. Ar represents a substituted aromatic or hetero ring. However, the total Hammett value of the substituents on the Ar skeleton is preferably more than 0. The total Hammett value of more than 0 means that the ring has one substituent group and the substituent group has a Hammett value of more than 0, or that the ring has multiple substituent groups and the total Hammett value of these substituent groups is more than 0.

In Formula (14), A and $R^1$ are the same as those in Formula (12); $R^4$, $R^2$ in Formula (12); and $R^5$, $R^3$ in Formula (12). Ar represents a substituted aromatic or hetero ring, and specific examples of thereof include those for the substituted aromatic ring or heteroring described for A in Formula (12). However, the substituent group that may be introduced on Ar in Formula (14) should have a total Hammett value of 0 or more, and examples of such substituent groups include halogen atoms, trifluoromethyl, carbonyl, ester, nitro, cyano, sulfoxide, amide, and carboxyl groups, and the like. The Hammett values of these substituent groups are shown below: trifluoromethyl group (—$CF_3$, m: 0.43, p: 0.54), carbonyl group (e.g., —COH, m: 0.36, p: 0.43), ester group (—$COOCH_3$, m: 0.37, p: 0.45), halogen atom (e.g., Cl, m: 0.37, p: 0.23), cyano group (—CN, m: 0.56, p: 0.66), sulfoxide group (e.g., —$SOCH_3$, m: 0.52, p: 0.45), amido group (e.g., —NH-$COCH_3$, m: 0.21, p: 0.00), carboxyl group (—COOH, m: 0.37, p: 0.45), and the like. Each parenthesis above includes the site of the substituent group introduced on the aryl skeleton and its Hammett value, and, for example, (m: 0.50) means that the substituent group introduced at the meta position has a Hammett value of 0.50. Preferable examples of Ar among them include substituted phenyl groups, and preferable substituents on the Ar skeleton include ester and cyano groups. The substituent is particularly preferably introduced at the ortho site on the Ar skeleton.

Hereinafter, preferable specific examples of the sensitizers represented by Formula (12) (exemplification compounds D1 to D57) will be shown, however the invention is not limited thereto. Among them, compounds corresponding to those represented by Formula (13) are exemplification compounds D2, D6, D10, D18, D21, D28, D31, D33, D35, D38, D41, and D45 to D57.

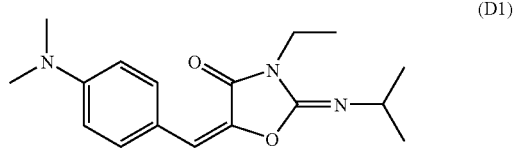

(D1)

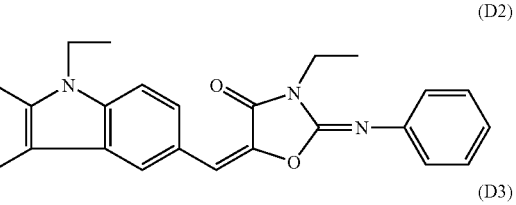

(D2)

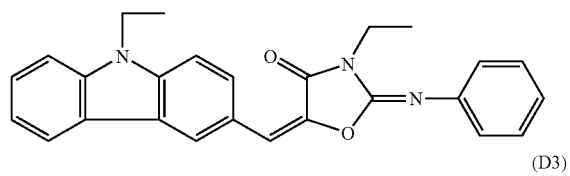

(D3)

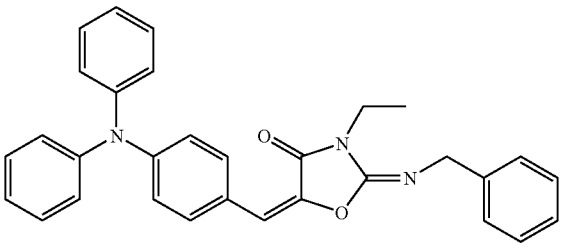

(D4)

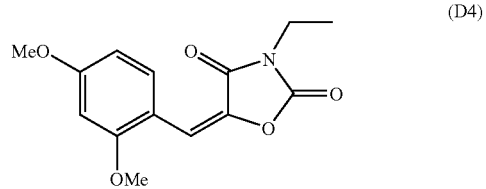

(D5)

-continued
(D6)
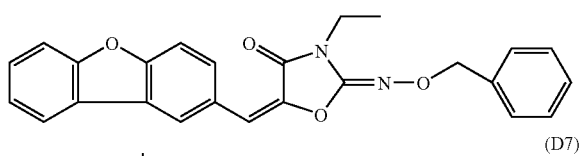
(D7)
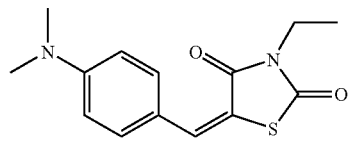
(D8)
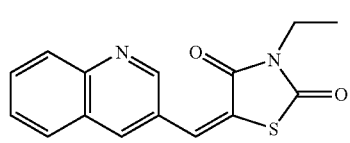
(D9)
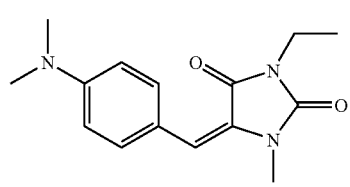
(D10)
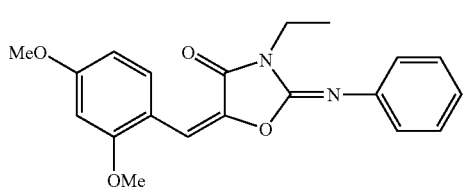
(D11)
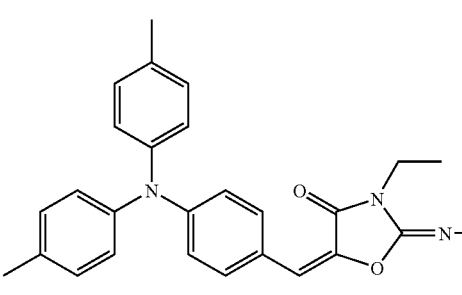
(D12)
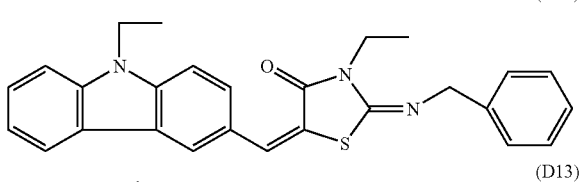
(D13)
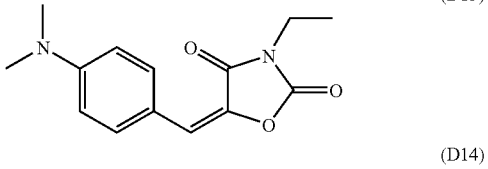
(D14)
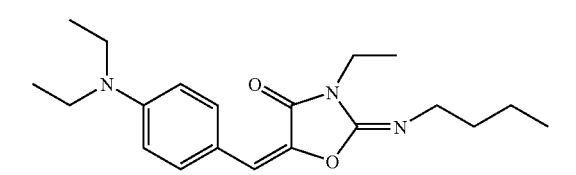
-continued
(D15)
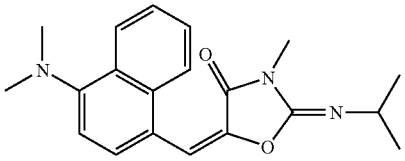
(D16)
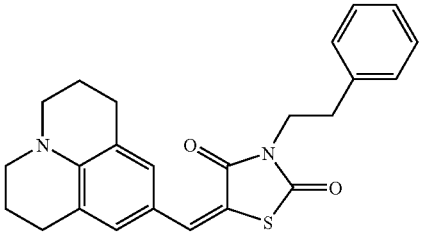
(D17)
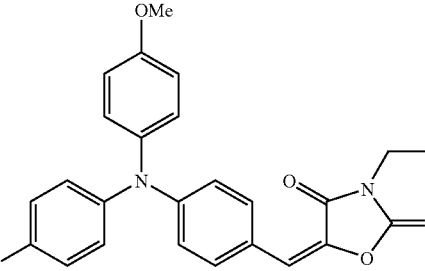
(D11)
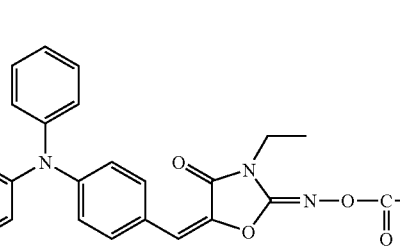
(D19)
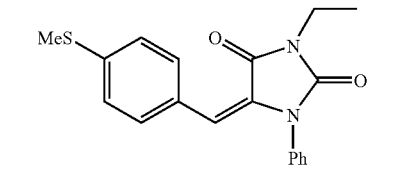
(D20)
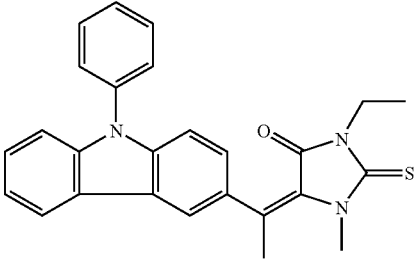
(D21)
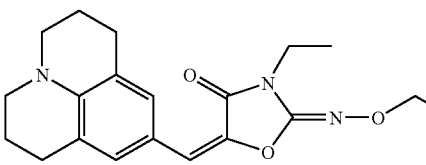

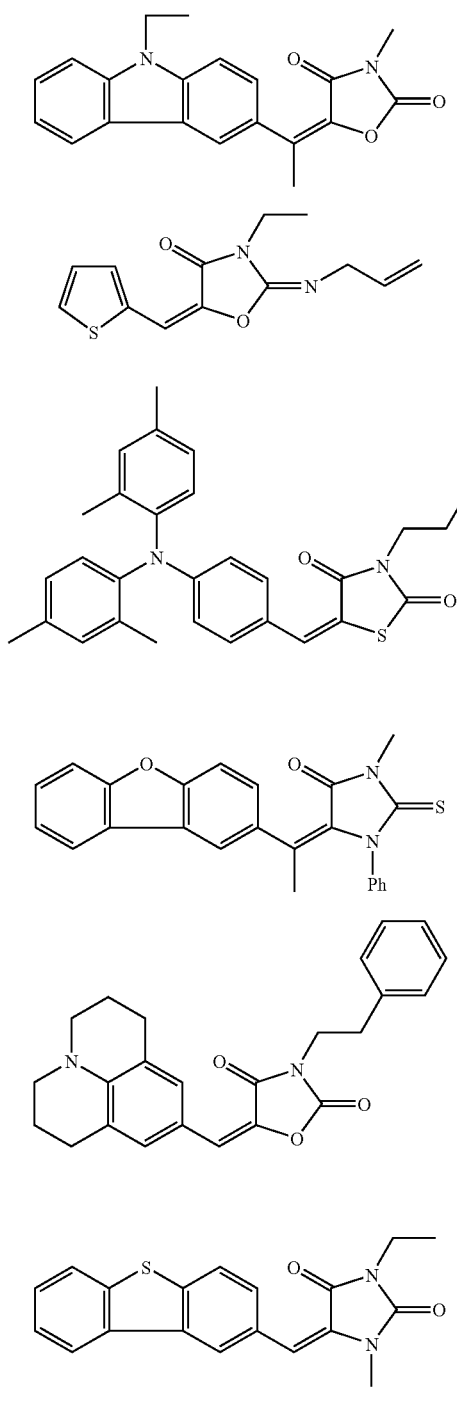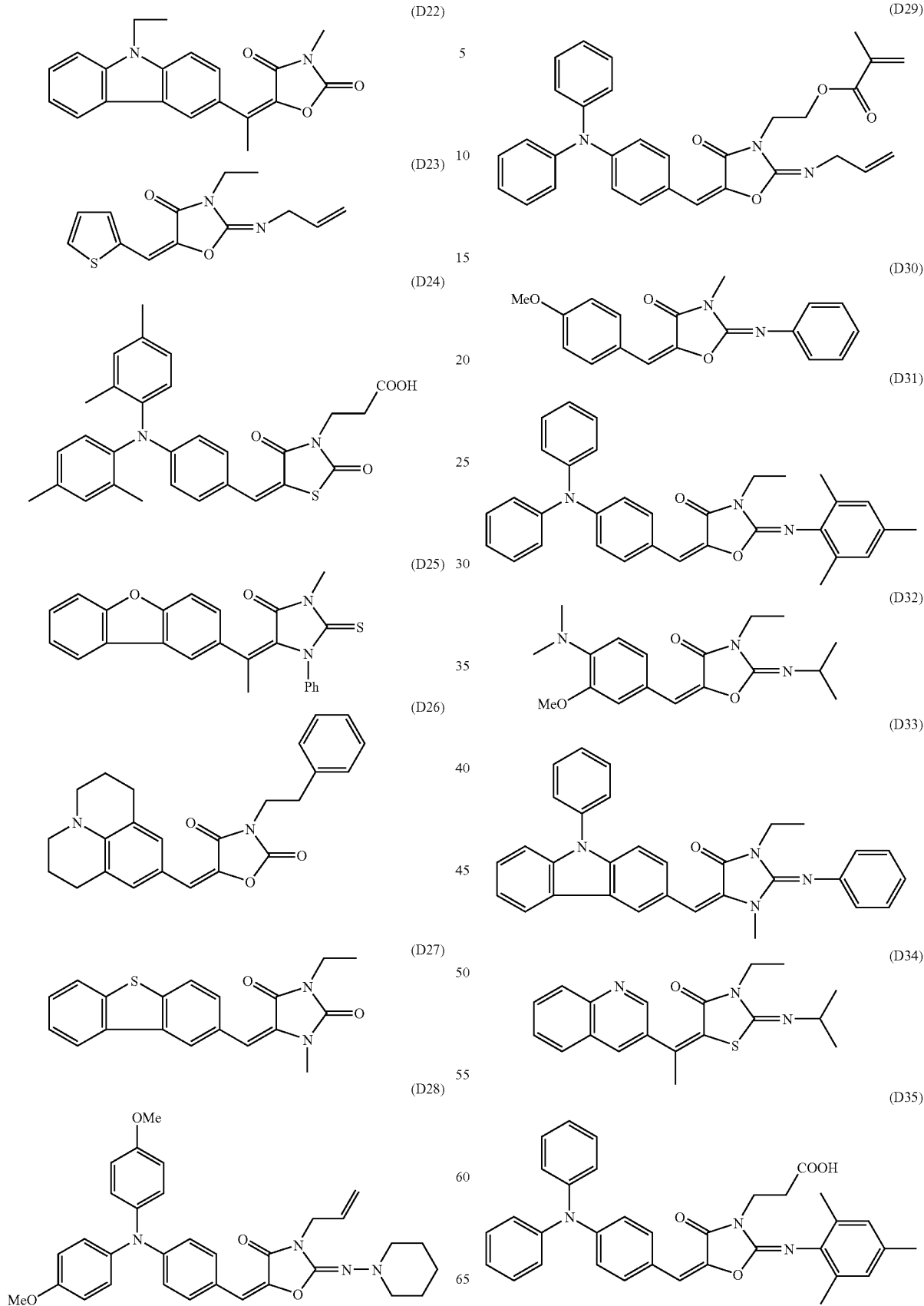

-continued
(D36)
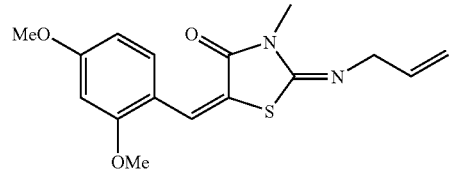
(D37)
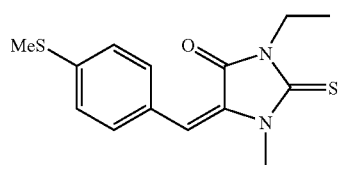
(D38)
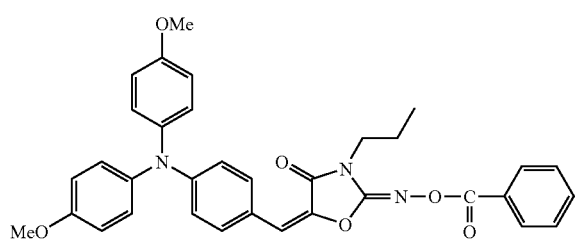
(D39)
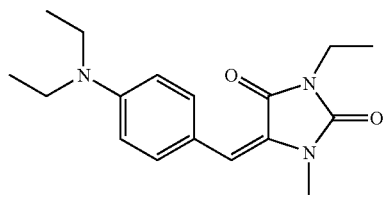
(D40)
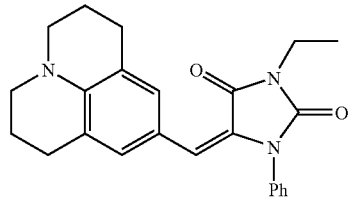
(D41)
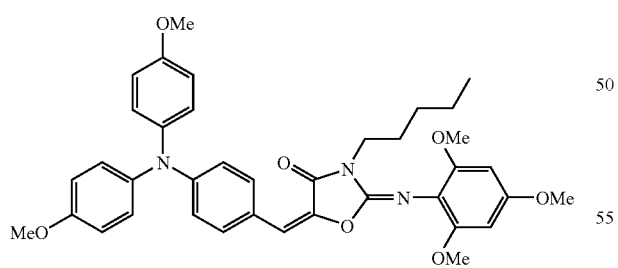
(D42)
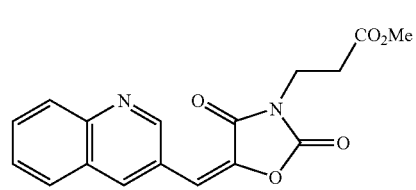
-continued
(D43)
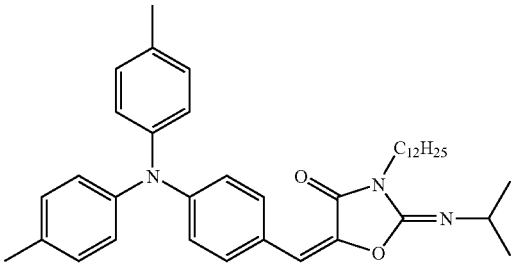
(D44)
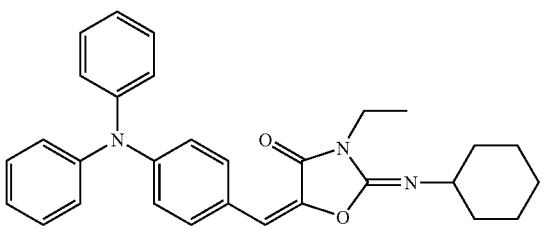
(D45)
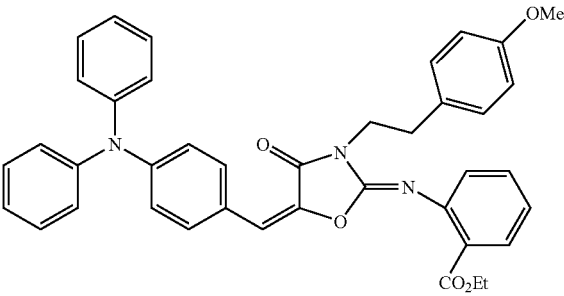
(D46)
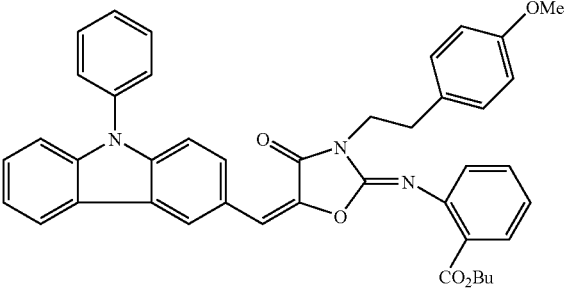
(D47)
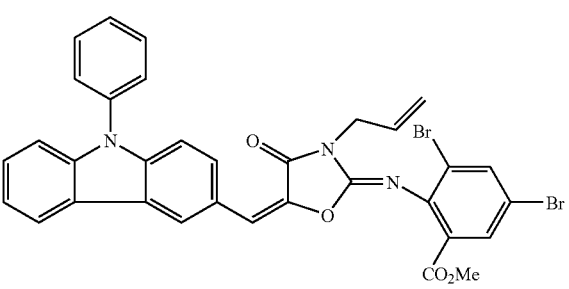

-continued (D48)
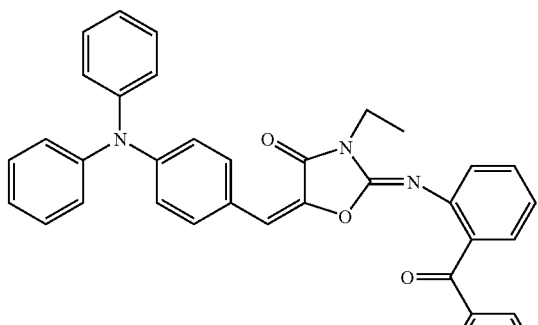

(D49)
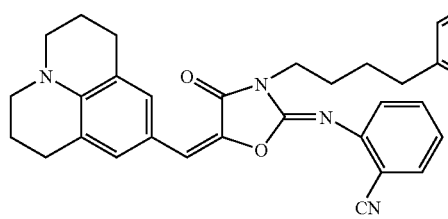

(D50)

(D51)
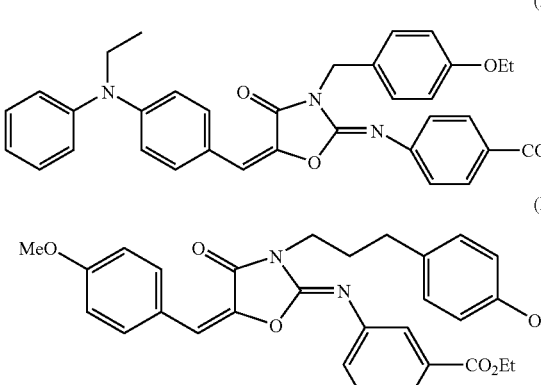

(D52)

(D53)
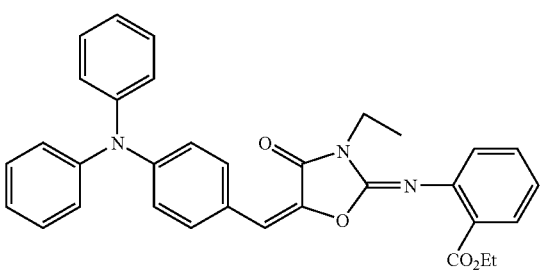

-continued (D54)
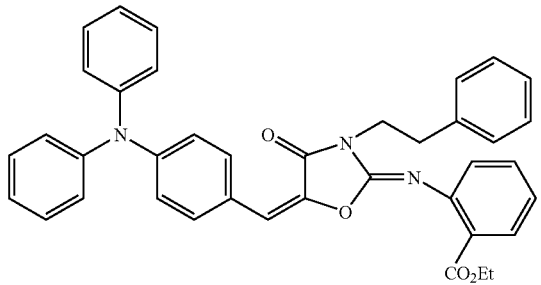

(D55)

(D56)
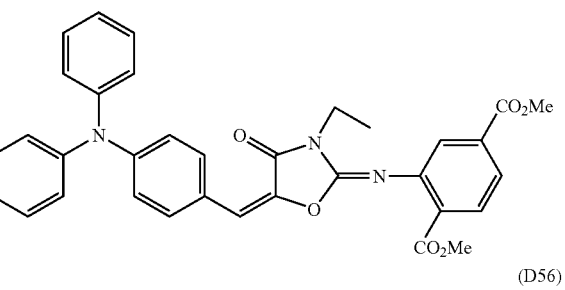

(D57)
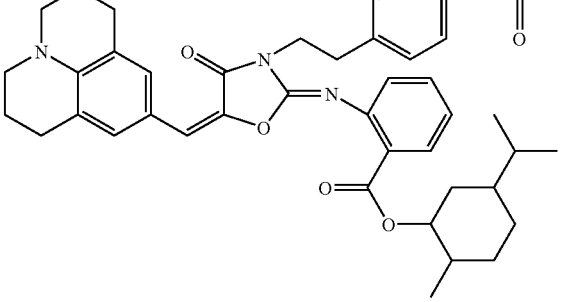

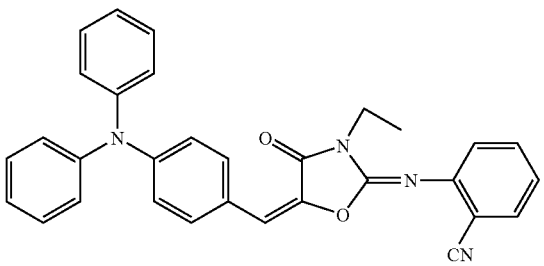

A method of synthesizing the compound represented by the general formula (12) will be described.

The compound represented by the general formula (12) is ordinarily obtainable by a condensation reaction of an acidic core having an active methylene group and a substituted or non-substituted aromatic ring or a hetero ring, and it is possible to synthesize the compound by referring to JP-B-59-28329. For example, as shown in the following reaction formula (1), a synthesizing method using the condensation reaction of an acidic core compound and a basic core material having an aldehyde group or a carbonyl group on a hetero ring may be employed. The condensation reaction may be conducted in the presence of a base when so required. As the base, generally used bases such as amine, pyridines (trialkylamine, dimethylaminopyridine, diazabicycloundecen (DBU), etc.), metal amides (lithiumisopropylamide, etc.), metal alkoxides (sodium methoxide, potassium-t-butoxide, etc.), and metal hydrogenates (hydrogenated sodium, hydrogenated potassium, etc.) may be used without limitation.

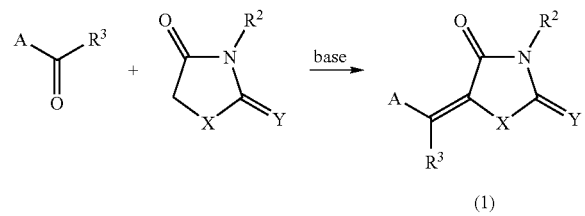

(1)

Also, as another preferred synthesizing method, a method according to the following reaction formula (2) may be employed. An acidic core compound wherein Y is a sulfur atom is used as a start material as the acidic core compound in the reaction formula (1) to perform the process steps until the synthesis of a dye precursor by the condensation reaction of the basic core material having an aldehyde group or a carbonyl group on a hetero ring, and then a metal salt capable of forming a metal sulfide by chemically interacting with a sulfur atom and water or a primary amine compound (R—NH$_2$: R represents a monovalent non-metallic atomic group) are/is liberated on the dye precursor.

Among the above methods, the reaction represented by the reaction formula (2) is high in yield of reactions and particularly preferable in view of synthesis efficiency. In the case of synthesizing the compound represented by the general formula (13), the reaction represented by the reaction formula (2) is useful.

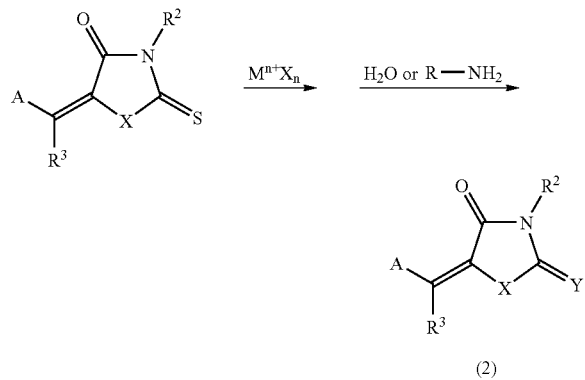

(2)

In the reaction formula (2), $M^{n+}X^n$ represents a metal salt capable of forming a metal sulfide by chemically interacting with a sulfur atom of a thiocarbonyl group. Specific examples of the compound include AgBr, AgI, AgF, AgO, AgCl, Ag$_2$O, Ag(NO$_3$), AgSO$_4$, AgNO$_2$, AG$_2$CrO$_4$, Ag$_3$PO$_4$, HG$_2$(NO$_3$)$_2$, HgBr$_2$, Hg$_2$Br$_2$, HgO, HgI$_2$, Hg(NO$_3$)$_2$, Hg(NO$_2$)$_2$, HgBr$_2$, HgSO$_4$, Hg$_2$I$_2$, Hg$_2$SO$_4$, Hg(CH$_3$CO$_2$)$_2$, AuBr, AuBr$_3$, AuI, AuI$_3$, AuF$_3$, Au$_2$O$_3$, AuCl, AuCl$_3$, CuCl, CuI, CuI$_2$, CuF$_2$, CuO, CuO$_2$, Cu(NO$_3$)$_2$, CuSO$_4$, Cu$_3$(PO$_4$)$_2$ wherein M is Al, Au, Ag, Hg, Cu, Zn, Fe, Cd, Cr, Co, Ce, Bi, Mn, Mo, Ga, Ni, Pd, Pt, Ru, Rh, Sc, Sb, Sr, Mg, Ti, and the like and X is F, Cl, Br, I, No$_3$, SO$_4$, NO$_2$, PO$_4$, CH$_3$CO$_2$, and the like. Among the above, in view of the capability of easily interacting with the sulfur atom, the silver salt is used as a most preferred metal salt.

The sensitizer represented by Formula (12) for use in the invention may be modified chemically in various ways, for further improvement in properties of the image recording layer. For example, it is possible to increase the strength of the exposed film and prevent undesirable precipitation of the colorant in the photoexposed film, for example, by allowing the sensitizer to bind to an addition polymerizable compound structure (such as acryloyl or methacryloyl group) by covalent, ionic, or hydrogen bonding.

It is also possible to increase the photosensitivity drastically when the concentration of the initiator system is low, by allowing the sensitizer to bind with the polymerization-initiator partial structure capable of generating radicals described above (a reductive cleavage site such as alkyl halide, onium or peroxide, biimidazole, or an oxidative cleavage site such as borate, amine, trimethylsilylmethyl, carboxymethyl, carbonyl, or imine).

In the case of using the image recording material of the present invention as a planographic printing plate precursor having a negative image recording layer, which is a preferred usage mode, it is effective to introduce a hydrophilic cite (a carboxyl group and ester thereof, a sulfonic acid and ester thereof, an acidic group such as an ethylene oxide group or a polar group) for the purpose of improving a treatment adequacy of the image recording layer to an alkali-based or water-based developing liquid.

In particular, ester-based hydrophilic groups are superior in compatibility, because they are present in a relatively hydrophobic structure in the image recording layer and generate an acid group by hydrolysis in the developing solution increasing their hydrophilicity.

Other suitable substituent groups may also be introduced, for example, for improvement in compatibility in the image recording layer and prevention of crystal precipitation. For example, introduction of an unsaturated bond such as aryl or allyl may be considerably effective in improving compatibility in some photosensitization systems, while introduction of a branched alkyl structure, i.e., increase in the steric hindrance between colorant π planes, prevents crystal precipitation significantly. Alternatively, introduction of a phosphonic acid, epoxy, trialkoxysilyl, or other group improves the adhesiveness to inorganic materials such as metals and metal oxides. Other methods, for example polymerization of sensitizer, may be used according to application.

The sensitizer for use in the invention is preferably at least one of the sensitizers represented by Formula (12), and details of the method of using the sensitizer represented by Formula (12), for example structure of the sensitizer (modification), single or combined use of two or more, and addition amount, are suitably decided according to the preferable characteristics of the final photosensitive material. For example, combined use of two or more kinds of sensitizers leads to improvement in compatibility to the image recording layer.

Both the photosensitivity and the molar extinction coefficient at the emission wavelength of the light source used are the important factors in selecting the sensitizer. Use of a sensitizer having a higher molar extinction coefficient is economical, because it leads to reduction in the amount thereof added, and also advantageous from the point of physical properties of the image recording layer. In the invention, other commonly used sensitizers may be used in addition to the sensitizer represented by Formula (12) in a range that does not impair the advantageous effects of the invention.

Since the sensitivity and resolution of the image recording layer and the physical properties of the film of the recording layer greatly influences on the light absorption degree in the light source wavelength, an additional amount of the sensitizing dye is appropriately selected in view of such influences.

For example, the sensitivity is reduced in a region where the light absorption degree is 0.1 or less. Also, the resolution is reduced due to halation. However, for the purpose of curing a thick film having a thickness of 5 μm or more, the low light absorption degree contributes to improvement in curing degree. Also, in a high light absorption region where a light absorption degree is 3 or more, almost all the light is absorbed on the image recording layer surface in such high light absorption region, thereby inhibiting curing in the internal part. In the case of using the image recording material of the present invention as a planographic printing plate precursor, there is a fear that a film strength and a substrate adhesion of the planographic printing plate precursor become insufficient.

For example, when the image recording materials of the invention is used for a planographic printing plate precursor with a relatively thin image recording layer, the sensitizer is preferably added in such an amount that the absorbance of the image recording layer becomes in the range of 0.1 to 1.5, preferably in the range of 0.25 to 1. Since the absorbance is determined only by the addition amount of the sensitizer and the thickness of the image recording layer, it is possible to obtain a particular absorbance by adjusting these conditions. The absorbance of image recording layer can be determined by an ordinary method. Examples of the measuring methods include a method of forming an image recording layer, having an appropriately determined thickness for the range of the coating amount after drying preferable for the planographic printing plate, on a transparent or white support and measuring the absorbance thereof with a transmission optical densitometer, a method of forming an image recording layer on a reflective support such as of aluminum and determining the reflection density, and the like.

When the image recording layer of the invention is used for a recording layer in the planographic printing plate precursor, the amount of the sensitizer added is normally in the range of 0.05 to 30 parts by mass, preferably 0.1 to 20 parts by mass, more preferably 0.2 to 10 parts by mass with respect to 100 parts by mass of the total solid content in the image recording layer.

(Infrared Ray Absorbing Agent)

In the present invention, in the case of performing exposure using a laser emitting an infrared ray of 760 to 1,200 nm as a light source, an infrared ray absorbing agent having an absorption maximum in the wavelength band is typically used as the sensitizing dye. The infrared ray absorbing agent has a function of converting the absorbed infrared ray into heat. The radical generating agent (polymerization initiator) is heat-decomposed with the generated heat to generate a radical. The infrared ray absorbing agent to be used in the present invention is a dye or a pigment having an absorption maximum in wavelength of 750 to 850 nm.

Such a dye can be a commercially available dye, or a known dye disclosed in "Dye Handbook" edited by The Society of Synthetic Organic Chemistry, Japan and published in 1970. Specific examples thereof include an azo dye, a metal complex azo dye, a pyrazolone azo dye, a naphthoquinone dye, an anthraquinone dye, a phthalocyanine dye, a carbonium dye, a quinonimine dye, a methine dye, a cyanine dye, a squalelium dye, a pyrylium salt, and a metal thiolate complex.

The dye is preferably a cyanine dye disclosed in JP-A No. 58-125246, 59-84356, 59-202829, or 60-78787, a methine dye disclosed in JP-A No. 58-173696, 58-181690, or 58-194595, a naphthoquinone dye disclosed in No. 58-112793, 58-224793, 59-48187, 59-73996, 60-52940, or 60-63744, a squalelium dye disclosed in JP-A No. 58-112792, or a cyanine dye disclosed in U. K. Patent No. 434,875.

The near infrared ray-absorbing sensitizers described in U.S. Pat. No. 5,156,938 are also preferably used. Also preferably used are the substituted aryl benzo(thio)pyrylium salts described in U.S. Pat. No. 3,881,924; the trimethine thiapyrylium salts described in JP-A No. 57-142645 (U.S. Pat. No. 4,327,169); the pyrylium type compounds described in JP-A Nos. 58-181051, 58-220143, 59-41363, 59-84248, 59-84249, 59-146063, and 59-146061; the cyanine dyes described in JP-A No. 59-216146; the pentamethine thiopyrylium salts described in U.S. Pat. No. 4,283,475; and the pyrylium compounds described in JP-B Nos. 5-13514 and 5-19702. Other preferable examples of dyes include the near infrared ray-absorbing dyes of formulae (I) and (II) described in U.S. Pat. No. 4,756,993.

Other preferable examples of the infrared absorbing dye in the present invention include specific indolenine cyanine dyes described in Japanese Patent Application Nos. 2001-6326 and 2001-237840, as shown below.

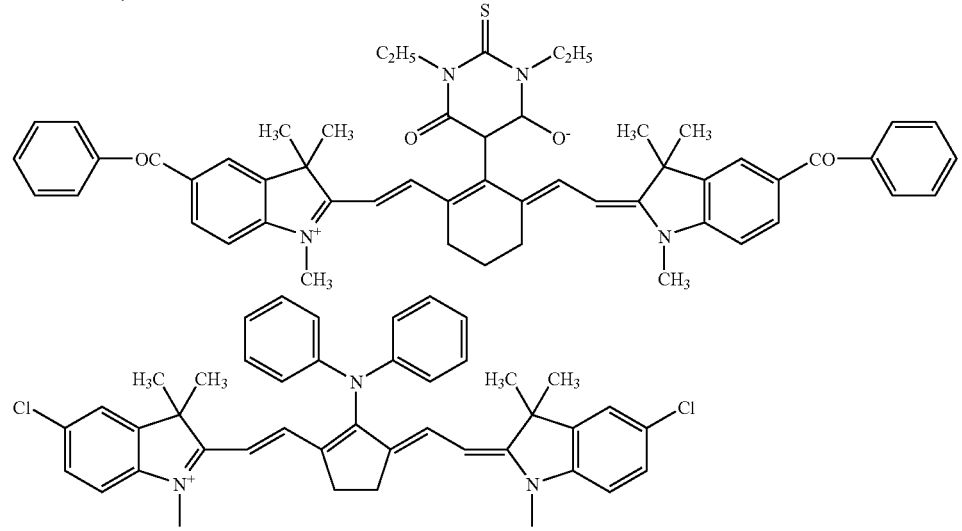

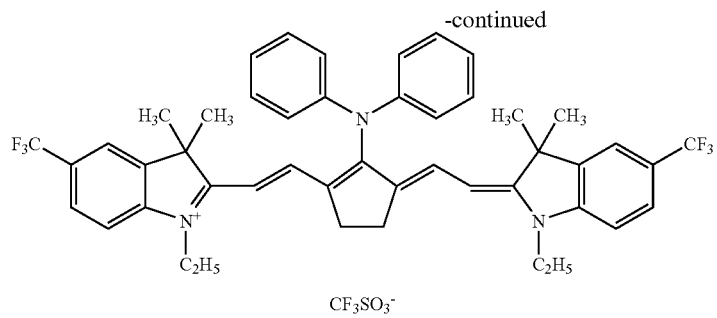

CF$_3$SO$_3^-$

Preferred dyes among the above include the cyanine dye, the squarylium dye, the pyrylium salt, the nickel thiolate complex, and the indolenine cyanine dye. The cyanine dye and the indolenine cyanine dye are preferred, and particularly preferred examples include dyes represented by the following general formulas (a) to (e) from the view point of sensitivity. Particularly, the cyanine dye represented by the general formula (a) is most preferred since it imparts a high polymerization activity when used in the recording layer in the present invention and is excellent in stability and economic efficiency.

Formula (a)

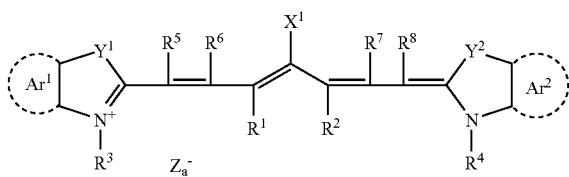

In the formula (a), $X^1$ represents a hydrogen atom, halogen atom, —NAr$^x{}_2$, $X^2$-$L^1$ or the group shown below. Ar$^x$ represents a $C_6$ to $C_{14}$ aromatic hydrocarbon group which may have one or more substituents selected from the group consisting of halogen atoms, alkyl groups, allyl groups, alkenyl groups, alkynyl groups, cyano groups, carboxy groups, nitro groups, amide groups, ester groups, alkoxy groups, amino groups and heterocyclic groups, and these substituents may themselves be substituted by such a substituent as those described above. $X^2$ represents an oxygen atom, a sulfur atom or —N(R$^x$)— wherein R$^x$ represents a hydrogen atom or a $C_1$ to $C_{10}$ hydrocarbon group. $L^1$ represents a $C_1$ to $C_{12}$ hydrocarbon group, an aromatic ring having a heteroatom, or a $C_1$ to $C_{12}$ hydrocarbon group containing a heteroatom. The term "heteroatom" used herein refers to an atom selected from N, S, O, a halogen atom or Se.

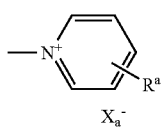

In the above formula, Xa$^-$ is defined in the same manner as Za$^-$ which will be described later in this specification, and Ra represents a substitution group selected from a hydrogen atom, alkyl group, aryl group, a substituted or non-substituted amino group, and halogen atom.

Each of R$^1$ and R$^2$ independently represents a hydrocarbon group having 1 to 12 carbon atoms. In terms of storage stability of the image recording layer coating liquid, each of R$^1$ and R$^2$ may preferably be a hydrocarbon group having 2 or more carbon atoms and may particularly preferably be bonded to each other to form a 5 membered ring or a 6 membered ring.

Ar$^1$ and Ar$^2$ may be the same or different, and each independently represent an aromatic hydrocarbon group which may have a substituent. The aromatic hydrocarbon group is preferably a benzene ring or a naphthalene ring. The substituent is preferably a hydrocarbon group containing 12 or less carbon atoms, a halogen atom or an alkoxy group containing 12 or less carbon atoms. $Y^1$ and $Y^2$ may be the same or different, and each independently represent a sulfur atom or a dialkyl methylene group containing 12 or less carbon atoms. R$^3$ and R$^4$ may be the same or different, and each independently represent a hydrocarbon group containing 20 or less carbon atoms which may have a substituent. The substituent is preferably an alkoxy group containing 12 or less carbon atoms, a carboxyl group or a sulfo group. R$^5$, R$^6$, R$^7$ and R$^8$ may be the same or different, and each independently represent a hydrogen atom or a hydrocarbon group containing 12 or less carbon atoms. Each of R$^5$, R$^6$, R$^7$ and R$^8$ is preferably a hydrogen atom because the starting material is easily available. Za$^-$ represents a counter anion. However, when the cyanine colorant represented by the formula (a) has an anionic substituent in its structure and does not necessitate neutralization of the charge, Za$^-$ is not necessary. Because of the storage stability of the image recording layer coating liquid, Za$^-$ is preferably a halogen ion, a perchlorate ion, a tetrafluoroborate ion, a hexafluorophosphate ion or a sulfonate ion, particularly preferably a perchlorate ion, a hexafluorophosphate ion or an aryl sulfonate ion.

Specific examples of the cyanine colorants represented by the formula (a), which can be used preferably in the invention, include not only those illustrated below, but also those described in paragraph numbers (0017) to (0019) in JP-A No. 2001-133969, paragraph numbers (0012) to (0038) in JP-A No. 2002-40638, and paragraph numbers (0012) to (0023) in JP-A No. 2002-23360.

-continued
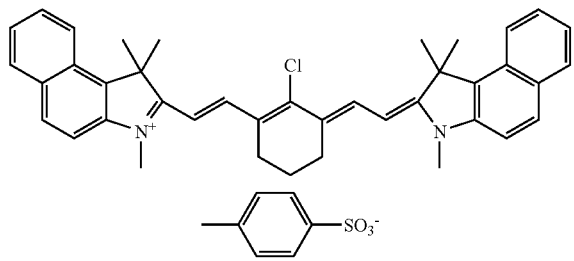
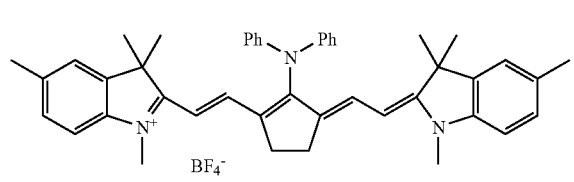
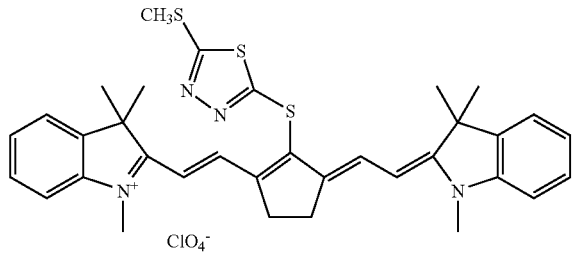
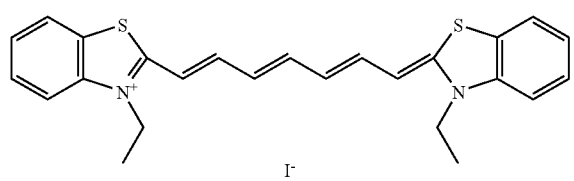
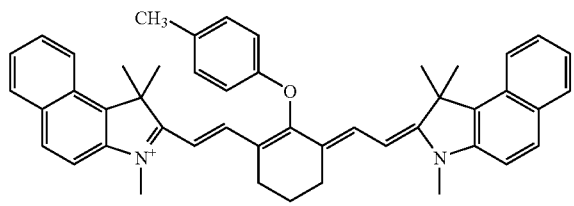
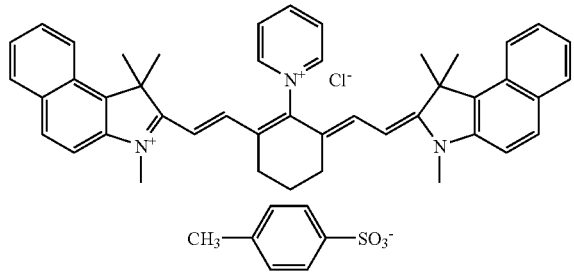
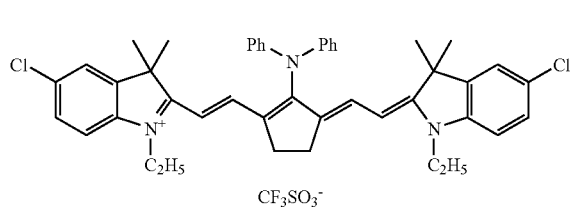
-continued
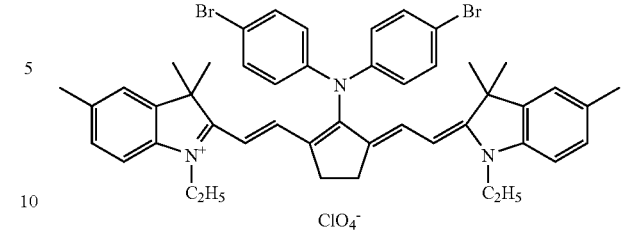
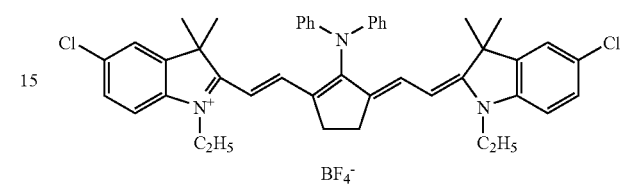
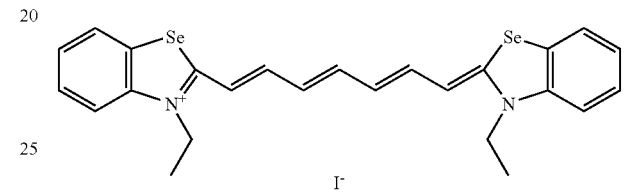
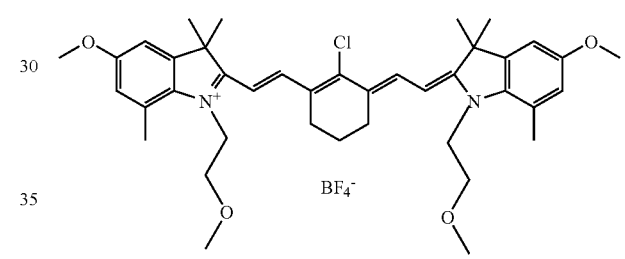
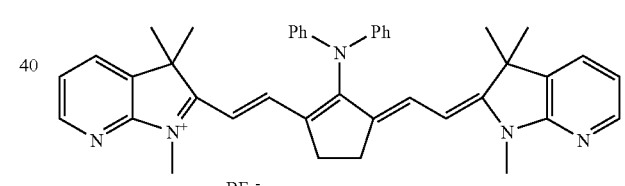
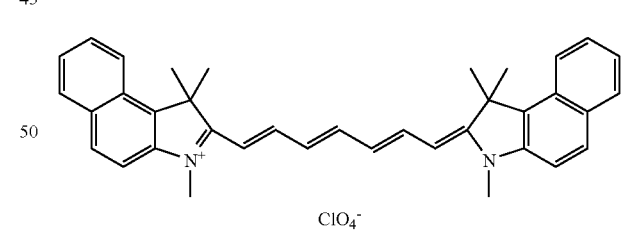
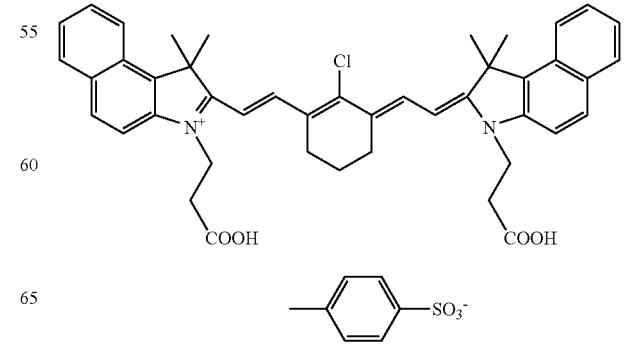

-continued

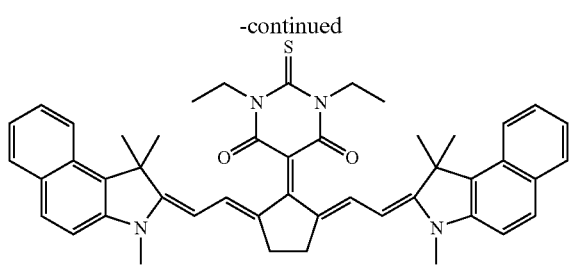

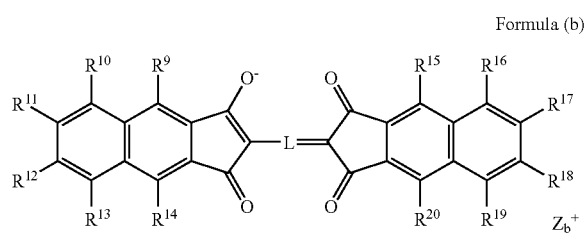

Formula (b)

In the formula (b), L represents a methine chain containing 7 or more conjugated carbon atoms, and the methine chain may have a substituent, and the substituents may be bound to each other to form a ring structure. $Z_b^+$ represents a counter cation. The counter cation is preferably ammonium, iodonium, sulfonium, phosphonium, pyridinium or an alkali metal cation ($Ni^+$, $K^+$, $Li^+$). $R^9$ to $R^{14}$ and $R^{15}$ to $R^{20}$ each independently represent a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group or an amino group, or a substituent composed of a combination of two or three such substituents which may be bound to each other to form a ring structure. Among the compounds of the formula (b), those having a methine chain containing 7 conjugated carbon atoms as L, and those in which each of $R^9$ to $R^{14}$ and $R^{15}$ to $R^{20}$ represents a hydrogen atom, are preferable from the viewpoint of easy availability and effects.

Examples of the dyes represented by the formula (b), which can be used preferably in the invention, include those illustrated below:

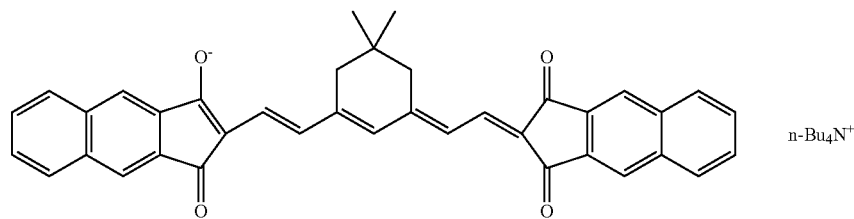

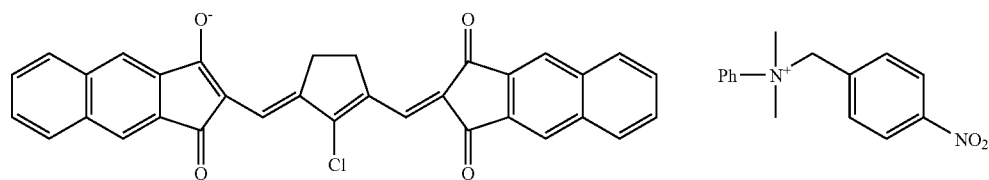

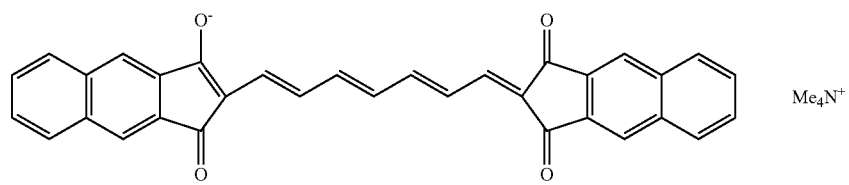

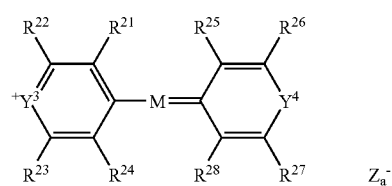

Formula (c)

In the formula (c), $Y^3$ and $Y^4$ each independently represent an oxygen atom, a sulfur atom, a selenium atom or a tellurium atom; M represents a methine chain containing 5 or more conjugated carbon atoms; $R^{21}$ to $R^{24}$ and $R^{25}$ to $R^{28}$ may be the same as or different from one another, and each independently represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group; and $Za^-$ represents a counter anion and has the same definition as that of $Za^-$ in the formula (a) above.

Examples of the dyes represented by the formula (c), which can be used preferably in the invention, include those illustrated below:

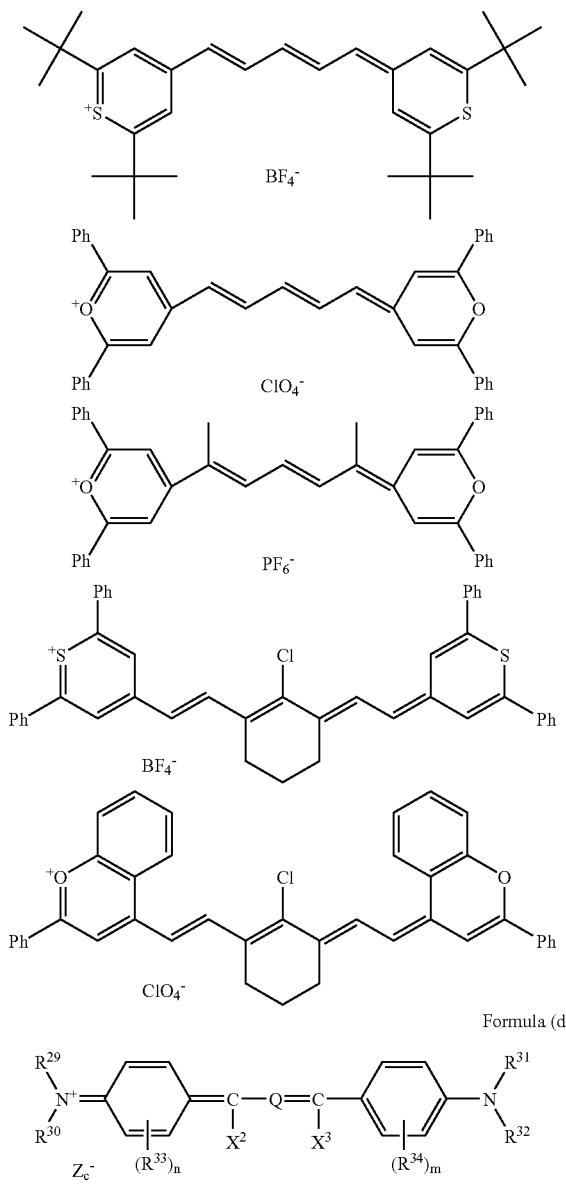

In the formula (d), $R^{29}$ to $R^{31}$ each independently represent a hydrogen atom, an alkyl group or an aryl group; $R^{33}$ and $R^{34}$ each independently represent an alkyl group, a substituted oxy group or a halogen atom; n and m each independently represent an integer of 0 to 4; $R^{29}$ and $R^{30}$, or $R^{31}$ and $R^{32}$, may be bound to each other to form a ring; $R^{29}$ and/or $R^{30}$ may be bound to $R^{33}$ to form a ring; $R^{31}$ and/or $R^{32}$ may be bound to $R^{34}$ to form a ring; when plural $R^{33}$s are present, some of $R^{33}$s may be mutually bound to form a ring; when plural $R^{34}$s are present, some of $R^{34}$s may be mutually bound to form a ring; $X^2$ and $X^3$ each independently represent a hydrogen atom, an alkyl group or an aryl group, and at least one of $X^2$ and $X^3$ represents a hydrogen atom or an alkyl group; Q is an optionally substituted trimethine group or pentamethine group which may form a ring structure with a divalent organic group; and $Zc^-$ represents a counter anion and has the same definition as that of $Za^-$ in the formula (a) above.

Examples of the dyes represented by the formula (d), which can be used preferably in the invention, include those illustrated below:

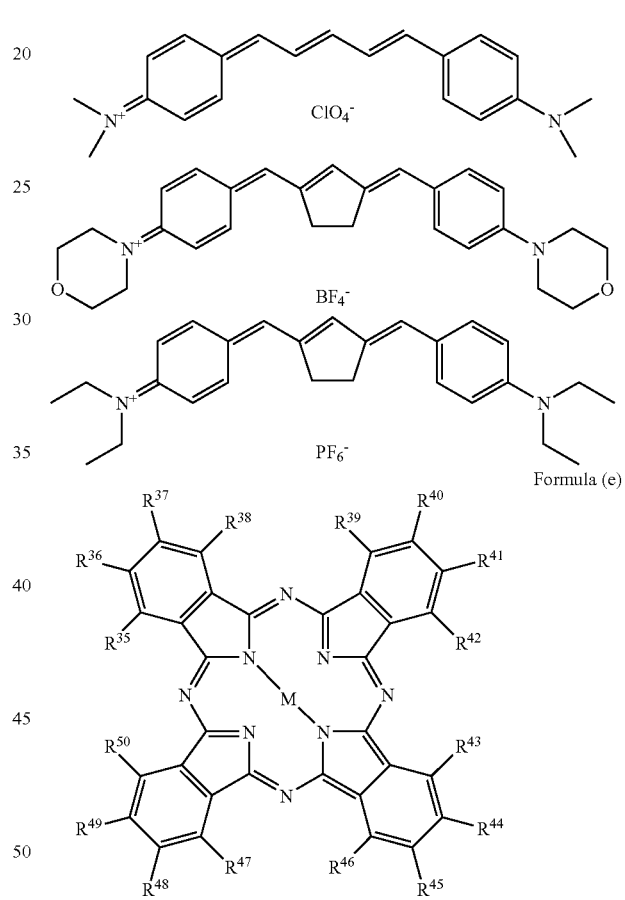

In the formula (e), $R^{35}$ to $R^{50}$ each independently represent a hydrogen atom, halogen atom, cyano group, alkyl group, aryl group, alkenyl group, alkynyl group, hydroxyl group, carbonyl group, thio group, sulfonyl group, sulfinyl group, oxy group, amino group, and onium salt structure, each of which may have a substituent; and M represents two hydrogen atoms, a metal atom, a halometal group or an oxymetal group, and examples of the metal atom contained therein include the groups IA, IIA, IIIB and IVB atoms in the periodic table, the transition metals in the first, second and third periods, and lanthanoid elements, among which copper, magnesium, iron, zinc, cobalt, aluminum, titanium and vanadium are preferable.

Examples of the dyes represented by the formula (e), which can be used preferably in the invention, include those illustrated below:

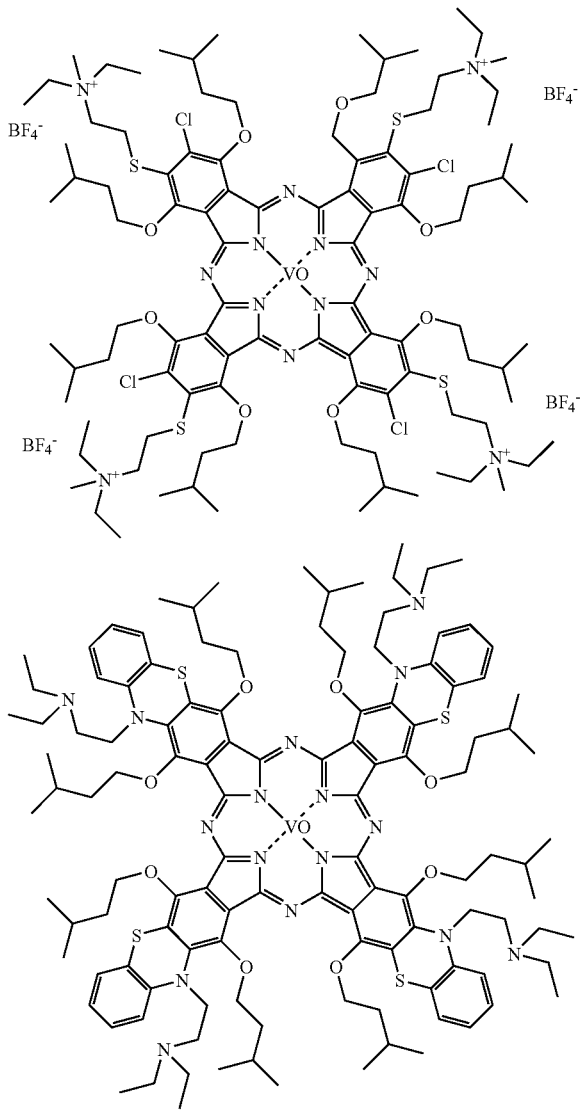

Examples of the pigment used in the invention include commercial pigments and those described in Color Index (C. I.) Handbook, "Saishin Ganryo Binran" (Newest Dye Handbook) (published in 1977 and compiled by Japanese Society of Pigment Technology), "Saishin Ganryho Oyo Gijyutsu" (Newest Pigment Applied Technology) (published in 1986 by CMC), and "Insatsu Inki Gijyutsu" (Printing Ink Technology) (published in 1984 by CMC).

As to the type of the pigment, examples of usable pigments include black pigments, yellow pigments, orange pigments, brown pigments, red pigments, violet pigments, blue pigments, green pigments, fluorescent pigments, metallic powder pigments, and other pigments such as polymer-binding colorants. Specific examples thereof include insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. A preferable pigment among those described above is carbon black.

Such pigments may be used with or without being subjected to surface treatment. Examples of the method of surface treatment include a method of coating the surface with a resin or a wax, a method of allowing a surfactant to adhere to the surface, and a method of bonding a reactive substance (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryho Oyo Gijyutsu" (Newest Pigment Applied Technology) (published in 1986 by CMC Shuppan).

The particle diameter of the pigment is preferably in the range of 0.01 to 10 μm, more preferably 0.05 to 1 μm, still more preferably 0.1 to 1 μm. A pigment particle diameter of more than 0.01 μm is preferable in respect of the stability of a pigment dispersion in the coating liquid for the image recording layer, whereas a particle diameter of less than 10 μm is preferable in respect of the uniformity of the image recording layer.

As the method of dispersing the pigments, any known dispersion techniques used in production of inks or toners can be used. Examples of the dispersing machine include a supersonic dispersing device, a sand mill, an attritor, a pearl mill, a super mill, a ball mill, an impeller, a disperser, a KD mill, a colloid mill, a dynatron, a triple roll mill, and a press kneader. Details thereof are described in "Saishin Ganryho Oyo Gijyutsu" (Newest Pigment Applied Technology) (published in 1986 by CMC Shuppan).

The components (D) in the invention may include only one substance or a combination of two or more substances.

The component (D) in the invention is preferably a cyanine colorant.

From the viewpoint of sensitivity, the component (D) is more preferably a cyanine colorant represented by the formula (a). Among colorants represented by the formula (a), cyanine colorants in which $X^1$ is a diarylamino group or $X^2$-$L^1$ is preferaeble, and those having a diaryl amino group are more preferable.

A cyanine colorant having an electron-withdrawing group or a heavy atom-containing substituent at each of indolenine sites at both terminals is also preferable, and for example, the one described in Japanese Patent Application No. 2001-247137 is preferably used. A cyanine colorant which has an electron-withdrawing group at each of indolenine sites at both terminals, and which has a diarylamino group as $X^1$ is most preferable.

In the case of using the image recording material as a negative planographic printing plate precursor, the sensitizing dye (D) such as the infrared ray absorbing agent to be added for promoting the curing of the polymerizable composition may be added to the image recording layer, or another layer such as a finish coating layer and a primer layer is formed and the sensitizing dye may be added to the thus-formed layer. Particularly, in the case of using the image recording material for an image recording layer of a negative photosensitive planographic printing plate, the sensitizing dye (D) may preferably have an optical concentration between 0.1 and 0.3 when an absorption maximum of the image recording layer is in the range of wavelengths of 760 to 1200 nm from the view point of sensitivity. Since the optical concentration is decided by an additive amount of the infrared ray absorbing agent and a thickness of the imager recording layer, a predetermined optical concentration is achieved by controlling the conditions of the infrared ray absorbing agent additive amount and the imager recording layer thickness.

The optical concentration of the image recording layer is measured by an ordinary method. Examples of the measurement method include a method of forming on a transparent or white support an image recording layer having a thickness for which a coating amount after drying is appropriately decided in the range required as a planographic printing plate and then measuring using a transmissive optical concentration meter, a method of forming an image recording layer on a reflective support such as aluminum and then measuring the reflection concentration, and the like.

Also, in terms of the amount of the sensitizing dye to be added to the image recording layer, the sensitizing dye may preferably be added in an amount of 0.5 to 20 mass % in a total solid content of an image recording layer. The above range is preferred since, within such range, the sensitizing dye achieves a high sensitivity to characteristic change due to exposure to achieve a high sensitivity and is free from the fear for adversely influencing on uniformity and strength of the film.

The image recording material of the present invention is applicable to various fields including a planographic printing plate precursor, a resist, and a coating insofar as the mode is for forming an image by curing the image recording material due to exposure and eliminating the non-exposure part by an alkali development treatment. Since the image recording material is capable of image formation with high sensitivity and excellent in alkali developability, it is preferable to use the image recording material as a planographic printing plate precursor having a negative image recording layer.

Hereinafter, the case of using the image recording material for the planographic printing plate precursor which is one preferred mode of the present invention will be described by way of example, but the application of the image recording material of the present invention is not limited to the planographic printing plate precursor.

(Layer Structure of Planographic Printing Plate Precursor)

Hereinafter, a layer structure in the case of using the image recording material of the present invention for a planographic printing plate precursor will be described.

The planographic printing plate precursor has the image recording layer containing at least the components (A) to (C) and the specific protective layer, and an intermediate layer, a primer layer, a back coating layer, and the like may be added as required.

(Image Recording Layer)

The image recording layer having an image forming function in the planographic printing plate precursor according to the present invention will be described. It is preferable that the image recording layer of the planographic printing plate precursor in the present invention contains the components (A) to (C) and further contains the compound (D) having the absorption maximum at 300 to 1,200 nm from the view point of improvement in sensitivity.

The component (C) in the image recording layer of the planographic printing plate precursor functions particularly as a polymerization initiator for staring and promoting polymerization of the polymerizable compound which is the component (B).

As the polymerizable compound (B) used for the image recording layer of the planographic printing plate precursor, those described in the description of the component (B) are usable, and it is possible to select the compound to be used in connection with the above-described requirements and a support described later in this specification or the specific protective layer. For example, the compound having a specific structure may be selected for the purpose of improving adhesion to the support or the protective layer.

As a usage of the polymerizable compound, a structure, a composition, and a additive amount may arbitrarily selected be selected from the view points of a degree of polymerization inhibition to oxygen, a resolution, a fogging property, a refraction rate change, a surface viscosity, and the like, and it is possible to utilize a layer structure and a coating method including a primer coating and finish coating in some cases.

(E) Other Components

In the case of using the image recording material of the present invention for the planographic printing plate precursor, other components appropriate for the usage, the production method, and the like may be added to the composition of the image recording layer. Hereinafter, preferred additives are described.

(E-1) Co-Sensitizer

By using a certain type of an additive for the image recording layer forming composition, it is possible to further improve the sensitivity. Such compound will hereinafter be referred to as a co-sensitizer. A function mechanism of the co-sensitizer has not clarified yet, but it is considered that the function mechanism is mainly based on the following chemical process. The co-sensitizer reacts with various intermediate active species (radical, cation) generated in the course of the optical reaction started by the heat polymerization initiator and an additive polymerization reaction following the optical reaction to generate active radical. These are broadly categorized into (i) those capable of generating active radical when reduced, (ii) those capable of generating active radical when oxidized, (iii) those react with less active radical to be converted into more active radical, and those act as a chain transfer agent. However, there has been little commonly accepted theory for belongings of the respective compounds.

(i) Compound Forming Active Radicals when Reduced Reduction

Compounds having a carbon-halogen bond: It is considered that the carbon-halogen bond is reductively cleaved to generate active radicals. Specifically, for example, trihalomethyl-s-triazines and trihalomethyl oxadiazoles can be preferably used.

Compounds having a nitrogen-nitrogen bond: It is considered that the nitrogen-nitrogen bond is reductively cleaved to form active radicals. Specifically, hexaryl biimidazoles can be preferably used.

Compounds having an oxygen-oxygen bond: It is considered that the oxygen-oxygen bond is reductively cleaved to generate active radicals. Specifically, organic peroxides can be preferably used.

Onium compounds: It is considered that a carbon-heteroatom bond or an oxygen-nitrogen bond is reductively cleaved to generate active radicals. Specifically, diaryl iodonium salts, triaryl sulfonium salts, and N-alkoxy pyridinium (azinium) salts can be preferably used.

Ferrocene, iron arene complexes: Capable of forming active radicals reductively.

(ii) Compounds Forming Active Radicals when Oxidized

Alkylate complexes: It is considered that a carbon-heteroatom bond is oxidatively cleaved to generate active radicals. Specifically, for example, triaryl alkyl borates can be preferably used.

Alkyl amine compounds: It is considered that a C—X bond on a carbon adjacent to the nitrogen is cleaved by oxidation to form active radicals. X is preferably a hydrogen atom, a carboxyl group, a trimethylsilyl group, or a benzyl group. Specifically, ethanol amines, N-phenyl glycines, N-phenyliminodiacetic acid and its derivatives, and N-trimethylsilylmethyl anilines can be mentioned.

Sulfur- or tin-containing compounds: A compound obtained by replacing the nitrogen atom in any of the above-described amines with a sulfur atom or a tin atom can form active radicals in a similar mechanism. Further, compounds having S—S bonds are known to act as sensitizers by cleavage of the S—S bonds.

α-Substituted methyl carbonyl compounds: Capable of forming active radicals through the cleavage of the carbonyl-α carbon bond upon oxidation. Further, compounds obtained by replacing the carbonyl in such a compound with an oxime ether exhibit the same action. Specifically, examples include 2-alkyl-1-[4-(alkylthio) phenyl]-2-morpholinopronone-1 and derivatives thereof, as well as oxime ethers prepared by reacting such compounds with hydroxy amines and then etherifying N—OH.

Sulfinates: Capable of forming active radicals reductively. Specifically, sodium aryl sulfinates can be mentioned.

(iii) Compounds converted into highly active radicals through reaction with radicals, or compounds acting as chain transfer agents: For example, compounds having SH, PH, SiH or GeH in the molecule are usable. These compounds can form radials by donating hydrogen to radicals having low-activity or by undergoing oxidization and subsequent deprotonation. Specifically, for example, 2-mercaptobenzimidazoles can be mentioned.

In a preferable embodiment, a polycarboxylic acid compound containing an aromatic ring or heterocyclic aromatic ring structure to which at least two carboxyl groups are bonded directly or via a divalent linking group is contained for the purpose of improving sensitivity and/or developability. Specific examples of the polycarboxylic acid compound include (p-acetamidophenylimido)diacetic acid, 3-(bis(carboxymethyl)amino) benzoic acid, 4-(bis(carboxymethyl)amino)benzoic acid, 2-[(carboxymethyl)phenylamino]benzoic acid, 2-[(carboxymethyl)phenylamino]-5-methoxybenzoic acid, 3-[bis(carboxymethyl)amino]-2-naphthalene carboxylic acid, N-(4-aminophenyl)-N-(carboxymethyl)glycine, N,N'-1,3-phenylene-bis-glycine, N,N'-1,3-phenylenebis[N-(carboxymethyl)]glycine, N,N'-1,2-phenylenebis[N-(carboxymethyl)]glycine, N-(carboxymethyl)-N-(4-methoxyphenyl)glycine, N-(carboxymethyl)-N-(3-methoxyphenyl)glycine, N-(carboxymethyl)-N-(3-hydroxyphenyl)glycine, N-(carboxymethyl)-N-(3-chlorophenyl)glycine, N-(carboxymethyl)-N-(4-bromophenyl) glycine, N-(carboxymethyl)-N-(4-chlorophenyl)glycine, N-(carboxymethyl)-N-(2-chlorophenyl) glycine, N-(carboxymethyl)-N-(4-ethylphenyl) glycine, N-(carboxymethyl)-N-(2,3-dimethylphenyl) glycine, N-(carboxymethyl)-N-(3,4-dimethylphenyl)glycine, N-(carboxymethyl)-N-(3,5-dimethylphenyl)glycine, N-(carboxymethyl)-N-(2,4-dimethylphenyl)glycine, N-(carboxymethyl)-N-(2,6-dimethylphenyl)glycine, N-(carboxymethyl)-N-(4-formylphenyl)glycine, N-(carboxymethyl)-N-ethylanthranilic acid, N-(carboxymethyl)-N-propylanthranilic acid, 5-bromo-N-(carboxymethyl) anthranilic acid, N-(2-carboxyphenyl)glycine, o-dianisidine-N,N,N',N'-tetraacetic acid, N,N'-[1,2-ethanediylbis(oxy-2,1-phenylene)]bis[N-(carboxymethyl)glycine], 4-carboxyphenoxy acetic acid, cathecol-O,O'-diacetic acid, 4-methylcatechol-O,O'-diacetic acid, resorcinol-O,O'-diacetic acid, hydroquinone-O,O'-diacetic acid, α-carboxy-o-anisic acid, 4,4'-isopropylidene diphenoxy acetic acid, 2,2'-(dibenzofuran-2,8-diyldioxy)diacetic acid, 2-(carboxymethylthio)benzoic acid, 5-amino-2-(carboxymethylthio)benzoic acid, and 3-[(carboxymethyl)thio]-2-naphthalene carboxylic acid.

In particular, N-arylpolycarboxylic acids represented by the following formula (V) or compounds represented by the following formula (VI) are preferable.

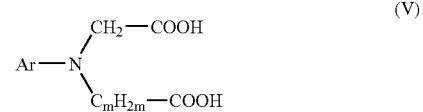

In formula (V), Ar represents a monosubstituted, polysubstituted or unsubstituted aryl group, and m is an integer from 1 to 5.

Examples of a substituent which can be introduced into the aryl group include a $C_1$ to $C_3$ alkyl group, a $C_1$ to $C_3$ alkoxy group, a $C_1$ to $C_3$ thioalkyl group and a halogen atom. This aryl group preferably has 1 to 3 identical or different substituents. m is preferably 1, and Ar preferably represents a phenyl group.

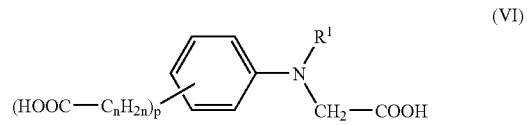

In formula (VI), $R^1$ represents a hydrogen atom or a $C_1$ to $C_6$ alkyl group, and each of n and p is an integer from 1 to 5. n is preferably 1, and $R^1$ is preferably a hydrogen atom. The most preferable polycarboxylic acid is anilinodiacetic acid.

Another compound preferable for improving sensitivity and/or developability is a compound having two or more groups selected from carboxylic acid groups and sulfonic acid groups, and specific examples thereof include 5-aminoisophthalic acid, 5-nitroisophthalic acid, 4-methylphthalic acid, terephthalic acid, 2-bromoterephthalic acid, 2,3-naphthalenedicarboxylic acid, diphenic acid, 1,4,5,8-naphthalenetetracarboxylic acid, N-benzyliminodiacetic acid, N-(2-carboxyphenylglycine), N-phenyliminodiacetic acid, 1,3,5-benzenetricarboxylic acid, 1,2,4,5-benzenetetracarboxylic acid, 5-sulfosalicylic acid, 2-sulfobenzoic acid, 1,5-naphthalenedisulfonic acid, and 4-sulfophthalic acid. The above compound can be further substituted by an alkyl group, an alkenyl group, an alkynyl group, a cyano group, a halogen atom, a hydroxyl group, a carboxyl group, a carbonyl group, an alkoxy group, an amino group, an amide group, a thiol group, a thioalkoxy group, or a sulfonyl group.

Among those described above, the most preferable compound is a compound represented by the formula (V) or (VI).

The amount of such poly(carboxylic acid/sulfonic acid) compound to be added is preferably 0.5 to 15 mass %, more preferably 1 to 10 mass %, still more preferably 3 to 8 mass %, based on the solid content of the polymerizable composition.

A large number of more specific examples of these co-sensitizers are described, for example, in JP-A No. 9-236913 as additives for improving sensitivity, and such compounds can also be used in the invention.

Only one co-sensitizer, or a combination of two or more co-sensitizers, may be used. The amount of the co-sensitizer to be used may be in the range of 0.05 to 100 parts by mass, preferably 1 to 80 parts by mass, more preferably 3 to 50 parts by mass, relative to 100 parts by mass of the polymerizable compound (C).

(E-2) Polymerization Inhibitor

In the invention, in addition to the basic components described above, a small amount of a heat-polymerization inhibitor is preferably added so as to inhibit unnecessary heat polymerization of the polymerizable compound during production or storage of the composition used in the recording layer. Suitable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), and N-nitrosophenyl hydroxylamine primary cerium salts. The amount of the heat-polymerization inhibitor to be added is preferably about 0.01 mass % to about 5 mass % relative to the mass of the entire composition. To prevent the polymerization inhibition by oxygen, a higher fatty acid derivative such as behenic acid or behenic amide may be added as necessary so that the higher fatty acid derivative localizes on the surface of the recording layer in the drying step after application onto a support etc. during the production process of the planographic printing plate precursor. The amount of the higher fatty acid derivative to be added is preferably about 0.5 mass % to about 10 mass % based on the entire composition.

(E-3) Colorant etc.

A dye or pigment may be added to the planographic printing plate precursor according to the invention, for the purpose of coloring its recording layer. The plate-checking property of the printing plate, such as visibility after plate-making and compatibility with an image densitometer, can thereby be improved. The colorant is preferably a pigment since many dyes lower the sensitivity of the photopolymerizable recording layer. Examples of the colorant include pigments such as phthalocyanine pigments, azo pigments, carbon black and titanium oxide, and dyes such as Ethyl Violet, Crystal Violet, azo dyes, anthraquinone dyes and cyanine dyes. The amount of the dyes and pigments to be added is preferably about 0.5 mass % to about 5 mass % based on the entire composition.

(E-4) Other Additives

In the planographic printing plate precursor according to the invention, known additives such as inorganic fillers for improving the physical properties of a cured film, plasticizers, and sensitizers capable of improving the inking property of the surface of the recording layer can be added.

Examples of the plasticizers include dioctyl phthalate, didodecyl phthalate, triethylene glycol dicaprylate, dimethyl glycol phthalate, tricresyl phosphate, dioctyl adipate, dibutyl sebacate, and triacetyl glycerin. When a plasticizer is used, it may be added in an amount of 10 mass % or less relative to the total mass of the binder and the compound having an ethylenically unsaturated double bond.

UV initiators and heat-crosslinking agents for enhancing the effects of heating and light exposure after development can also be added for the purpose of improving the layer strength (printing durability) described later.

Additional additives or an intermediate layer for improving the adhesion between the recording layer and the support and for enhancing the removability of the light-unexposed recording layer during development can also be added. Compounds exhibiting a relative strong interaction with the substrate, such as a compound having a diazonium structure or a phosphone compound, can be used for undercoating or added, so as to improve the adhesion and enhance the printing durability. Hydrophilic polymers such as polyacrylic acid and polysulfonic acid can be used for undercoating or added, so as to improve the developability of the non-image portion and improve stain resistance.

The planographic printing plate precursor according to the invention can be produced by coating a suitable support with a coating liquid for the recording layer or with a solution prepared by dissolving, in solvent, a coating component for a desired layer such as protective layer.

Examples of usable solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. Only one solvent may be used, or a mixture of two or more solvents may be used. An adequate solids content of the coating liquid is from 2 to 50 mass %.

It is preferable that the coating amount of the recording layer on the support be determined suitably depending on applications in consideration of the effects on the sensitivity and developability of the recording layer and the strength and printing durability of the light-exposed layer. When the coating amount is too small, printing durability is not satisfactory. A too large coating amount is not preferable because sensitivity is decreased, the time for light exposure is prolonged, and the development treatment also requires a longer time. In the planographic printing plate precursor according to the invention, the coating amount in terms of mass after drying is generally from about 0.1 to about 10 $g/m^2$, more preferably from 0.5 to 5 $g/m^2$.

(Resin Intermediate Layer)

In the planographic printing plate precursor according to the invention, a resin intermediate layer including an alkali-soluble polymer can be arranged as necessary between the recording layer and the support.

When the recording layer that is an infrared light-sensitive layer whose solubility in an alkali developer is decreased upon exposure to light is disposed as a light exposure surface or in the vicinity thereof, the sensitivity to an infrared laser light is improved. Further, the resin intermediate layer between the support and the infrared light-sensitive recording layer acts as a heat insulating layer, thereby preventing heat generated upon exposure to infrared laser light from diffusing in the support. Therefore, the heat is used effectively, and the sensitivity can be heightened.

It is estimated that in a light-exposed portion, the photosensitive layer (image recording layer) made impermeable to an alkali developer functions as a protective layer for the resin intermediate layer, thus improving development stability, forming an image excellent in discrimination and securing stability with time, while in a light-unexposed portion, an unhardened binder component is rapidly dissolved and dispersed in a developer. Since the resin intermediate layer provided adjacent to the support is made of an alkali-soluble polymer, the resin intermediate layer is excellent in solubility in a developer, and is rapidly dissolved to attain excellent developability without generating a remaining layer even if, for example, a developer having lowered activity is used.

<Substrate (Support)>

The support used in the invention may be paper, a polyester film or an aluminum plate, among which an aluminum plate is particularly preferable because it is excellent in dimensional stability, is relatively inexpensive, can provide a surface excellent in hydrophilicity and strength by performing surface treatment as necessary. A composite sheet having an aluminum sheet bonded to a polyethylene terephthalate film, as described in JP-B No. 48-18327, is also preferable.

The aluminum plate as used herein is a dimensionally stable metal plate including aluminum as a major component, and the scope of the aluminum plate includes not only a pure aluminum plate but also an alloy plate including aluminum as a major component and a very small amount of hetero elements, and a plastic film or paper having aluminum (alloy) laminated or vapor-deposited thereon. In the following description, supports made of aluminum or aluminum alloys are referred to collectively as aluminum supports. Examples of the hetero elements contained in the aluminum alloy include silicon, iron, manganese, copper, magnesium, chromium, zinc, bismuth, nickel, and titanium. The content of the hetero elements in the alloy is 10 mass % or less. A pure aluminum plate is particularly preferable, but because production of completely pure aluminum is difficult from the viewpoint of refining techniques, aluminum may contain a very small amount of hetero elements. The composition of the aluminum plate is not limited, and any aluminum plates made of known and conventionally used aluminum materials such as JIS A 1050, JIS A 1100, JIS A 3103 and JIS A 3005 can be used as necessary.

The thickness of the aluminum support is about 0.1 to 0.6 mm. This thickness can be suitably changed depending on the size of a printing machine, the size of a printing plate, and user's requests.

The aluminum support may be subjected to the following surface treatment to make it hydrophilic.

(Surface Roughening Treatment)

Examples of the surface roughening treatment include mechanical roughening, chemical etching and electrolytic grain as disclosed in JP-A No. 56-28893. Other examples include an electrochemical surface roughening method of electrochemically roughening the surface in a hydrochloric acid or nitric acid electrolytic solution, and mechanical surface roughening methods such as a wire brush grain method of scratching an aluminum surface with a metallic wire, a pole grain method of graining an aluminum surface with abrasive grains and an abrasive, or a brush grain method of roughening the surface with a nylon brush and an abrasive. Only one of these surface roughening methods may be used, or a combination of two or more of these surface roughening methods may be used. Among these methods, the electrochemical method of roughening the surface chemically in a hydrochloric acid or nitric acid electrolytic solution is particularly useful in surface roughening. The anode time electricity is preferably in the range of 50 to 400 C/dm$^2$. Specifically, it is preferable to conduct alternating current and/or direct current electrolysis at a temperature of 20 to 80° C., for 1 second to 30 minutes with a current density of 100 to 400 C/dm$^2$ in an electrolytic solution containing 0.1 to 50% hydrochloric acid or nitric acid.

The aluminum support thus surface-roughened may be etched chemically with acid or alkali. Preferable examples of the etching agent to be used include sodium hydroxide, sodium carbonate, sodium aluminate, sodium metasilicate, sodium phosphate, potassium hydroxide, lithium hydroxide etc., and the concentration and temperature are preferably in the range of 1 to 50% and 20 to 100° C., respectively. After etching, washing with acid may be carried out to remove blemish (smuts) remaining on the surface. Examples of the acid to be used include nitric acid, sulfuric acid, phosphoric acid, chromic acid, fluoric acid and hydrofluoboric acid. The method of removing smuts after electrochemical surface roughening treatment is preferably a method of contacting with 15 to 65% by mass sulfuric acid at a temperature of 50 to 90° C. as described in JP-A No. 53-12739 or a method of alkali etching as described in JP-B No. 48-28123. The method and conditions are not particularly limited as long as the surface roughness Ra of the treated surface is about 0.2 to 0.5 μm after the treatment.

(Anodizing Treatment)

The thus treated aluminum support having an oxide layer formed thereon is then subjected to anodizing treatment.

In the anodizing treatment, an aqueous solution of sulfuric acid, phosphoric acid, oxalic acid or boric acid-sodium borate, or an aqueous solution of a combination of two or more of such substances, can be used as the major component in an electrolytic bath. In this case, the electrolytic solution may naturally contain at least components usually contained in the Al alloy plate, the electrodes, tap water and underground water. Second and third components may also be contained. The range of the second and third components include, for example, cations of metals such as Na, K, Mg, Li, Ca, Ti, Al, V, Cr, Mn, Fe, Co, Ni, Cu and Zn, ammonium ions, and anions such as nitrate ion, carbonate ion, chlorine ion, phosphate ion, fluorine ion, sulfite ion, titanate ion, silicate ion and borate ion, and the concentration thereof may be from about 0 to 10000 ppm. Although the conditions for the anodizing treatment are not particularly limited, the plate is preferably treated with 30 to 500 g/L solution at a temperature of 10 to 70° C. by direct current or alternating current electrolysis in the range of a current density of 0.1 to 40 A/m$^2$. The thickness of the anodized layer formed may be in the range of 0.5 to 1.5 μm. Preferably, the thickness is in the range of 0.5 to 1.0 μm. The treatment conditions are preferably selected such that the pore diameter of micropores present in the anodized layer formed on the support by the treatment described above is 5 to 10 nm and such that the pore density is $8 \times 10^{15}$ to $2 \times 10^{16}$ pores/m$^2$.

The treatment for imparting hydrophilicity to the surface of the support may be selected from various known methods. The treatment is particularly preferably hydrophilicity-imparting treatment with a silicate, polyvinylphosphonic acid, or the like. The obtained layer may have a Si or P element content of 2 to 40 mg/m$^2$, preferably 4 to 30 mg/m$^2$. The coating amount can be measured by fluorescence X ray analysis.

In the hydrophilicity-imparting treatment, the aluminum support having an anodized layer formed thereon is dipped in an aqueous solution at pH 10 to 13 (determined at 25° C.) containing an alkali metal silicate or polyvinylphosphonic acid in an amount of 1 to 30 mass %, more preferably 2 to 15 mass %, for example at 15 to 80° C. for 0.5 to 120 seconds.

As the alkali metal silicate used in the treatment for imparting hydrophilicity, sodium silicate, potassium silicate, lithium silicate, or the like is used. The hydroxide used for raising the pH value of the aqueous alkali metal silicate solution may be sodium hydroxide, potassium hydroxide, lithium hydroxide, or the like. Alkaline earth metal salts or the group IVB metal salts may be incorporated into the treating solution described above. Examples of the alkaline earth metal salts include nitrates such as calcium nitrate, strontium nitrate, magnesium nitrate and barium nitrate, and water-soluble salts such as sulfate, hydrochloride, phosphate, acetate, oxalate and borate. Examples of the group IVB metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride, and zirconium tetrachloride.

In an embodiment, only one selected from alkaline earth metal salts and group IVB metal salts is used. In another embodiment, a combination of two or more selected from alkaline earth metal salts and group IVB metal salts is used. The amount of these metal salts is preferably in the range of 0.01 to 10% by mass, more preferably 0.05 to 5.0% by mass. Electrodeposition with silicate as described in U.S. Pat. No. 3,658,662 is also effective. A surface treatment which is a combination of a support which has been subjected to electrolytic graining as disclosed in JP-B No. 46-27481, JP-A No. 52-58602 and JP-A No. 52-30503, and the anodizing treatment and the hydrophilicity-imparting treatment described above, is also useful.

[Production of the Planographic Printing Plate Precursor]

The planographic printing plate precursor according to the invention may have an image recording layer described above in detail and a specific protective layer on this order on a support and may be provided if necessary with an intermediate layer (undercoat layer) etc. Such a planographic printing plate precursor can be produced by applying coating liquids containing the respective components sequentially onto a support.

When the image recording layer is formed by coating, the image recording layer components are dissolved in an organic solvent, which may be selected from various organic solvents, to form an image recording layer coating liquid. The image recording layer coating liquid is then applied onto the support or the undercoat layer.

Examples of the solvent to be used for the recording layer coating liquid include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. The solvent to be used may include only one of these solvents or a mixture of two or more of these solvents. A suitable solids content of the image recording layer coating liquid is from 2 to 50 mass %.

The coating amount of the image recording layer can mainly influence the sensitivity of the recording layer, the strength of the light-exposed layer, developability, and the printing durability of the resultant printing plate, and is desirably selected in accordance with the application. In the case of the planographic printing plate precursor for scanning exposure, the coating amount in terms of the mass of the recording layer after drying is preferably in the range of about $0.1 \text{ g/m}^2$ to about $10 \text{ g/m}^2$, more preferably 0.5 to $5 \text{ g/m}^2$.

[Intermediate Layer (Undercoat Layer)]

For the purpose of improving the adhesiveness between the recording layer and the support and stain resistance, the planographic printing plate precursor may have an intermediate layer (undercoat layer). Specific examples of the intermediate layer include those described in JP-B No. 50-7481, JP-A No. 54-72104, JP-A No. 59-101651, JP-A No. 60-149491, JP-A No. 60-232998, JP-A 3-56177, JP-A No. 4-282637, JP-A No. 5-16558, JP-A No. 5-246171, JP-A No. 7-159983, JP-A No. 7-314937, JP-A No. 8-202025, JP-A No. 8-320551, JP-A No. 9-34104, JP-A No. 9-236911, JP-A No. 9-269593, JP-A No. 10-69092, JP-A No. 10-115931, JP-A No. 10-161317, JP-A No. 10-260536, JP-A No. 10-282682, JP-A No. 11-84674, JP-A No. 10-69092, JP-A No. 10-115931, JP-A No. 11-38635, JP-A No. 11-38629, JP-A No. 10-282645, JP-A No. 10-301262, JP-A No. 11-24277, JP-A No. 11-109641, JP-A No. 10-319600, JP-A No. 11-84674, JP-A No. 11-327152, JP-A No. 2000-10292, JP-A No. 2000-235254, JP-A No. 2000-352854, JP-A No. 2001-209170, JP-A No. 2001-175001 etc.

<Plate-making Method>

Hereinafter, the method of making a plate from the planographic printing plate precursor according to the invention will be described.

In an embodiment of the method of making a plate from the planographic printing plate precursor, a plurality of the planographic printing plate precursors described above are stacked such that the protective layer directly contacts with the back surface of the support; the stack of the planographic printing plate precursors is then set in a plate setter and the planographic printing plate precursors are automatically conveyed one by one; each precursor is imagewise exposed to light having a wavelengths of 750 to 1400 nm; and then the precursor is developed to remove the non-image portion so that the plate-making process is completed. Even when the planographic printing plate precursors according to the invention are stacked without inserting interleaf paper between the precursors, the adhesion between the planographic printing plate precursors and flaws on the protective layer can be suppressed, and therefore, the planographic printing plate precursor can be applied to the plate-making method described above. According to this plate-making method, since the stack of the planographic printing plate precursors in which the precursors are stacked without using interleaf paper between the precursors is used, the step of removing interleaf paper is unnecessary, and thus the productivity in the plate-making process is improved.

As a matter of course, plate-making can be conducted using a stack in which the planographic printing plate precursors according to the invention and sheets of interleaf paper are stacked alternately.

[Exposure]

As an exposure method for the planographic printing plate precursor using the image recording material of the present invention, known methods may be used without limitation.

As a light source for exposing the image recording layer of the image recording material of the present invention, know light sources may be used without limitation. A wavelength of the light source may be 300 to 1200 nm. More specifically, it is possible to use various lasers as the light source, and a semiconductor layer radiating an infrared ray of a wavelength of 760 to 1200 nm may be used.

The laser may preferably be used as the light source, and examples of available laser light source having a wavelength of 350 to 450 nm are as follows.

As a gas laser, an Ar ion laser (364 nm, 351 nm, 10 mW to 1 W), a Kr ion laser (356 nm, 351 nm, 10 mW to 1 W), a He—Cd laser (441 nm, 325 nm, 1 mW to 100 mW), a combination of Nd:YAG(YVO$_4$) and SHG crystal×twice as a solid laser (355 mm, 5 mW to 1 W), and a combination of Cr:LiSAF and SHG crystal as a solid laser (430 nm, 10 mW).

As a semiconductor laser system, $KNbO_3$, a ring oscillator (430 nm, 30 mW), a combination of a waveguide type wavelength converting element and AlGaAs and InGaAs semiconductors (380 to 450 nm, 5 mW to 100 mW), a combination of a waveguide type wavelength converting element and AlGaInP and InGaAs semiconductors (300 to 350 nm, 5 mW to 100 mW), AlGaInN (350 to 450 nm, 5 mW to 30 mW), an $N_2$ laser as a pulse laser (337 nm, pulse: 0.1 to 10 mJ), a XeF (351 nm, pulse: 10 to 250 mJ), and the like. Particularly, among them, AlGaInN semiconductor laser (commercially available InGaN semiconductor laser 400 to 410 nm, 5 to 30 mW) is preferably used in terms of wavelength property and cost.

Examples of the available light source of 450 to 700 nm include an $Ar^+$ laser (488 nm), a YAG-SHG laser (532 nm), a He—Ne laser (633 nm), a He—Cd laser, a red semiconductor laser (650 to 690 nm), and preferred examples of the available light source of 700 to 1,200 nm include a semiconductor laser (800 to 850 nm) and an Nd-YAG layer (1064 nm).

Other usable light sources include ultra high pressure, high pressure, intermediate pressure, low pressure mercury lamps, a chemical lamp, a carbon ark light, a xenon light, a metal halide light, an ultraviolet laser lamp, (ArF excimer laser, KrF excimer laser, etc.), various visible laser lamp, a fluorescent lamp, a tungsten lamp, solar light, and the like as well as a radial ray such as an electron beam, an X-ray, an ion beam, an far infrared ray, and the like.

Among the above, as the light source of the ray to be used for image exposure of the image recording material according to the present invention, the light source having an emission wavelength in a region including near infrared and infrared may preferably be used, and a solid laser and a semiconductor laser may particularly be preferred.

Also, an exposure mechanism may be any one of an inner surface drum type, an outer surface drum type, and a flat bed type.

The light source used in the exposure treatment may be any light source that can allow exposure at a wavelength of 750 to 1400 nm, and is preferably an infrared laser. The light source is more preferably a solid laser or a semiconductor laser emitting infrared rays having a wavelength of 750 to 1400 nm for imagewise light exposure. The output power of the laser is preferably 100 mW or more, and it is preferable to use a multi-beam laser device to reduce the exposure time. The exposure time per pixel is preferably within 20 μsec. The quantity of energy per unit irradiated on the planographic printing plate precursor is preferably 10 to 300 mJ/cm².

The light exposure can be carried out by overlapping beams from a light source. The term "overlapping" means that exposure is conducted under such a condition that the sub-scanning pitch is smaller than the beam diameter. For example, when the beam diameter is expressed in terms of full-width at half-maximum (FWHM) of the beam intensity, overlapping can be quantitatively expressed in FWHM/sub-scanning pitch (overlapping coefficient). In the invention, the overlapping coefficient is preferably 0.1 or more.

The scanning system for a light source in the light exposure device is not particularly limited, and a drum outer surface scanning method, a drum inner surface scanning method, a flatbed scanning method, or the like can be used. The channel of the light source may be a single channel or a multi-channel, but in the case of the drum outer surface scanning method, a multi-channel is preferably used.

In plate-making, the planographic printing plate precursor according to the invention can be subjected to development treatment without carrying out special thermal treatment and/or water washing treatment usually conducted after exposure treatment. Because the thermal treatment is not carried out, image unevenness attributable to the thermal treatment can be prevented. Because the thermal treatment and/or water washing treatment is not carried out, stable high-speed treatment is possible in development treatment.

[Development]

Hereinafter, the developer used in development treatment carried out after the light exposure treatment will be described.

<Developer>

The developer to be used is not particularly limited, but is usually an aqueous alkali solution containing an alkali agent at pH 14 or less, more preferably 9.0 to 13.0.

(Alkali Agent)

Examples of the alkali agent used in the developer include inorganic alkali agents such as tertiary sodium phosphate, tertiary potassium phosphate, tertiary ammonium phosphate, sodium borate, potassium borate, ammonium borate, sodium hydroxide, potassium hydroxide, ammonium hydroxide and lithium hydroxide, and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine and tetramethyl ammonium hydroxide. Only one alkali agent may be used, or a combination of two or more alkali agents may be used.

Alkali agents other than those described above include alkali silicates. Alkali silicates may used in combination with a base. The alkali silicates to be used may be those showing alkalinity when dissolved in water, and examples thereof include sodium silicate, potassium silicate, lithium silicate and ammonium silicate. In an embodiment, only one alkali silicate is used. In another embodiment, a mixture of two or more alkali silicates is used.

When a silicate is used, the characteristics of the developer can be adjusted easily to the optimum range by controlling the mixing ratio and concentration of silicon oxide $SiO_2$ as silicate component and alkali oxide $M_2O$ (M is an alkali metal or an ammonium group) as alkali component. From the viewpoint of suppressing blemish attributable to excess dissolution (etching) of the anodized film on a support and inhibiting generation of insoluble gas attributable to formation of a complex of dissolved aluminum and a silicate, the mixing ratio of silicon oxide $SiO_2$ to alkali metal oxide $M_2O$ ($SiO_2/M_2O$ molar ratio) is preferably in the range of 0.75 to 4.0, more preferably in the range of 0.75 to 3.5.

Regarding the concentration of the alkali silicate salt in the developer, the amount of $SiO_2$ relative to the mass of the developer is preferably in the range of 0.01 to 1 mol/L, more preferably 0.05 to 0.8 mol/L from the viewpoint of inhibitory effects on dissolution (etching) of the anodized film on a support, developability, inhibitory effects on precipitation and crystallization, and inhibitory effects on gelling upon neutralization at the time of waste liquid treatment.

(Aromatic Anionic Surfactant)

The developer preferably contains an aromatic anionic surfactant from the viewpoint of the development accelerating effect, stabilization of a dispersion of the negative type polymerizable image recording layer components and protective layer components in the developer, and stabilization of development treatment.

The aromatic anionic surfactant is not particularly limited, but is preferably a compound represented by the following formula (A) or (B):

Formula (A)

$$\left[(R^2)_p-\underset{}{\underset{}{\bigcirc}}-Y^1\!-\!\!\left(O(R^1O)_m\right)_t\!-\!SO_3^-\right]_r (Z^1)^{r+}$$

Formula (B)

$$\left[(R^4)_q-\underset{}{\underset{}{\bigcirc\!\bigcirc}}-Y^2\!-\!\!\left(O(R^3O)_n\right)_u\!-\!SO_3^-\right]_s (Z^2)^{s+}$$

In the formula (A) or (B) above, $R^1$ and $R^3$ each independently represent a linear or branched $C_1$ to $C_5$ alkylene group, and specific examples include an ethylene group, a propylene group, a butylene group and a pentylene group, among which an ethylene group and a propylene group are particularly preferable.

m and d each independently represent an integer from 1 to 100, and is preferably from 1 to 30, more preferably from 2 to 20. When m is 2 or greater, there are plural $R^1$s which may be the same as or different from each other. When n is 2 or greater, there are plural $R^3$s which may be the same as or different from each other. t and u each independently represent 0 or 1.

$R^2$ and $R^4$ each independently represent a linear or branched $C_1$ to $C_{20}$ alkyl group, and specific examples include a methyl group, an ethyl group, a propyl group, a butyl group, a hexyl group and a dodecyl group, among which a methyl group, an ethyl group, an iso-propyl group, an n-propyl group, an n-butyl group, an iso-butyl group and a tert-butyl group are particularly preferable.

Each of p and q represents an integer from 0 to 2. Each of $Y^1$ and $Y^2$ represents a single bond or a $C_1$ to $C_{10}$ alkylene group and is preferably a single bond, a methylene group or an ethylene group, particularly preferably a single bond.

$(Z^1)^{r+}$ and $(Z^2)^{s+}$ each independently represent an alkali metal ion, an alkaline earth metal ion, unsubstituted ammonium ion or an ammonium ion substituted by an alkyl group. Specific examples include a lithium ion, a sodium ion, a potassium ion, a magnesium ion, a calcium ion, an ammonium ion, a secondary to quaternary ammonium ion substituted by an alkyl, aryl or aralkyl group having 20 or less carbon atoms. $(Z^1)^{r+}$ and $(Z^2)^{s+}$ each is particularly preferably a sodium ion. r and s each independently represent 1 or 2.

Specific examples of the aromatic anionic surfactant are shown below. However, the examples should not be construed as limiting the invention.

K-1: naphthyl—$O(CH_2CH_2O)_4SO_3^-Na^+$

K-2: naphthyl—$O(CH_2CH_2O)_7SO_3^-Na^+$

K-3: naphthyl—$O(CH_2CH_2O)_{10}SO_3^-Na^+$

K-4: naphthyl—$O(CH_2CH_2O)_{18}SO_3^-Na^+$

K-5: $C_4H_9$-naphthyl—$O(CH_2CH_2O)_{10}SO_3^-Na^+$

K-6: $C_3H_7$-naphthyl—$O(CH_2CH_2O)_4SO_3^-Na^+$

K-7: phenyl—$O(CH_2CH_2O)_4SO_3^-Na^+$

K-8: phenyl—$O(CH_2CH_2O)_{10}SO_3^-Na^+$

K-9: $H_3C$-phenyl—$O(CH_2CH_2O)_4SO_3^-Na^+$

K-10: $C_{12}H_{25}$-phenyl—$O(CH_2CH_2O)_4SO_3^-Na^+$

K-11: naphthyl—$SO_3^-Na^+$

K-12: $C_4H_9$-naphthyl—$SO_3^-Na^+$

In an embodiment, only one aromatic anionic surfactant is used. In another embodiment, an arbitrary combination of two or more aromatic anionic surfactants is used. The amount of aromatic anionic surfactant to be added is not particularly limited. From the viewpoint of developability, the solubility of the image recording layer components and the specific protective layer components, and the printing durability of the resultant printing plate, the concentration of the aromatic anionic surfactant in the developer is preferably in the range of 1.0 to 10 mass %, more preferably in the range of 2 to 10 mass %.

In the developer, the aromatic anionic surfactant may be used in combination with one or more other surfactants. Such other surfactants may be nonionic surfactants, and examples thereof include polyoxyethylene alkyl ethers such as polyoxyethylene naphthyl ether, polyoxyethylene alkyl phenyl ether, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate and sorbitan trioooleate, and monoglyceride alkyl esters such as glycerol monostearate and glycerol monooleate.

The content of such additional surfactant in the developer is preferably from 0.1 to 10 mass %.

(Chelate Agent)

For the purpose of preventing the influence from calcium ions etc. contained in hard water, for example, a chelate agent for divalent metals is preferably contained in the developer. Examples of the chelate agent for divalent metals include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), aminopolycarboxylic acids (for example, ethylenediaminetetraacetic acid, potassium salts thereof, and sodium salts thereof, amine salt thereof; diethylenetriaminepentaacetic acid, potassium salt thereof, sodium salt thereof; triethylenetetraminehexaacetic acid, potassium salt thereof, sodium salt thereof; hydroxyethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanol tetraacetic acid, potassium salt thereof, sodium salt thereof); other polycarboxylic acids (for example, 2-phosphonobutanetricarboxylic acid-1,2,4, potassium salt thereof, sodium salt thereof; 2-phosphonobutanonetricarboxylic acid-2,3,4, potassium salt thereof, sodium salt thereof), organic phosphonic acids (for example, 1-phosphonoethanetricarboxylic acid-1,2,2, potassium salt thereof, sodium salt thereof; 1-hydroxyethane-1,1-diphosphonic acid, potassium salt thereof, sodium salt thereof; and aminotri(methylene phosphonic acid), potassium salt thereof, and sodium salt thereof, among which ethylenediaminetetraacetic acid, potassium salt thereof, sodium salt thereof, amine salt thereof; ethylenediaminetetra (methylenephosphonic acid), ammonium salt thereof, potassium salt thereof; hexamethylenediaminetetra(methylenephosponic acid), ammonium salt thereof, and potassium salt thereof are particularly preferable.

The optimum amount of the chelate agent varies depending on the hardness and amount of hard water used. In general, the chelate agent is contained in the range of 0.01 to 5 mass %, more preferably 0.01 to 0.5 mass %, in the developer at use.

In addition, an alkali metal salt of an organic acid and/or an alkali metal salt of an inorganic acid may be added as the development regulating agent to the developer. For example, sodium carbonate, potassium carbonate, ammonium carbonate, sodium citrate, potassium citrate or ammonium citrate, or a combination of two or more of such salts may be used.

In addition to the components described above, components such as the following can be simultaneously used if necessary in the developer: organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-t-butylbenzoic acid, p-2-hydroxyethylbenzoic acid, decanoic acid, salicylic acid and 3-hydroxy-2-naphthoic acid, organic solvents such as propylene glycol, and other components such as a reducing agent, a dye, a pigment and a preservative.

From the viewpoint of developability of the non-image portion during development, reduction of damage to the image portion, and handling property of the developer, the pH of the developer at 25° C. is preferably in the range of pH 10 to 12.5, more preferably in the range of pH 11 to 12.5.

The electric conductivity x of the developer is preferably within the range: 2<x<30 mS/cm, and is more preferably from 5 to 25 mS/cm. For regulating the electric conductivity, an alkali metal salt of an organic acid and/or an alkali metal salt of an inorganic acid are added preferably as the electric conductivity regulating agent.

The developer can be used as a developer and a replenisher for the light-exposed planographic printing plate precursor, and is preferably applied to an automatic developing machine. When the planographic printing plate precursor is developed with an automatic developing machine, the developer is exhausted depending on throughput. Therefore, processing power may be recovered by using a replenisher or a fresh developer. This replenishing system can be preferably used also in the plate-making method in the invention.

To restore the processing power of the developer in an automatic developing machine, replenishing can be conducted by a method described in U.S. Pat. No. 4,882,246. Developers described in JP-A No. 50-26601, JP-A No. 58-54341, JP-B No. 56-39464, JP-B No. 56-42860 and JP-B No. 57-7427 are also preferable.

The planographic printing plate precursor which was subjected to development treatment in this manner is post-treated with washing water, a surfactant-containing rinse, or a desensitizing gum solution containing gum arabic or a starch derivative, as described in JP-A No. 54-8002, JP-A No. 55-115045 and JP-A No. 59-58431. Various combinations of these treatments can be used.

For the purpose of improving strength of image portion and printing durability, the whole surface of the image after development can be heated or exposed to light. Very severe conditions can be utilized for the heating after development, and the heating temperature is usually in the range of 200 to 500° C.

The planographic printing plate obtained by these treatments is loaded onto an offset printing machine, and used for printing on a large number of sheets.

At the time of printing, a plate cleaner used for removing dirt from the plate may be a PS plate cleaner conventionally known in the art, such as Multi-cleaners CL-1, CL-2, CP, CN-4, CN, CG-1, PC-1, SR or IC (Fuji Film Corporation).

Exemplary embodiments of the present invention are shown below:

EXAMPLES

Hereinafter, the present invention will be described by way of examples, but is not particularly limited to the examples.

Examples 1 to 6

[Production of Support]

The following treatments (a) to (j) are successively performed on a JIS A 1050 aluminum plate having a thickness of 0.24 mm and a width of 1,030 mm. After each of the treatment and water washing, draining is performed by using a nip roller.

(a) Mechanical Roughing Treatment

By using a mechanical surface roughening device, a surface of the aluminum plate was mechanically roughened by a rotating roller type nylon brush while supplying a suspension of a polishing agent (pumice) having a specific gravity of 1.12 and water as a polishing slurry to the surface. An average particle diameter of the polishing agent was 40 to 45 μm, and a maximum particle diameter thereof was 200 μm. A material of the nylon brush was 6.10 nylon and had a bristle length of 50 mm and a bristle diameter of 0.3 mm. The nylon brush was obtained by densely filling the bristles into holes formed on a φ300 mm stainless cylinder. The number of rotating brushes used was 3. A distance between two support rollers (φ200)

under the brushes was 300 mm. The brush roller is pressed against the aluminum plate until a load of a driving motor for rotating the brushes is higher than a load before the pressing by 7 kw. A rotation direction of the brush was in a direction of movement of the aluminum plate, and a rotation number thereof was 200 rpm.

(b) Alkali Etching Treatment

The aluminum plate was subjected to an etching treatment by spraying under the conditions of a caustic soda concentration of 2.6 mass %, an aluminum ion concentration of 6.5 mass %, and at 70° C. to melt the aluminum plate by 0.3 g/m$^2$. After that, water washing was performed by spraying.

(c) Desmut Treatment

A desmut treatment was performed by spraying using an aqueous solution of a nitric acid concentration of 1 mass % (containing 0.5 mass % of aluminum ion) having a temperature of 30° C., and then water washing was performed by spraying. For the nitric acid aqueous solution used for the desmut treatment, a waste water of a process of electrochemical roughening using an alternate current in a nitric acid aqueous solution was used.

(d) Electrochemical Roughening Treatment

By using an alternating current voltage of 60 Hz, an electrochemical roughening treatment was continuously conducted. An electrolytic solution used for the roughening treatment was a 1 mass % nitric acid aqueous solution (containing 0.5 mass % of aluminum ion and 0.007 mass % of ammonium ion) having a temperature of 40° C. The electrochemical roughening treatment by using a trapezoidal rectangular wave alternating current using 2 msec until a current value reaches to a peak from 0 and having a duty ratio of 1:1 as the alternating current source was performed as well as by using a carbon electrode as a counter electrode. A ferrite light was used as an auxiliary anode.

A current density was 30 A/dm$^2$ as a peak value of the current, and an electric amount was 255 C/cm$^2$ as a total amount of the electric amount when the aluminum plate was the anode. A current of 5% of the current supplied from the power source was supplied to the auxiliary anode. After that, water washing was performed by spraying.

(e) Alkali Etching Treatment

An etching treatment was performed on the aluminum plate by spraying under the conditions of a caustic soda concentration of 26 mass %, an aluminum ion concentration of 6.5 mass %, and 32° C. to melt the aluminum plate by 0.2 g/m$^2$, and the smut component mainly including aluminum hydroxide generated by performing the electrochemical roughening using the above-described alternating current was removed, and an edge portion of the generated pit was melted to smooth the edge portion. After that, water washing was performed by spraying.

(f) Desmut Treatment

A desmut treatment was performed by using a 25 mass % nitric acid concentration aqueous solution (containing 0.5 mass % of aluminum ion) having a temperature of 60° C., and then water washing was performed by spraying.

(g) Electrochemical Roughening Treatment

By using an anode oxidation apparatus of a two-stage power supply electrolytic treatment (a length of each of a firs electrolysis part and a second electrolysis part: 6 m, a length of a first power supply part: 3 m, a length of a second power supply part: 3 m, and a length of each of a first power supply electrode and a second power supply electrode: 2.4 m), an anodic oxidation treatment was performed by setting a nitric acid concentration in the electrolysis part to 170 g/L (containing 0.5 mass % of aluminum ion) and at a temperature of 38° C. After that, water washing was performed by spraying.

In this case, a current from the power source in the anodic oxidation apparatus flows to the first power supply electrode provided in the first power supply part and then to the plate-like aluminum via the electrolysis to generate an oxidized film on a surface of the plate-like aluminum at the first electrolysis part. After that, the current flows through the electrolysis electrode provided in the firs power supply part to return to the power source. In turn, the current from the power source flows to the second power source electrode provided in the second power supply part and then to the plate-like aluminum via the electrolysis liquid in the same manner as described above to generate an oxidized film on the surface of the plate-like aluminum at the second electrolysis part. The electric amount supplied from the power source to the first power supply part is the same as that supplied from the power source to the second power supply part, and a power supply current density on the oxidized film surface in the second power supply part was about 25 A/dm$^2$. In the second power supply part, power was supplied from the oxidized film surface of 1.35 g/m$^2$. An ultimate oxidized film amount was 2.7 g/m$^2$.

The aluminum plate on which the treatments (a) to (g) were performed is referred to as an aluminum support [1].

(h) Hydrophilic Property Imparting Treatment

On the aluminum support [1] obtained as described above and subjected to a surface treatment, a silicate treatment was performed in order to increase the hydrophilic property as a printing plate non-image part. The treatment was performed by maintaining a temperature of a 1.5% No. 3-soda silicate aqueous solution to 70° C., and setting a contact time of an aluminum web to 15 seconds, followed by water washing. An adhesion amount of Si on a surface of the aluminum support [1] was 10 mg/m$^2$. The aluminum support [1] of which the surface was increased in hydrophilic property is referred to as an aluminum support [2].

<Provision Image Recording Layer by Coating>

On the aluminum support [1] subjected to the above-described treatment, an image recording layer coating liquid (1) having the composition described below was coated in such a manner as to achieve a dried coating amount of 1.0 to 1.2 g/m$^2$, followed by drying at 100° C. for one minute to form an image recording layer.

<Image Recording Layer Coating Liquid (1)>

| | |
|---|---|
| Addition-polymerizable compound (M-1): | 1.7 g |
| Binder polymer (B-1): | 1.9 g |
| Sensitizing dye (Dye-1): | 0.2 g |
| Photopolymerization Initiator (I-1): | 0.40 g |
| Other additive (C-1): | 0.4 g |
| Fluorine-based nonionic surfactant (Megafack F-177 manufactured by Dainippon Ink and Chemicals Incorporated): | 0.03 g |
| Heat-polymerization Inhibitor (N-nitrosophenylhydroxylamine aluminum salt): | 0.01 g |
| Coloring dye dispersion of the following composition: | 2.0 g |
| Methylethylketone: | 10.0 g |
| Propyleneglycolmonomethylether: | 20.0 g |
| Methanol: | 10.0 g |
| Water (distilled water): | 2.0 g |

-Coloring pigment dispersion composition-

| | |
|---|---|
| Pigment Blue 15:6: | 15 parts by mass |
| Allyl methacrylate/methacrylic acid copolymer (copolymerization molar ratio: 80/20, weight average molecular weight: 40,000): | 10 parts by mass |
| Cyclohexane: | 15 parts by mass |
| Methoxypropylacetate: | 20 parts by mass |
| Propyleneglycolmonomethylether: | 40 parts by mass |

Details of the components used for the image recording layer coating liquid (1) are as follows.

<Addition-Polymerizable Compound>
M-1: pentaerythritoltetraacrylate (NK ester A-TMMT manufactured by Shin-Nakamura Chemical Co., Ltd.)

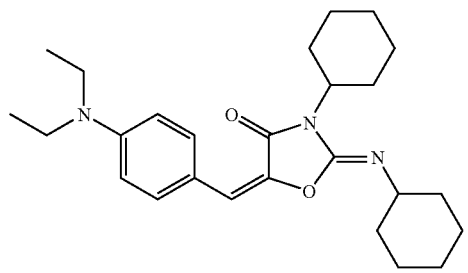

Sensitizer (Dye-1)

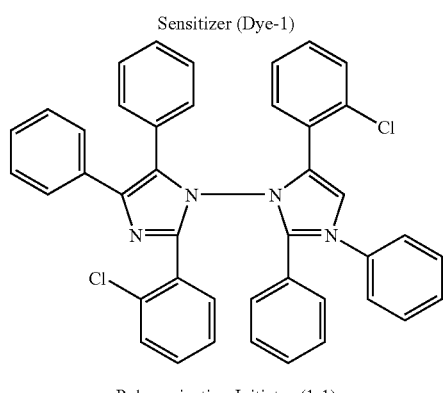

Polymerization Initiator (1-1)

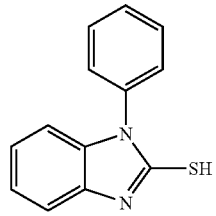

Additive (C-1)

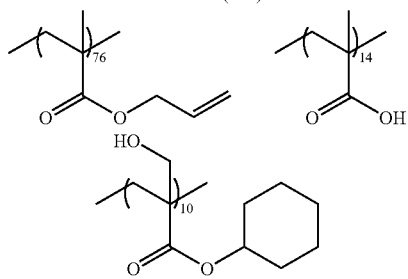

MW = 100,000

Binder Polymer (B-1)

[Provision of Protective Layer by Coating]

After bar-coating a protective layer coating liquid (1) of the following composition on the image recording layer, the protective layer was dried in an oven at 125° C. for 75 seconds to form a protective layer having a dried coating amount of 1.80 g/m$^2$, thereby obtaining planographic printing plate precursors of Examples 1 to 5.

<Protective Coating Layer (1)>

| | |
|---|---|
| Organic ionic polymer [component (a)] (the compound shown in Table 1): | (amount shown in Table 1) |
| Polyvinyl alcohol [component (c-1)] [6 mass % PVA105 aqueous solution (PVA105 is manufactured by Kuraray Co., Ltd. and has a saponification degree of 98.5 mol %, polymerization degree of 500): | (amount shown in Table 1) |
| Polyvinylpyrolidone (K30) [component (c-1)]: | 0.0053 g |
| Surfactant (1 mass % aqueous solution of Emalex710 manufactured by Kao Corporation): | 2.15 g |
| Synthetic mica flake [component (b)] [3.4 mass % water dispersion of MEB3L manufactured by UNICOO (average particle diameter: 1 to 5 μnφ)]: | (3.50 g or 0 g) |
| Distilled water: | 10.60 g |

Details of the organic ionic polymer (a) used for Examples 1 to 6 and Examples 7 to 12 described later in this specification are the same as the exemplified compounds described in the foregoing.

Comparative Examples 1 to 3

A planographic printing plate precursor of Comparative Example 1 was obtained in the same manner as in Example 1 except for not adding the organic ionic polymer (a) in the protective layer coating liquid (1).

Also, a planographic printing plate precursor of Comparative Example 2 was obtained in the same manner as in Example 1 except for adding a comparative polymer A (having the structure described below) which is a water-soluble polymer having an inorganic ionic group in place of the organic ionic polymer (a) and in an amount same as that of the organic ionic polymer (a) in the protective layer coating liquid (1).

Further, a planographic printing plate precursor of Comparative Example 3 was obtained in the same manner as in Example 1 except for not adding the organic ionic polymer (a) and the synthetic mica which is the inorganic layered compound (b) in the protective layer coating liquid (1).

Comparative Polymer A

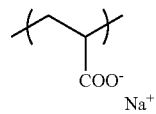

[Exposure of Planographic Printing Plate Precursor and Post-Heating]

The planographic printing plate precursors of Examples 1 to 6 and Comparative Examples 1 to 3 obtained as described above were subjected to dot image exposure by using Violet semiconductor laser setter Vx9600 manufactured by FUJIFILM Electronic Imaging Ltd. (InGaN-based semiconductor laser capable of 405 nm±10 nm emission/30 mW output) and under the conditions of exposure amount of 90 μJ/cm$^2$, a resolution of 2,438 dpi, and dot percents increasing from 1 to 99% by percents. After that, the planographic printing plate precursors were heated in an oven at 100° C. for 10 seconds.

[Development/Plate Making]

After the exposure, a development liquid D-1 described below and a finisher (FP-2W manufactured by Fuji Film Corporation) were charged into an automatic developing machine FLP-813 manufactured by Fuji Film Corporation, and development/print making of the plates after the exposure under the conditions of a development liquid temperature of 30° C. and a development time of 12 seconds to obtain planographic printing plates.

[Developability Evaluation]

By using each of the planographic printing plates, 100 copies were continuously obtained by using Lithrone (manufactured by Komori Corporation) as a printing machine and Graph G(N) (manufactured by Dainippon Ink and Chemicals Incorporated) as an ink, and the 100th copy was visually observed for evaluation. The case wherein no stain was present on a no-image region was judged as good developability, and the case wherein a non-image region is not removed sufficiently and has stains generated thereon was judged as poor developability. The results are shown in Table 1.

<Development Liquid (D-1)>

The development liquid D-1 is a pH10 aqueous solution having the following composition.

| Monoethanolamine: | 0.1 parts by mass |
| Triethanolamine: | 1.5 parts by mass |
| Compound of the following Formula 1: | 4.0 parts by mass |
| Compound of the following Formula 2: | 2.5 parts by mass |
| Compound of the following Formula 3: | 0.2 parts by mass |
| Water: | 91.7 parts by mass |

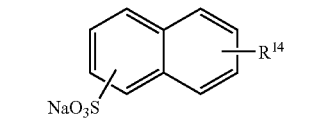
(Formula 1)

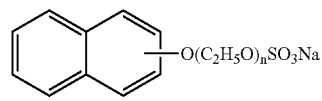
(Formula 2)

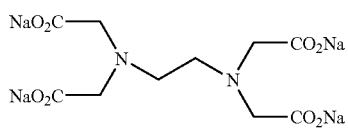
(Formula 3)

In (Formula 1), $R^{14}$ is a hydrogen atom or a butyl group, and the hydrogen atom and the butyl group are mixed.

Also, in (Formula 2), n is 2 to 20.

[Test for Plate Life of Image Region]

Copying was continuously obtained by using Lithrone (manufactured by Komori Corporation) as a printing machine and Graph G(N) (manufactured by Dainippon Ink and Chemicals Incorporated) as an ink in the same manner as in the developability evaluation, and a copy of a solid image region was observed. The number of good copies was confirmed by examining on which copy the image started to fade and used as the image region plate life. Relative evaluation was employed by setting the number of good copies of Comparative Example 1 as 100. The larger the number is, the better the plate life is. The results are shown in Table 1.

TABLE 1

| | | Organic ionic polymer (a) | Polyvinyl alcohol (b) | Evaluation results | |
| | | Compound | Additive amount (g) | Additive amount (g) | Plate life | Developability |
|---|---|---|---|---|---|---|
| Example 1 | | 3-1 | 4.31 | 0 | 100 | Good |
| Example 2 | | 4-1 | 4.31 | 0 | 100 | Good |
| Example 3 | | 11-1 | 4.31 | 0 | 100 | Good |
| Example 4 | | 16-1 | 4.31 | 0 | 100 | Good |
| Example 5 | | 16-1 | 3.31 | 1.0 | 105 | Good |
| Example 6 | | 16-1 | 1.31 | 3.0 | 105 | Good |
| Comparative Example 1 | | none | none | 4.31 | 100 | Poor |
| Comparative Example 2 | | (comparative polymer A) | 4.31 | 4.31 | 85 | Good |
| Comparative Example 3 | | none | none | 4.31 | 80 | Good |

As is apparent from Table 1, the planographic printing plate precursors having the specific protective layer of the present invention attain the sufficient curability and are excellent in plate life of the obtained image region and good in developability. In turn, Comparative Example 1 in which the protective layer does not contain the organic ionic polymer (a) fails to attain sufficient developability, and Comparative Example 2 wherein the protective layer does not contain the organic ionic group but contains the comparative polymer A and Comparative Example 3 wherein the protective layer does not contain the component (a) and the mica compound (b) have a low curability due to a reduction in oxygen shielding property in the protective layers and inferior in plate life as compared to Examples though they achieves good developability.

Examples 7 to 12

After bar coating an image recording coating liquid (2) of the following composition on the support (aluminum support [2]) shown in Table 1, the support was dried in an oven at 100° C. for 60 seconds to obtain an image recording layer having a dried coating amount of 1.3 g/m².

<Image Recording Layer Coating Liquid (2)>

| Binder polymer [component (A), compound shown in Table]: | 0.162 g |
| Polymerization initiator 1 [component (C), compound shown in Table]: | 0.160 g |
| Polymerization initiator 2 [component (C), compound shown in Table]: | 0.180 g |
| Infrared ray absorbing agent [component (D), compound shown in Table]: | 0.038 g |

-continued

| | |
|---|---|
| Polymerizable compound [component (B), compound shown in Table]: | 0.385 g |
| Fluorine-based surfactant (1): | 0.044 g |
| Methylethylketone: | 4.091 g |
| 2-methoxy-1-propanol: | 8.609 g |

Structures of the binder polymer (A), the polymerization initiator (C), the polymerizable compound (B), and the sensitizing dye (D) used for the image recording layer coating liquid (2) are shown below.

[Polymerizable Compound (B)]
M-2: ethoxylated bisphenol A diacrylate
(SR-601 manufactured by Nippon Kayaku Co., Ltd.)
M-3: pentaerythritoltriacrylate hexamethylenediisocyanate urethane pre-polymer
(UA-306H manufactured by Kyoeisha Chemical Co., Ltd.)

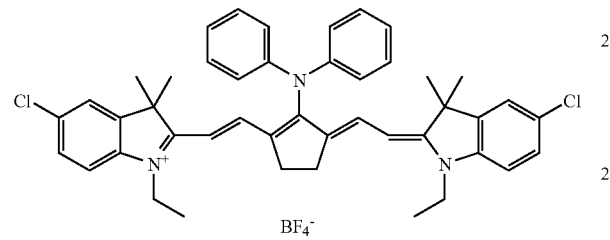

Sensitizing dye (IR-1)

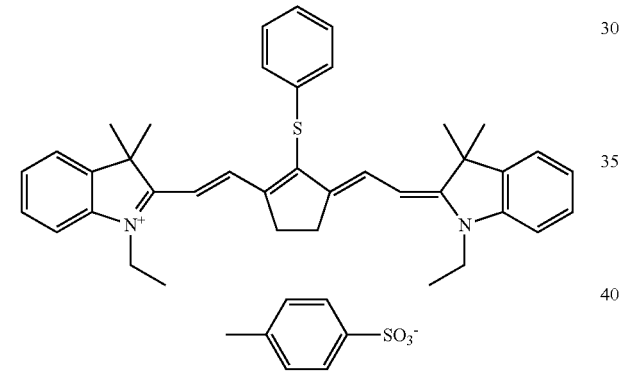

Sensitizing dye (IR-2)

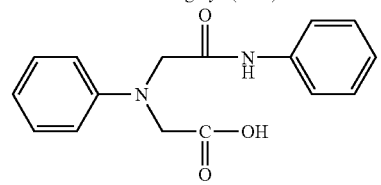

Additive (C-2)

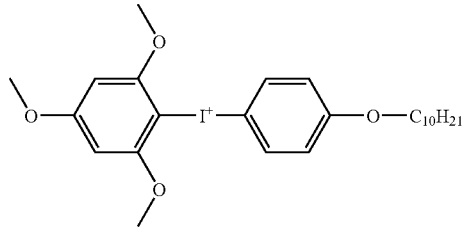

Polymerization initiator (I-2)

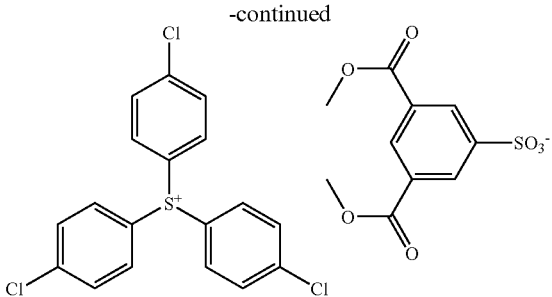

Polymerization initiator (I-3)

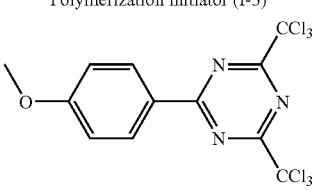

Polymerization initiator (I-4)

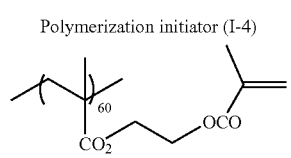

Binder polymer (B-2)

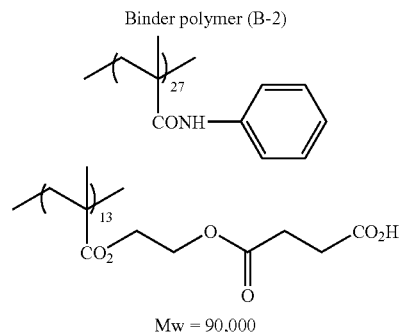

Mw = 90,000

Binder Polymer (B-3)
Polyurethane compound obtained by condensation polymerization of the following monomers at the following ratio. (Mw=100,000)

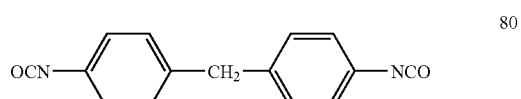

80

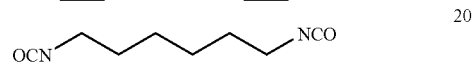

20

26

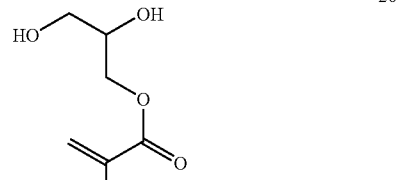

52

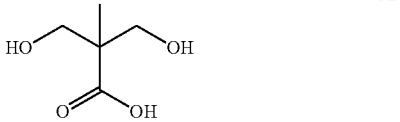

-continued

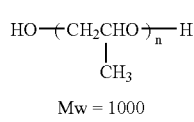

Mw = 1000

Fluorine-based Surfactant (1)

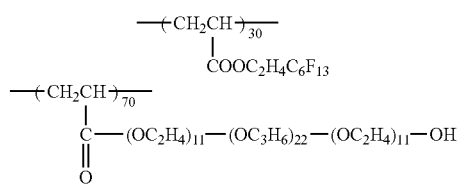

After bar coating a protective layer coating liquid (2) of the following composition on the image recording layer, the layer was dried in an oven at 125° C. for 75 seconds to obtain a protective layer having a dried coating amount of 2.00 g/m²., thereby obtaining planographic printing plate precursors of Examples 6 to 12.

<Protective Layer Coating Liquid (2)>

| | |
|---|---|
| Organic ionic polymer [component (a)]: | 1.0 g |
| Polyvinyl alcohol | 1.25 g |
| [6 mass % PVA105 aqueous solution (PVA105 is manufactured by Kuraray Co., Ltd. and has a saponification degree of 98.5 mol %, polymerization degree of 500) [component (c-1)]: | |
| Polyvinylpyrolidone (K30) [component (c-1)]: | 0.0053 g |
| Surfactant (1mass % aqueous solution of Emalex710 manufactured by Kao Corporation): | 2.15 g |
| Synthetic mica flake [component (b)] | (3.55 g or 0 g) |
| [3.4 mass % water dispersion of MEB3L manufactured by UNICOO (average particle diameter: 1 to 5 μmϕ)]: | |
| Distilled water: | 10.60 g |

Comparative Examples 4 to 6

A planographic printing plate precursor of Comparative Example 4 was obtained in the same manner as in Example 7 except for not adding the organic ionic polymer (a) in the protective layer coating liquid (2).

Also, a planographic printing plate precursor of Comparative Example 5 was obtained in the same manner as in Example 7 except for adding a comparative polymer A (having the structure described above) which is a water-soluble polymer having an inorganic ionic group in place of the organic ionic polymer (a) and in an amount same as that of the organic ionic polymer (a) in the protective layer coating liquid (2).

Further, a planographic printing plate precursor of Comparative Example 6 was obtained in the same manner as in Example 7 except for not adding the organic ionic polymer (a) and the synthetic mica flake which is the inorganic layered compound (b) in the protective layer coating liquid (2).

[Exposure of Planographic Printing Plate Precursor]

The planographic printing plate precursors of Examples 7 to 12 and Comparative Examples 4 to 6 obtained as described above are subjected to exposure by using Trendsetter 3244 VFS manufactured by Creo Co., Ltd. on which a water cooling type 40W-infrared ray semiconductor laser (830 nm) is mounted and under the conditions of an output of 9 W, an outer drum rotation number of 210 rpm, a plate surface energy of 100 mJ/cm², and a resolution of 2400 dpi.

[Development/Plate Making]

After the exposure, a development liquid DV-2 manufactured by Fuji Film Corporation and a 1:1 water-diluted development liquid of FN-6 manufactured by Fuji Film Corporation were charged into an automatic developing machine Stablon 900N manufactured by FUJIFILM Graphic Systems Co., Ltd., and development/print making was conducted under the conditions of a development liquid temperature of 30° C. and a development time of 12 seconds to obtain planographic printing plates.

[Test for Plate Life of Image Region]

Lithrone (manufactured by Komori Corporation) was used as a printing machine and Graph G(N) (manufactured by Dainippon Ink and Chemicals Incorporated) was used as an ink. Copies of a solid image region were observed. The number of good copies was confirmed by examining on which copy the image started to fade and used as the image region plate life. Relative evaluation was employed by setting the number of good copies of Comparative Example 3 as 100. The larger the number is, the better the plate life is. The results are shown in Table 2.

[Developability Test]

Developability of a non-image region after the exposure and development was evaluated in terms of residual color.

After a predetermined time had passed and after the exposure and development, a concentration of a non-exposed portion was measured based on a cyan concentration and by using a spectrodensitometer manufactured by X-Rite to measure a ratio of a residual color of the non-image region, and a cyan concentration of the non-image region of the plate was measured after dipping (development). The plate having a residual color ratio less than 7% was evaluated as having no residual color and good developability, and the plate having a residual color ratio 7% or more was evaluated as having a remarkable residual color and poor developability. The results are shown in Table 2.

Residual color ratio (%)=[(cyan concentration of non-exposed portion after development−cyan concentration of aluminum substrate not coated)/(cyan concentration of aluminum substrate not coated)]

TABLE 2

| | Compound used in protective layer Organic ionic polymer (a) | Compound used in image recording layer | | | | Evaluation result | |
|---|---|---|---|---|---|---|---|
| | | Polymerizable compound (C) | Binder (A) | Sensitizing dye (D) | Polymerization Initiator (B) | Residual color | Print life |
| Example 7 | 2-3 | M-2 | B-3 | IR-1 | I-3 | good | 105 |
| Example 8 | 3-1 | M-3 | B-2 | IR-2 | I-2 | good | 100 |
| Example 9 | 4-1 | M-2 | B-3 | IR-1 | I-4 | good | 105 |
| Example 10 | 6-1 | M-3 | B-2 | IR-1 | I-2 | good | 100 |

TABLE 2-continued

|  | Compound used in protective layer Organic ionic polymer (a) | Compound used in image recording layer | | | | Evaluation result | |
|---|---|---|---|---|---|---|---|
|  |  | Polymerizable compound (C) | Binder (A) | Sensitizing dye (D) | Polymerization Initiator (B) | Residual color | Print life |
| Example 11 | 11-1 | M-2 | B-3 | IR-2 | I-2 | good | 105 |
| Example 12 | 16-1 | M-2 | B-3 | IR-1 | I-2 | good | 105 |
| Comparative Example 4 | None | M-2 | B-3 | IR-1 | I-3 | poor | 100 |
| Comparative Example 5 | Comparative polymer (A) | M-2 | B-3 | IR-1 | I-3 | good | 85 |
| Comparative Example 6 | none | M-2 | B-3 | IR-1 | I-3 | good | 80 |

As is apparent from Table 2, the planographic printing plate precursors having the specific protective layer of the present invention attain the sufficient curability and are excellent in plate life of the obtained image region and good in developability. In turn, Comparative Example 4 in which the protective layer does not contain the organic ionic polymer (a) fails to attain sufficient developability, and Comparative Example 5 wherein the protective layer contains known inorganic ionic polymer and Comparative Example 6 wherein the protective layer does not contain the organic ionic polymer (a) and the inorganic layerd compound (b) have a low curability due to a reduction in oxygen shielding property in the protective layers and inferior in plate life as compared to Examples though they achieves good developability.

From the above evaluations, it is apparent that the planographic printing plate precursors having the specific protective layer of the present invention achieve excellent effects when the composition of the negative image recording layer is changed.

According to the present invention, it is possible to provide an image recording material excellent in developability of a non-image region and capable of forming an image which is good in curability by exposure.

The present invention is possible to provide the following items of <1> to <9>:

<1> An image recording material comprising in the following order on a support: an image recording layer containing: a binder polymer (A), a compound (B) having a polymerizable unsaturated group, and a polymerization initiator (C); and a layer containing: an organic ionic polymer (a) formed of a non-metallic element, and an inorganic layered compound (b).

<2> The image recording material according to item <1>, wherein the image recording layer further contains a dye (D) having an absorption maximum in a wavelength region from 300 to 1,200 nm;

<3> The image recording material according to item <1> or <2>, wherein the binder polymer (A) is a polymer having an alkali-soluble group;

<4> The image recording material according to any one of items <1> to <3>, wherein the layer containing the organic ionic polymer (a) formed of a non-metallic element and the inorganic layered compound (b) further contains a nonionic hydrophilic polymer (c-1);

<5> The image recording material according to any one of items <1> to <3>, wherein the layer containing the organic ionic polymer (a) formed of a non-metallic element and the inorganic layered compound (b) further contains a modified polyvinyl alcohol derivative (c-2);

<6> The image recording material according to any one of items <1> to <5>, wherein the organic ionic polymer (a) formed of a non-metallic element is a polymer having a cation structure and an anion structure in the same molecule and containing an intramolecular salt structure formed of the cation structure and the anion structure;

<7> The image recording material according to any one of items <1> to <5>, wherein the organic ionic polymer (a) formed of a non-metallic element is an anionic polymer containing an anionic group;

<8> The image recording material according to any one of items <1> to <5>, wherein the organic ionic polymer (a) formed of a non-metallic element is a cationic polymer containing a cationic group; and <9> The image recording material according to any one of items <1> to <8>, wherein the polymerization initiator (C) is an onium salt.

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. An image recording material comprising in the following order on a support:
    an image recording layer containing:
        a binder polymer (A),
        a compound (B) having a polymerizable unsaturated group, and
        a polymerization initiator (C); and
    a layer containing:
        an organic ionic polymer (a) formed of a non-metallic element, and
        an inorganic layered compound (b).

2. The image recording material according to claim 1, wherein the image recording layer further contains a dye (D) having an absorption maximum in a wavelength region from 300 to 1,200 nm.

3. The image recording material according to claim 1, wherein the binder polymer (A) is a polymer having an alkali-soluble group.

4. The image recording material according to claim 2 wherein the binder polymer (A) is a polymer having an alkali-soluble group.

5. The image recording material according to claim 1, wherein the layer containing the organic ionic polymer (a) formed of a non-metallic element and the inorganic layered compound (b) further contains a nonionic hydrophilic polymer (c-1).

6. The image recording material according to claim 2 wherein the layer containing the organic ionic polymer (a) formed of a non-metallic element and the inorganic layered compound (b) further contains a nonionic hydrophilic polymer (c-1).

7. The image recording material according to claim 3 wherein the layer containing the organic ionic polymer (a) formed of a non-metallic element and the inorganic layered compound (b) further contains a nonionic hydrophilic polymer (c-1).

8. The image recording material according to claim 4, wherein the layer containing the organic ionic polymer (a) formed of a non-metallic element and the inorganic layered compound (b) further contains a nonionic hydrophilic polymer (c-1).

9. The image recording material according to claim 1, wherein the layer containing the organic ionic polymer (a) formed of a non-metallic element and the inorganic layered compound (b) further contains a modified polyvinyl alcohol derivative (c-2).

10. The image recording material according to claim 2, wherein the layer containing the organic ionic polymer (a) formed of a non-metallic element and the inorganic layered compound (b) further contains a modified polyvinyl alcohol derivative (c-2).

11. The image recording material according to claim 3, wherein the layer containing the organic ionic polymer (a) formed of a non-metallic element and the inorganic layered compound (b) further contains a modified polyvinyl alcohol derivative (c-2).

12. The image recording material according to claim 4, wherein the layer containing the organic ionic polymer (a) formed of a non-metallic element and the inorganic layered compound (b) further contains a modified polyvinyl alcohol derivative (c-2).

13. The image recording material according to claim 1, wherein the organic ionic polymer (a) formed of a non-metallic element is a polymer having a cation structure and an anion structure in the same molecule and containing an intramolecular salt structure formed of the cation structure and the anion structure.

14. The image recording material according to claim 2, wherein the organic ionic polymer (a) formed of a non-metallic element is a polymer having a cation structure and an anion structure in the same molecule and containing an intramolecular salt structure formed of the cation structure and the anion structure.

15. The image recording material according to claim 3, wherein the organic ionic polymer (a) formed of a non-metallic element is a polymer having a cation structure and an anion structure in the same molecule and containing an intramolecular salt structure formed of the cation structure and the anion structure.

16. The image recording material according to claim 5, wherein the organic ionic polymer (a) formed of a non-metallic element is a polymer having a cation structure and an anion structure in the same molecule and containing an intramolecular salt structure formed of the cation structure and the anion structure.

17. The image recording material according to claim 9, wherein the organic ionic polymer (a) formed of a non-metallic element is a polymer having a cation structure and an anion structure in the same molecule and containing an intramolecular salt structure formed of the cation structure and the anion structure.

18. The image recording material according to claim 1, wherein the polymerization initiator (C) is an onium salt.

19. The image recording material according to claim 2, wherein the polymerization initiator (C) is an onium salt.

20. The image recording material according to claim 3, wherein the polymerization initiator (C) is an onium salt.

21. The image recording material according to claim 5, wherein the polymerization initiator (C) is an onium salt.

22. The image recording material according to claim 9, wherein the polymerization initiator (C) is an onium salt.

23. The image recording material according to claim 13, wherein the polymerization initiator (C) is an onium salt.

\* \* \* \* \*